(12) United States Patent
Kimura

(10) Patent No.: US 8,058,675 B2
(45) Date of Patent: Nov. 15, 2011

(54) SEMICONDUCTOR DEVICE AND ELECTRONIC DEVICE USING THE SAME

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 955 days.

(21) Appl. No.: 12/000,606

(22) Filed: Dec. 14, 2007

(65) Prior Publication Data

US 2008/0246064 A1 Oct. 9, 2008

(30) Foreign Application Priority Data

Dec. 27, 2006 (JP) .................................. 2006-352817

(51) Int. Cl.
*H01L 31/06* (2006.01)
(52) U.S. Cl. ... 257/290; 257/431; 257/458; 257/E27.13; 257/E31.113
(58) Field of Classification Search .................. 257/290, 257/292, 431, 444, 451, 458, E27.13; 250/214.1
See application file for complete search history.

(56) References Cited

U.S. PATENT DOCUMENTS

| | | | | |
|---|---|---|---|---|
| 3,770,967 A * | 11/1973 | Hanna et al. | ........... | 250/214 R |
| 3,770,968 A * | 11/1973 | Hession et al. | ........... | 250/214 R |
| 3,823,410 A * | 7/1974 | Tokutomi et al. | ........... | 396/157 |
| 3,992,714 A * | 11/1976 | Miyakawa | ........... | 396/231 |
| 4,065,668 A * | 12/1977 | Monticelli | ........... | 250/214 P |
| 4,118,621 A * | 10/1978 | Monticelli et al. | ........... | 250/214 A |
| 4,251,742 A * | 2/1981 | Beelitz | ........... | 326/91 |
| 4,269,490 A * | 5/1981 | Takami | ........... | 396/228 |
| 4,447,746 A * | 5/1984 | Fang et al. | ........... | 327/514 |
| 4,454,416 A * | 6/1984 | Gontowski et al. | ........... | 250/214 A |
| 5,479,208 A * | 12/1995 | Okumura | ........... | 348/301 |
| 5,481,118 A * | 1/1996 | Tew | ........... | 250/551 |
| 5,760,760 A | 6/1998 | Helms | | |
| 5,936,231 A * | 8/1999 | Michiyama et al. | ........... | 250/214 A |

(Continued)

FOREIGN PATENT DOCUMENTS

CN 1877269 12/2006

(Continued)

OTHER PUBLICATIONS

Chinese Office Action (Application No. 200710160845.7) Dated Jul. 1, 2010.

*Primary Examiner* — Steven Loke
*Assistant Examiner* — Earl Taylor
(74) *Attorney, Agent, or Firm* — Eric J. Robinson; Robinson Intellectual Property Law Office, P.C.

(57) ABSTRACT

To provide a semiconductor device which can detect low illuminance. A photoelectric conversion element, a diode-connected first transistor, and a second transistor are included. A gate of the first transistor is electrically connected to a gate of the second transistor. One of a source and a drain of the first transistor is electrically connected to one of a source and a drain of the second transistor through the photoelectric conversion element. The other of the source and the drain of the first transistor is electrically connected to the other of the source and the drain of the second transistor. By using transistors which have different threshold voltages for the first transistor and the second transistor, a semiconductor device which can perform detecting of low illuminance can be obtained.

33 Claims, 33 Drawing Sheets

U.S. PATENT DOCUMENTS

| | | | |
|---|---|---|---|
| 5,952,992 A | 9/1999 | Helms | |
| 5,955,726 A * | 9/1999 | Takashima et al. | 250/214 R |
| 5,981,936 A | 11/1999 | Fujiie | |
| 6,287,888 B1 | 9/2001 | Sakakura et al. | |
| 6,531,711 B2 | 3/2003 | Sakakura et al. | |
| 6,674,470 B1 * | 1/2004 | Tanaka et al. | 348/302 |
| 6,734,907 B1 * | 5/2004 | Hagihara et al. | 348/308 |
| 6,982,406 B2 * | 1/2006 | Chen | 250/214.1 |
| 7,002,881 B2 | 2/2006 | Okuda et al. | |
| 7,030,551 B2 * | 4/2006 | Yamazaki et al. | 313/498 |
| 7,042,980 B2 | 5/2006 | Endo | |
| 7,253,391 B2 * | 8/2007 | Koyama et al. | 250/214 C |
| 7,259,790 B2 | 8/2007 | Mabuchi et al. | |
| 7,335,951 B2 * | 2/2008 | Nishi et al. | 257/350 |
| 7,495,272 B2 * | 2/2009 | Maruyama et al. | 257/291 |
| 7,518,168 B2 | 4/2009 | Mabuchi et al. | |
| 7,542,086 B2 * | 6/2009 | Hagihara | 348/302 |
| 7,705,283 B2 * | 4/2010 | Arao et al. | 250/214 R |
| 7,772,667 B2 * | 8/2010 | Sugawara et al. | 257/458 |
| 2001/0052940 A1 * | 12/2001 | Hagihara et al. | 348/302 |
| 2002/0044208 A1 * | 4/2002 | Yamazaki et al. | 348/272 |
| 2004/0042707 A1 | 3/2004 | Imai et al. | |
| 2005/0082463 A1 * | 4/2005 | Koyama et al. | 250/214 R |
| 2005/0116310 A1 * | 6/2005 | Nishi et al. | 257/440 |
| 2005/0167573 A1 * | 8/2005 | Maruyama et al. | 250/214.1 |
| 2006/0163577 A1 * | 7/2006 | Yamazaki et al. | 257/59 |
| 2006/0186497 A1 * | 8/2006 | Nishi et al. | 257/428 |
| 2006/0261253 A1 * | 11/2006 | Arao et al. | 250/214.1 |
| 2007/0045672 A1 * | 3/2007 | Nishi et al. | 257/257 |
| 2008/0060422 A1 * | 3/2008 | Hosoya | 73/53.01 |
| 2008/0078923 A1 * | 4/2008 | Hirose | 250/214.1 |
| 2008/0246064 A1 * | 10/2008 | Kimura | 257/292 |
| 2010/0187405 A1 * | 7/2010 | Arao et al. | 250/208.2 |

FOREIGN PATENT DOCUMENTS

| | | |
|---|---|---|
| EP | 0 445 757 | 9/1991 |
| EP | 1223623 A | 7/2002 |
| EP | 1727120 A | 11/2006 |
| JP | 2002-217397 A | 8/2002 |
| JP | 3444093 | 9/2003 |
| WO | WO 2005/114749 | 12/2005 |
| WO | WO 2007/125977 | 11/2007 |

* cited by examiner

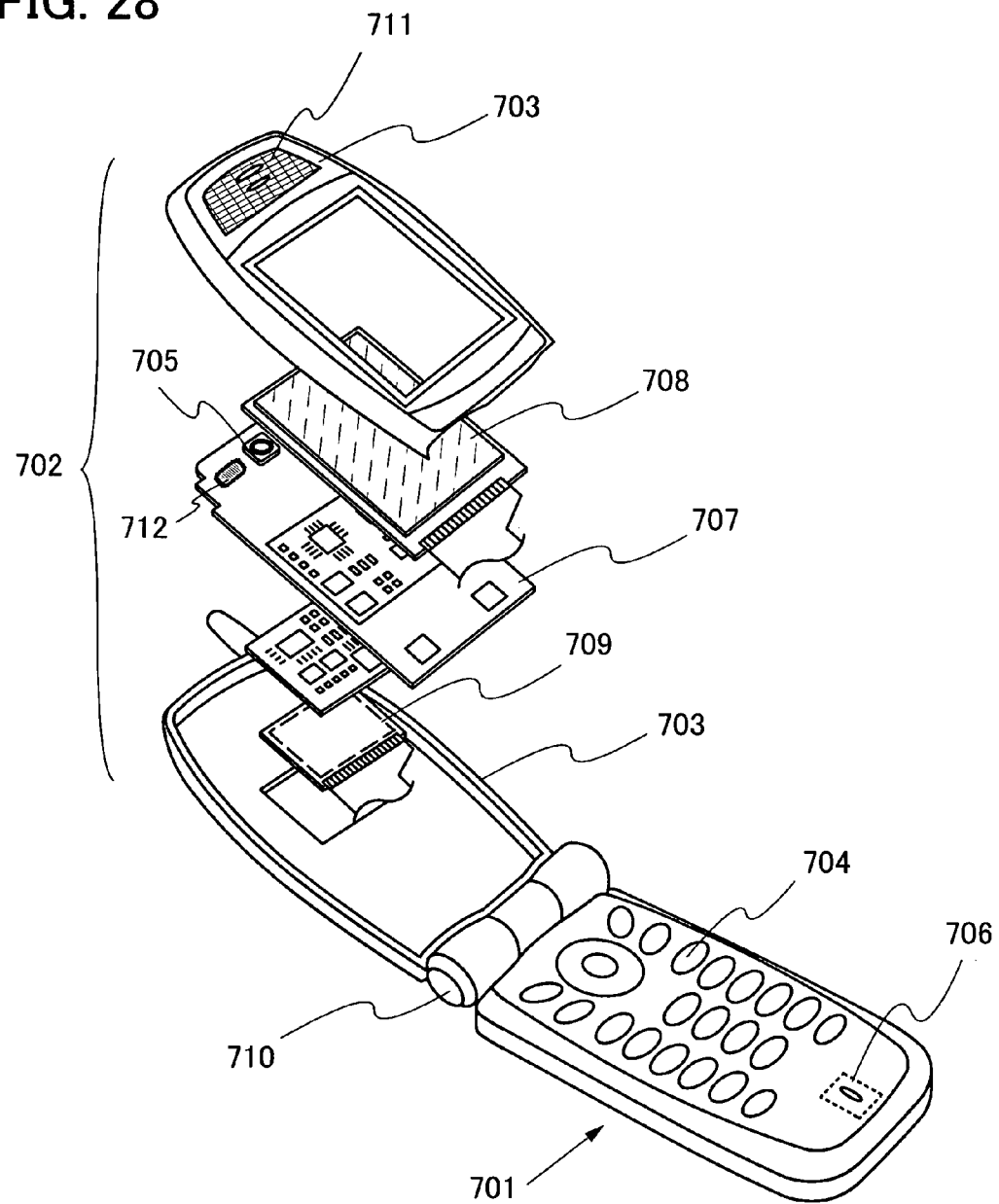

SEMICONDUCTOR DEVICE AND ELECTRONIC DEVICE USING THE SAME

BACKGROUND OF THE INVENTION

1. Field of the Invention

The present invention relates to a semiconductor device. In particular, the present invention relates to a semiconductor device having a photoelectric conversion device and a transistor. Further, the present invention relates to an electronic device using such a semiconductor device.

2. Description of the Related Art

A large number of photoelectric conversion devices generally used for detecting an electromagnetic wave are known, and for example, a photoelectric conversion device having sensitivity to ultra-violet rays to infrared rays is collectively referred to as an optical sensor. An optical sensor having sensitivity to a visible light region with a wavelength of 400 to 700 nm is particularly referred to as a visible light sensor. A large number of visible light sensors are used for devices which need illuminance adjustment, on/off control, or the like depending on human living environment.

In particular, in a display device, ambient brightness of the display device is detected to adjust display luminance. This is because unnecessary power consumption can be reduced by detecting ambient brightness and obtaining appropriate display luminance. For example, such an optical sensor for adjusting luminance is used for a mobile phone or a personal computer.

In addition, not only ambient brightness but also luminance of a display device, in particular, luminance of a backlight of a liquid crystal display device is detected by an optical sensor to adjust luminance of a display screen.

In such an optical sensor, a photodiode is used for a detecting portion and output current of the photodiode is amplified in an amplifier circuit. A current mirror circuit is used for such an amplifier circuit, for example. (e.g., see Reference 1: Japanese Patent No. 3444093).

SUMMARY OF THE INVENTION

A conventional optical sensor has a problem in that illuminance which is quite low is difficult to be detected due to limitation of characteristics of a transistor even when low illuminance is to be detected. FIG. 33A shows a circuit diagram of a photodiode and a transistor which is connected to the photodiode in series. Note that a transistor 3302 shown in FIG. 33A is a diode-connected transistor and a gate (or a gate electrode) and a drain (or a drain electrode) of the transistor 3302 is connected to a photodiode 3301. When the photodiode 3301 is irradiated with light, light charges are generated. In addition, when voltage is supplied to the photodiode 3301 and the transistor 3302 which is connected to the photodiode 3301 in series, current flows in accordance with light intensity. Voltage in accordance with the current flowing to the transistor 3302 is generated in gate-source voltage (Vgs) of the transistor 3302. At this time, when current (Ids) of the photodiode 3301 is smaller than current of the transistor 3302 at the time when Vgs=0 V, illuminance cannot be detected normally. That is, when light emitted to the photodiode 3301 is weak and the current (Ids) of the photodiode 3301 is small, illuminance cannot be detected normally.

FIG. 33B shows a graph of current characteristics of the transistor. When current characteristics of the transistor 3302 connected to the photodiode 3301 in series are represented by a curve 3303, illuminance cannot be detected normally when the current Ids flowing to the photodiode 3301 is smaller than current $I_1$ of the transistor 3302 at the time when Vgs=0 V. This is because Vgs of the transistor 3302 cannot be made lower than 0 V. Therefore, even when the photodiode 3301 is irradiated with light having such intensity that the current flowing to the photodiode 3301 is smaller than the current $I_1$ 0 V, illuminance cannot be detected normally. Meanwhile, when current characteristics of the transistor 3302 connected to the photodiode 3301 in series are represented by a curve 3304, light at lower illuminance than that of the case of the transistor having the current characteristics represented by the curve 3303 can be detected because current $I_2$ of the transistor 3302 at the time when Vgs=0 V is smaller than the current $I_1$.

Note that FIG. 33B shows the case where the source-drain voltage (Vds) of the transistor 3302 is predetermined voltage. In the circuit in FIG. 33A, the drain (or the drain electrode) of the transistor 3302 is connected to the gate (or the gate electrode) of the transistor 3302. Therefore, more accurately, FIG. 33B should show the case where Vds changes as well as Vgs; however, FIG. 33B shows the case where Vds is constant for simplification. This is because current is completely 0 when Vds is 0 V, so that it is difficult to describe current at the time when Vds is 0 V using a logarithmic graph.

Meanwhile, the need for operating an electronic device at low voltage has been increased, and it has been important to operate an optical sensor at low voltage. Operation at low voltage can reduce power consumption. In addition, an electrical connection between an optical sensor and an IC can be easily performed. This is because driving voltage of an IC has been decreased, so that it is not necessary to change the level of voltage when an optical sensor operates at low voltage. Therefore, the size of a device can be made smaller.

In order to operate an optical sensor at low voltage, it is necessary that the threshold voltage of a transistor included in an amplifier circuit be set small. However, the low threshold voltage corresponds to large current at the time when Vgs is 0 V in FIG. 33B.

Therefore, it is difficult to operate an optical sensor at low voltage and detect even low illuminance.

In view of the foregoing problems, it is an object of the present invention to provide a semiconductor device which can detect low illuminance. In addition, it is another object of the present invention to provide a semiconductor device which operates at low voltage, a semiconductor device with low power consumption, a semiconductor device which can be easily connected to another semiconductor device, or a semiconductor device which is made smaller.

One aspect of the present invention is a semiconductor device which includes a photoelectric conversion element, a diode-connected first transistor, and a second transistor. A gate of the first transistor is electrically connected to a gate of the second transistor. One of a source and a drain of the first transistor is electrically connected to one of a source and a drain of the second transistor through the photoelectric conversion element. The other of the source and the drain of the first transistor is electrically connected to the other of the source and the drain of the second transistor. The first transistor and the second transistor have different threshold voltages.

In the above-described structure, the first transistor is preferably an enhancement transistor. In addition, the second transistor is preferably a depletion transistor. Further, difference between the threshold voltage of the first transistor and the threshold voltage of the second transistor is preferably 1V or higher, more preferably, 3V or higher. Furthermore, the first transistor and the second transistor preferably have the same conductivity type.

In addition to the above-described structure, one or more of transistors may be electrically connected to the second transistor in parallel.

In the above-described aspect of the present invention, the photoelectric conversion element is a photodiode, for example. In addition, the photoelectric conversion element includes a p-type semiconductor layer, an n-type semiconductor layer, and an i-type semiconductor layer provided between the p-type semiconductor layer and the n-type semiconductor layer.

Various types of switches can be used as a switch shown in this document. An electrical switch, a mechanical switch, and the like are given as examples. That is, any element can be used as long as it can control a current flow, without limiting to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used as a switch. Alternatively, a logic circuit combining such elements can be used as a switch.

In the case of using a transistor as a switch, polarity (a conductivity type) of the transistor is not particularly limited because it operates just as a switch. However, a transistor of polarity with smaller off-current is preferably used when off-current is to be suppressed. A transistor provided with an LDD region, a transistor with a multi-gate structure, and the like are given as examples of a transistor with smaller off-current. In addition, it is preferable that an N-channel transistor be used when a potential of a source terminal of the transistor which is operated as a switch is closer to a potential of a low-potential-side power supply (e.g., Vss, GND, or 0V), while a P-channel transistor be used when the potential of the source terminal is closer to a potential of a high-potential-side power supply (e.g., Vdd). This is because the absolute value of gate-source voltage can be increased when the potential of the source terminal is closer to a potential of a low-potential-side power supply in an N-channel transistor and when the potential of the source terminal is closer to a potential of a high-potential-side power supply in a P-channel transistor, so that it is useful for operating the transistor as a switch. This is also because the transistor does not often perform a source follower operation, so that reduction in output voltage does not often occur.

A CMOS switch using both N-channel and P-channel transistors may be used. By using a CMOS switch, the switch can easily operate as a switch because current can flow when the P-channel transistor or the N-channel transistor is turned on. For example, voltage can be appropriately output regardless of whether voltage of an input signal of the switch is high or low. In addition, since a voltage amplitude value of a signal for turning on or off the switch can be made small, power consumption can be reduced.

When a transistor is used as a switch, the switch includes an input terminal (one of a source terminal and a drain terminal), an output terminal (the other of the source terminal and the drain terminal), and a terminal for controlling electrical conduction (a gate terminal). On the other hand, when a diode is used as a switch, the switch does not have a terminal for controlling electrical conduction in some cases. Therefore, when a diode is used as a switch, the number of wirings for controlling terminals can be more reduced than the case of using a transistor as a switch.

In this document, when it is explicitly described that "A and B are connected", the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Accordingly, in structures disclosed in this document, another element may be interposed between elements having a connection relation shown in drawings and texts, without limiting to a predetermined connection relation, for example, the connection relation shown in the drawings and the texts.

For example, in the case where A and B are electrically connected, one or more elements which enable electrical connection of A and B (e.g., a switch, a transistor, a capacitor, an inductor, a resistor, and/or a diode) may be provided between A and B. In addition, in the case where A and B are functionally connected, one or more circuits which enable functional connection of A and B (e.g., a logic circuit such as an inverter, a NAND circuit, or a NOR circuit, a signal converter circuit such as a DA converter circuit, an AD converter circuit, or a gamma correction circuit, a potential level converter circuit such as a power supply circuit (e.g., a boosting circuit or a voltage lower control circuit) or a level shifter circuit for changing a potential level of a signal, a voltage source, a current source, a switching circuit, or an amplifier circuit such as a circuit which can increase signal amplitude, the current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be directly connected without interposing another element or another circuit therebetween.

When it is explicitly described that "A and B are directly connected", the case where A and B are directly connected (i.e., the case where A and B are connected without interposing another element or another circuit therebetween) and the case where A and B are electrically connected (i.e., the case where A and B are connected by interposing another element or another circuit therebetween) are included therein.

When it is explicitly described that "A and B are electrically connected", the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included therein. That is, when it is explicitly described that "A and B are electrically connected", the description is the same as the case where it is explicitly only described that "A and B are connected".

A display element, a display device which is a device having a display element, a light-emitting element, and a light-emitting device which is a device having a light-emitting element can use various types and can include various elements. For example, as a display element, a display device, a light-emitting element, and a light-emitting device, whose a display medium, contrast, luminance, reflectivity, transmittivity, or the like changes by an electromagnetic action, such as an EL element (e.g., an EL element including organic and inorganic materials, an organic EL element, or an inorganic EL element), an electron emitter, a liquid crystal element, electronic ink, an electrophoresis element, a grating light valve (GLV), a plasma display panel (PDP), a digital micromirror device (DMD), a piezoelectric ceramic display, or a carbon nanotube can be used. Note that display devices using an EL element include an EL display; display devices using an electron emitter include a field emission display (FED), an SED-type flat panel display (SED: Surface-conduction Electron-emitter Display), and the like; display devices using a liquid crystal element include a liquid crystal display (e.g., a transmissive liquid crystal display, a semi-transmissive liquid crystal display, a reflective liquid crystal display, a direct-view liquid crystal display, or a projection liquid crystal display); and display devices using electronic ink or an electrophoresis element include electronic paper.

Note that in this document, various types of transistors can be employed as a transistor without limiting to a certain type. For example, a thin film transistor (a TFT) including a non-single crystalline semiconductor film typified by amorphous silicon, polycrystalline silicon, microcrystalline (also referred to as semi-amorphous) silicon, or the like can be employed. In the case of using the TFT, there are various advantages. For example, since the TFT can be formed at temperature lower than that of the case of using single crystalline silicon, manufacturing cost can be reduced and a manufacturing apparatus can be made larger. When the manufacturing apparatus is made larger, the TFT can be formed using a large substrate. Therefore, many display devices can be formed at the same time at low cost. In addition, a substrate having low heat resistance can be used because of low manufacturing temperature. Therefore, the transistor can be formed over a light-transmitting substrate. Accordingly, transmission of light in a display element can be controlled by using the transistor formed over the light-transmitting substrate. Alternatively, part of a film which forms the transistor can transmit light because film thickness of the transistor is thin. Accordingly, the aperture ratio can be improved.

By using a catalyst (e.g., nickel) in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed over the same substrate.

By using a catalyst (e.g., nickel) in the case of forming microcrystalline silicon, crystallinity can be further improved and a transistor having excellent electric characteristics can be formed. At this time, crystallinity can be improved by performing heat treatment without using a laser. Accordingly, a gate driver circuit (e.g., a scan line driver circuit) and part of a source driver circuit (e.g., an analog switch) can be formed over the same substrate. In addition, in the case of not using a laser for crystallization, crystallinity unevenness of silicon can be suppressed. Therefore, an image having high quality can be displayed.

Note that polycrystalline silicon and microcrystalline silicon can be formed without using a catalyst (e.g., nickel).

In addition, a transistor can be formed by using a semiconductor substrate, an SOI substrate, or the like. Therefore, a transistor with few variations in characteristics, sizes, shapes, or the like, with high current supply capacity, and with a small size can be formed. By using such a transistor, power consumption of a circuit can be reduced or a circuit can be highly integrated.

A transistor including a compound semiconductor or an oxide semiconductor such as zinc oxide (ZnO), amorphous oxide (a-InGaZnO), silicon germanium (SiGe), gallium arsenide (GaAs), indium zinc oxide (IZO), indium tin oxide (ITO), or tin oxide (SnO), a thin film transistor obtained by thinning such a compound semiconductor or a oxide semiconductor, or the like can be used. Thus, manufacturing temperature can be lowered and for example, such a transistor can be formed at room temperature. Accordingly, the transistor can be formed directly on a substrate having low heat resistance such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor formed by using an inkjet method or a printing method, or the like can also be used. Accordingly, a transistor can be formed at room temperature, can be formed at a low vacuum, or can be formed using a large substrate. In addition, since the transistor can be formed without using a mask (a reticle), a layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

A transistor including an organic semiconductor or a carbon nanotube, or the like can be used. Accordingly, such a transistor can be formed using a substrate which can be bent. Therefore, a device using a transistor including an organic semiconductor or a carbon nanotube, or the like can resist a shock.

Further, transistors with various structures can be used. For example, a MOS transistor, a junction transistor, a bipolar transistor, or the like can be used as a transistor described in this document. By using a MOS transistor, the size of the transistor can be reduced. Thus, a plurality of transistors can be mounted. By using a bipolar transistor, large current can flow. Thus, a circuit can be operated at high speed.

Note that a MOS transistor, a bipolar transistor, and the like may be formed over one substrate. Thus, reduction in power consumption, reduction in size, high speed operation, and the like can be realized.

Furthermore, various transistors can be used.

A transistor can be formed using various types of substrates. The type of a substrate where a transistor is formed is not limited to a certain type. For example, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate where the transistor is formed. Alternatively, a skin (e.g., epidermis or corium) or hypodermal tissue of an animal such as a human being can be used as a substrate. In addition, the transistor may be formed using one substrate, and then, the transistor may be transferred to another substrate. A single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. Alternatively, a skin (e.g., epidermis or corium) or hypodermal tissue of an animal such as a human being can be used as a substrate to which the transistor is transferred. Further alternatively, the transistor may be formed using one substrate and the substrate may be thinned by polishing. A single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to be polished. Alternatively, a skin (e.g., epidermis or corium) or hypodermal tissue of an animal such as a human being can be used as a substrate to be polished. By using such a substrate, a transistor with excellent properties or a transistor with low power consumption can be formed, a device with high durability can be formed, heat resistance can be provided, or reduction in weight or thickness can be achieved.

A structure of a transistor can be various modes without limiting to a certain structure. For example, a multi-gate structure having two or more gate electrodes may be used. When the multi-gate structure is used, a structure where a plurality of transistors are connected in series is provided because a structure where channel regions are connected in series is provided. By using the multi-gate structure, off-current can be reduced or the withstand voltage of the transistor can be increased to improve reliability. Alternatively, by using the multi-gate structure, drain-source current does not fluctuate very much even if drain-source voltage fluctuates when the transistor operates in a saturation region, so that a flat slope of voltage-current characteristics can be obtained. By utilizing the flat slope of the voltage-current characteristics, an ideal current source circuit or an active load having a high resistance value can be realized. Accordingly, a differential circuit or a current mirror circuit having excellent properties can be realized. In addition, a structure where gate electrodes are formed above and below a channel may be used. By using the structure where gate electrodes are formed above and below the channel, a channel region is enlarged, so that the current flowing therethrough can be increased or a depletion layer can be easily formed to decrease an S value. When the gate electrodes are formed above and below the channel, a structure where a plurality of transistors are connected in parallel is provided.

Further, a structure where a gate electrode is formed above a channel, a structure where a gate electrode is formed below a channel, a staggered structure, an inversely staggered structure, a structure where a channel region is divided into a plurality of regions, or a structure where channel regions are connected in parallel or in series can be used. In addition, a source electrode or a drain electrode may overlap with a channel region (or part of it). By using the structure where the source electrode or the drain electrode may overlap with the channel region (or part of it), the case can be prevented in which electric charges are accumulated in part of the channel region, which would result in an unstable operation. Further, an LDD region may be provided. By providing the LDD region, off-current can be reduced or the withstand voltage of the transistor can be increased to improve reliability. Alternatively, by providing the LDD region, drain-source current does not fluctuate very much even if drain-source voltage fluctuates when the transistor operates in the saturation region, so that a flat slope of voltage-current characteristics can be obtained.

Various types of transistors can be used for a transistor in this document and the transistor can be formed using various types of substrates. Accordingly, all of circuits which are necessary to realize a predetermined function may be formed using the same substrate. For example, all of the circuits which are necessary to realize the predetermined function may be formed using a glass substrate, a plastic substrate, a single crystalline substrate, an SOI substrate, or any other substrate. When all of the circuits which are necessary to realize the predetermined function are formed using the same substrate, cost can be reduced by reduction in the number of component parts or reliability can be improved by reduction in the number of connections to circuit components. Alternatively, part of the circuits which are necessary to realize the predetermined function may be formed using one substrate and another part of the circuits which are necessary to realize the predetermined function may be formed using another substrate. That is, not all of the circuits which are necessary to realize the predetermined function are required to be formed using the same substrate. For example, part of the circuits which are necessary to realize the predetermined function may be formed with transistors using a glass substrate and another part of the circuits which are necessary to realize the predetermined function may be formed using a single crystalline substrate, so that an IC chip formed with a transistor using the single crystalline substrate may be connected to the glass substrate by COG (chip on glass) and the IC chip may be provided over the glass substrate. Alternatively, the IC chip may be connected to the glass substrate by TAB (tape automated bonding) or a printed wiring board. When part of the circuits are formed using the same substrate in this manner, cost can be reduced by reduction in the number of component parts or reliability can be improved by reduction in the number of connections to circuit components. In addition, for example, by forming a portion with high driving voltage or a portion with high driving frequency, which consumes large power, using a single crystalline substrate and using an IC chip formed with the circuit instead of forming such a portion using the same substrate, increase in power consumption can be prevented.

One pixel corresponds to one element whose brightness can be controlled in this document. One pixel corresponds to one color element which expresses brightness. Therefore, in the case of a color display device having color elements of R (Red), G (Green), and B (Blue), a minimum unit of an image is formed using three pixels of an R pixel, a G pixel, and a B pixel. Note that the color elements are not limited to three colors, and color elements of more than three colors may be used or a color other than RGB may be used. For example, RGBW may be used by adding W (white). In addition, RGB plus one or more colors of yellow, cyan, magenta emerald green, vermilion, and the like may be added. Further, a color similar to at least one of R, G, and B may be added to RGB. For example, R, G, B1, and B2 may be used. Although both B1 and B2 are blue, they have slightly different frequency. Similarly, R1, R2, G, and B may be used, for example. By using such color elements, display which is closer to the real object can be performed. Alternatively, by using such color elements, power consumption can be reduced. Furthermore, as another example, in the case of controlling brightness of one color element by using a plurality of regions, one region may correspond to one pixel. For example, in the case of performing area ratio gray scale display or in the case of including a subpixel, a plurality of regions which control brightness are provided in each color element and gray scales are expressed with the whole regions. In this case, one region which controls brightness may correspond to one pixel. Thus, in that case, one color element includes a plurality of pixels. Alternatively, even when the plurality of regions which control brightness are provided in one color element, these regions may be collected as one pixel. Thus, in that case, one color element includes one pixel. Further, in the case where brightness is controlled in a plurality of regions in each color element, regions which contribute to display have different area sizes depending on pixels in some cases. In addition, in the plurality of regions which control brightness in each color element, signals supplied to each of the plurality of regions may be slightly varied to widen a viewing angle. That is, potentials of pixel electrodes included in the plurality of regions provided in each color element may be different from each other. Accordingly, voltage applied to liquid crystal molecules are varied depending on the pixel electrodes. Therefore, the viewing angle can be widened.

When it is explicitly described that "one pixel (for three colors)", it corresponds to the case where three pixels of R, G, and B are considered as one pixel. Meanwhile, when it is explicitly described that "one pixel (for one color)", it corresponds to the case where the plurality of regions are provided in each color element and collectively considered as one pixel.

In this document, pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Therefore, in the case of performing full color display with three color elements (e.g., RGB), the following cases are included therein: the case where the pixels are arranged in stripes and the case where dots of the three color elements are arranged in a delta pattern. In addition, the case is also included therein in which dots of the three color elements are provided in Bayer arrangement. Note that the color elements are not limited to three colors, and color elements of more than three colors may be used. RGBW, RGB plus one or more of yellow, cyan, magenta, and the like, or the like is given as an example. Further, the sizes of display regions may be different between respective dots of color elements. Thus, power consumption can be reduced or the life of a display element can be prolonged.

In this document, an active matrix method in which an active element is included in a pixel or a passive matrix method in which an active element is not included in a pixel can be used.

In the active matrix method, as an active element (a non-linear element), not only a transistor but also various active elements (non-linear elements) can be used. For example, an MIM (metal insulator metal), a TFD (thin film diode), or the like can also be used. Since such an element has few number of manufacturing steps, manufacturing cost can be reduced or yield can be improved. Further, since the size of the element is small, the aperture ratio can be improved, so that power consumption can be reduced or high luminance can be achieved.

As a method other than the active matrix method, the passive matrix method in which an active element (a non-linear element) is not used can also be used. Since an active element (a non-linear element) is not used, manufacturing steps is few, so that manufacturing cost can be reduced or the yield can be improved. Further, since an active element (a non-linear element) is not used, the aperture ratio can be improved, so that power consumption can be reduced or high luminance can be achieved.

A transistor is an element having at least three terminals of a gate, a drain, and a source. The transistor has a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, in this document, a region functioning as a source and a drain may not be called the source or the drain. In such a case, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a source region and the other thereof may be called a drain region.

A transistor may be an element having at least three terminals of a base, an emitter, and a collector. In this case also, one of the emitter and the collector may be similarly called a first terminal and the other terminal may be called a second terminal.

A gate corresponds to all or part of a gate electrode and a gate wiring (also referred to as a gate line, a gate signal line, a scan line, a scan signal line, or the like). A gate electrode corresponds to a conductive film which overlaps with a semiconductor which forms a channel region with a gate insulating film interposed therebetween. Note that part of the gate electrode overlaps with an LDD (lightly doped drain) region, the source region, or the drain region with the gate insulating film interposed therebetween in some cases. A gate wiring corresponds to a wiring for connecting a gate electrode of each transistor to each other, a wiring for connecting a gate electrode of each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

A portion (a region, a conductive film, a wiring, or the like) which is formed using the same material as a gate electrode, forms the same island as the gate electrode, and is connected to the gate electrode may also be called a gate electrode. Similarly, a portion (a region, a conductive film, a wiring, or the like) which is formed using the same material as a gate wiring, forms the same island as the gate wiring, and is connected to the gate wiring may also be called a gate wiring. In a strict detect, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed using the same material as a gate electrode or a gate wiring, forms the same island as the gate electrode or the gate wiring, and is connected to the gate electrode or the gate wiring. Thus, such a portion (a region, a conductive film, a wiring, or the like) may also be called either a gate electrode or a gate wiring.

In a multi-gate transistor, for example, a gate electrode is often connected to another gate electrode by using a conductive film which is formed using the same material as the gate electrode. Since such a portion (a region, a conductive film, a wiring, or the like) is a portion (a region, a conductive film, a wiring, or the like) for connecting the gate electrode to another gate electrode, it may be called a gate wiring, and it may also be called a gate electrode because a multi-gate transistor can be considered as one transistor. That is, a portion (a region, a conductive film, a wiring, or the like) which is formed using the same material as a gate electrode or a gate wiring, forms the same island as the gate electrode or the gate wiring, and is connected to the gate electrode or the gate wiring may be called either a gate electrode or a gate wiring. In addition, for example, part of a conductive film which connects the gate electrode and the gate wiring and is formed using a material which is different from that of the gate electrode or the gate wiring may also be called either a gate electrode or a gate wiring.

A gate terminal corresponds to part of a portion (a region, a conductive film, a wiring, or the like) of a gate electrode or a portion (a region, a conductive film, a wiring, or the like) which is electrically connected to the gate electrode.

When a wiring is called a gate wiring, a gate line, a gate signal line, a scan line, a scan signal line, there is the case in which a gate of a transistor is not connected to a wiring. In this case, the gate wiring, the gate line, the gate signal line, the scan line, or the scan signal line corresponds to a wiring formed in the same layer as the gate of the transistor, a wiring formed using the same material of the gate of the transistor, or a wiring formed at the same time as the gate of the transistor in some cases. As examples, a wiring for storage capacitance, a power supply line, a reference potential supply line, and the like can be given.

A source corresponds to all or part of a source region, a source electrode, and a source wiring (also referred to as a source line, a source signal line, a data line, a data signal line, or the like). A source region corresponds to a semiconductor region including a large amount of p-type impurities (e.g., boron or gallium) or n-type impurities (e.g., phosphorus or arsenic). Therefore, a region including a small amount of p-type impurities or n-type impurities, namely, an LDD (lightly doped drain) region is not included in the source region. A source electrode is part of a conductive layer formed using a material different from that of a source region, and electrically connected to the source region. However, there is the case where a source electrode and a source region are collectively called a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be called either a source electrode or a source wiring.

A portion (a region, a conductive film, a wiring, or the like) which is formed using the same material as a source electrode, forms the same island as the source electrode, and is connected to the source electrode, or a portion (a region, a conductive film, a wiring, or the like) which connects a source electrode and another source electrode may also be called a source electrode. Further, a portion which overlaps with a source region may be called a source electrode. Similarly, a portion (a region, a conductive film, a wiring, or the like) which is formed using the same material as a source wiring, forms the same island as the source wiring, and is connected to the source wiring may also be called a source wiring. In a strict detect, such a portion (a region, a conductive film, a wiring, or the like) does not have a function of connecting the source electrode to another source electrode in some cases. However, there is a portion (a region, a conductive film, a wiring, or the like) which is formed using the same material as a source electrode or a source wiring, forms the same island as the source electrode or the source wiring, and is connected to the source electrode or the source wiring. Thus, such a portion (a region, a conductive film, a wiring, or the like) may also be called either a source electrode or a source wiring.

For example, part of a conductive film which connects a source electrode and a source wiring and is formed using a material which is different from that of the source electrode or the source wiring may be called either a source electrode or a source wiring.

A source terminal corresponds to part of a source region, a source electrode, or a portion (a region, a conductive film, a wiring, or the like) which is electrically connected to the source electrode.

When a wiring is called a source wiring, a source line, a source signal line, a data line, a data signal line, there is the case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed using the same material of the source (the drain) of the transistor, or a wiring formed at the same time as the source (the drain) of the transistor in some cases. As examples, a wiring for storage capacitance, a power supply line, a reference potential supply line, and the like can be given.

The same can be said for a drain.

A semiconductor device corresponds to a device having a circuit including a semiconductor element (e.g., a transistor, a diode, or thyristor). The semiconductor device may also include all devices that can function by utilizing semiconductor characteristics. In addition, the semiconductor device corresponds to a device having a semiconductor material.

A display device corresponds to a device having a display element. The display device may include a plurality of pixels each having a display element. In addition, the display device may also include a peripheral driver circuit for driving the plurality of pixels. The peripheral driver circuit for driving the plurality of pixels may be formed over the same substrate as the plurality of pixels. The display device may also include a peripheral driver circuit provided over a substrate by wire bonding or bump bonding, namely, an IC chip connected by chip on glass (COG) or an IC chip connected by TAB or the like. Further, the display device may also include a flexible printed circuit (an FPC) to which an IC chip, a resistor, a capacitor, an inductor, a transistor, or the like is attached. Note also that the display device includes a printed wiring board (a PWB) which is connected through a flexible printed circuit (an FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

A display element corresponds to an optical modulation element, a liquid crystal element, a light-emitting element, an EL element (an organic EL element, an inorganic EL element, or an EL element including organic and inorganic materials), an electron emitter, an electrophoresis element, a discharging element, a light-reflective element, a light diffraction element, a digital micro device (DMD), or the like. Note that the present invention is not limited to this.

A lighting device corresponds to a device having a backlight unit, a light guide plate, a prism sheet, a diffusion sheet, a reflective sheet, or a light source (e.g., an LED, a cold cathode fluorescent lamp, or a hot cathode fluorescent lamp), a cooling device, or the like.

A light-emitting device corresponds to a device having a light-emitting element and the like. In the case of including a light-emitting element as a display element, the light-emitting device is one of specific examples of a display device.

A reflective device corresponds to a device having a light-reflective element, a light diffraction element, light-reflective electrode, or the like.

A liquid crystal display device corresponds to a display device including a liquid crystal element. Liquid crystal display devices include a direct-view liquid crystal display, a projection liquid crystal display, a transmissive liquid crystal display, a reflective liquid crystal display, a semi-transmissive liquid crystal display, and the like.

A driving device corresponds to a device having a semiconductor element, an electric circuit, or an electronic circuit. For example, a transistor which controls input of a signal from a source signal line to a pixel (also referred to as a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also referred to as a gate driver, a gate line driver circuit, or the like), a circuit which supplies a signal to a source signal line (also referred to as a source driver, a source line driver circuit, or the like) are also examples of the driving device. A first circuit 102 and a second circuit 103 in FIG. 1A are also examples of the driving device.

A display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

In this document, when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Similarly, when it is explicitly described that B is formed above A, it does not necessarily mean that B is formed in direct contact with A, and another object may be interposed therebetween. For example, when it is explicitly described that a layer B is formed above a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Note that when it is explicitly described that B is formed in direct contact with A, it includes not the case where another object is interposed between A and B but the case where B is formed in direct contact with A.

Note that the same can be said when it is described that B is formed below or under A.

In this document, when an object is explicitly described in a singular form, the object is preferably singular. Note that the present invention is not limited to this, and the object can be plural. Similarly, when an object is explicitly described in a plural form, the object is preferably plural. Note that the present invention is not limited to this, and the object can be singular.

By using the present invention, a semiconductor device which can detect low illuminance can be obtained. In addition, a semiconductor device which operates at low voltage, a semiconductor device with low power consumption, a semiconductor device which can be easily connected to another semiconductor device, or a semiconductor device which is made smaller can be obtained.

BRIEF DESCRIPTION OF THE DRAWINGS

In the accompanying drawings:

FIG. 28 illustrates a device on which a semiconductor device of the present invention is mounted;

DETAILED DESCRIPTION OF THE INVENTION

Figure 1A:
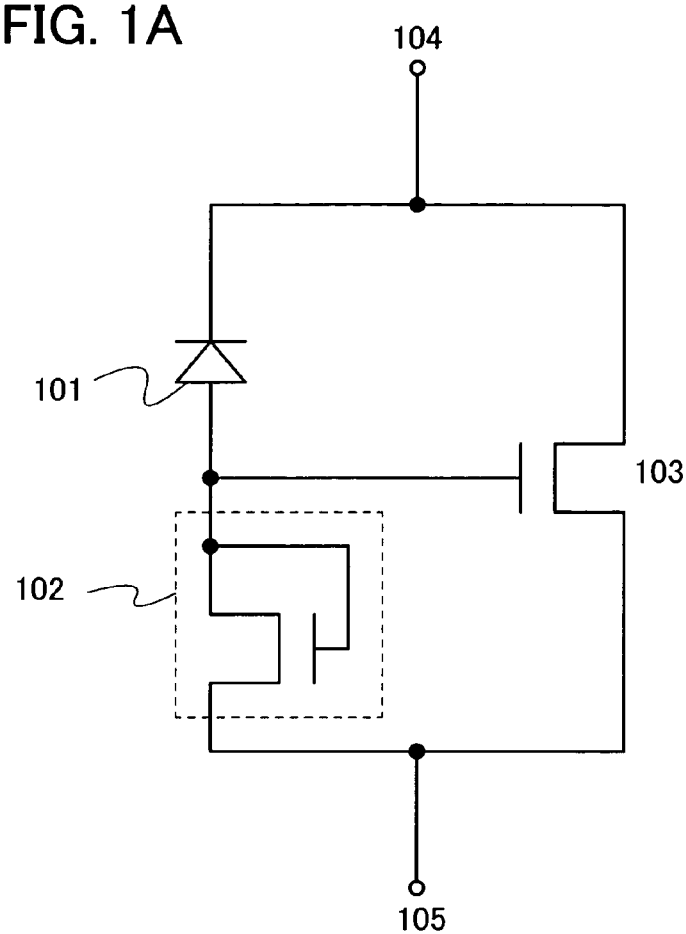
FIG. 1A illustrates a semiconductor device of the present invention and FIG. 1B illustrates characteristics of a transistor included in the semiconductor device.

Hereinafter, the present invention will be described by way of embodiment modes with reference to the drawings. However, the present invention can be implemented in various different ways and it will be easily understood by those skilled in the art that various changes and modifications are possible. Unless such changes and modifications depart from the spirit and the scope of the present invention, they should be construed as being included therein. Therefore, the present invention should not be construed as being limited to the description of the embodiment modes of the present invention. Note that in structures of the present invention described hereinafter, the same portions or portions having similar functions are denoted by common reference numerals in different drawings, and detailed description thereof is omitted.

Embodiment Mode 1

One embodiment mode of a semiconductor device of the present invention is described with reference to FIGS. 1A and 1B. The semiconductor device shown in FIG. 1A includes a photoelectric conversion element 101, a first circuit 102, a second circuit 103, a first terminal 104, and a second terminal 105. The first circuit 102 is connected to the photoelectric conversion element 101 in series. In addition, the first circuit 102 has a function of generating voltage in accordance with input current, e.g., current flowing to the photoelectric conversion element 101. That is, the first circuit 102 has a function as a current-voltage conversion circuit. The second circuit 103 has a function of generating current in accordance with input voltage, e.g., voltage of the photoelectric conversion element 101 or the first circuit 102. That is, the second circuit 103 has a function as a voltage-current conversion circuit.

Usually, high voltage is supplied to the first terminal 104 and low voltage is supplied to the second terminal 105. Therefore, current usually flows from the first terminal 104 toward the second terminal 105. Note that the present invention is not limited to this, and reverse current can flow by applying reverse voltage.

FIG. 1A shows the case where a photodiode is used as an example of the photoelectric conversion element 101. A photodiode is often used under a reverse bias state. Thus, a cathode terminal of the photodiode is connected to the first terminal 104 and an anode terminal of the photodiode is connected to the first circuit 102. When the photodiode which is under a reverse bias state is irradiated with light, current flowing to the photodiode is changed. Therefore, by detecting the current flowing to the photodiode, illuminance can be detected.

Various elements can be used for the photoelectric conversion element 101. For example, a PN diode, a PIN diode, a Schottky diode, an MIS diode, or the like can be used.

Although the photoelectric conversion element 101, i.e., an element which converts light into an electron is used in FIG. 1A, the present invention is not limited to this and various elements can be used. For example, a pressure sensor element (e.g., an element which converts pressure into an electron), a temperature sensor element (e.g., an element which converts temperature into an electron), an acceleration sensor element (e.g., an element which converts acceleration into an electron), a hardness sensor element (e.g., an element which converts hardness into an electron), a sound volume sensor element (e.g., an element which converts sound into an electron), or the like can be used.

In FIG. 1A, the current flowing to the photoelectric conversion element 101 is converted into voltage using the first circuit 102 connected to the photoelectric conversion element 101 in series. In FIG. 1A, a diode-connected N-channel transistor is used as an example of the first circuit 102. A gate (or a gate electrode) of the N-channel transistor included in the first circuit 102 in FIG. 1A is connected to the photoelectric conversion element 101. A drain (or a drain electrode) of the N-channel transistor included in the first circuit 102 is connected to the photoelectric conversion element 101. A source (or a source electrode) of the N-channel transistor included in the first circuit 102 is connected to the second terminal 105. When the current flowing to the photoelectric conversion element 101 increases, voltage at opposite ends of the first circuit 102 also increases.

The voltage generated in the first circuit 102 (or the photoelectric conversion element 101) is supplied to the second circuit 103. The second circuit 103 outputs current in accordance with the voltage generated in the first circuit 102 (or the photoelectric conversion element 101). FIG. 1A shows the case where an N-channel transistor is used as an example of the second circuit 103. A gate (or a gate electrode) of the N-channel transistor included in the second circuit 103 in FIG. 1A is connected to the first circuit 102 (or the photoelectric conversion element 101). A source (or a source electrode) of the N-channel transistor included in the second circuit 103 is connected to the second terminal 105. A drain (or a drain electrode) of the N-channel transistor included in the second circuit 103 is connected to the first terminal 104. Therefore, when the current flowing to the photoelectric conversion element 101 increases, the voltage at the opposite ends of the first circuit 102 and gate-source voltage of the N-channel transistor included in the second circuit 103 also increase. Accordingly, drain-source current of the N-channel transistor included in the second circuit 103 increases. That is, a signal in accordance with illuminance is amplified.

Current drive capability of the transistor included in the second circuit 103 is preferably high. This is because large current flows to the first terminal 104 and the second terminal 105 and the signal in accordance with illuminance is further amplified when the transistor with high current drive capability is used. As a method for improving current drive capability of the transistor, for example, increasing the channel width W, decreasing the channel length L, or connecting a plurality of transistors in parallel (substantially, this is the same as increasing the channel width W) can be used.

Although the photoelectric conversion element 101 and the second circuit 103 are connected to the same terminal (the first terminal 104), the terminal to which the photoelectric conversion element 101 and the second circuit 103 are connected is not limited to this. Another terminal may be provided and the photoelectric conversion element 101 and the second circuit 103 may be connected to different terminals. Note that the first circuit 102 and the second circuit 103 are connected to the same terminal (the second terminal 105), the terminal to which the first circuit 102 and the second circuit 103 are connected is not limited to this. Another terminal may be provided and the first circuit 102 and the second circuit 103 may be connected to different terminals.

Figure 1B:
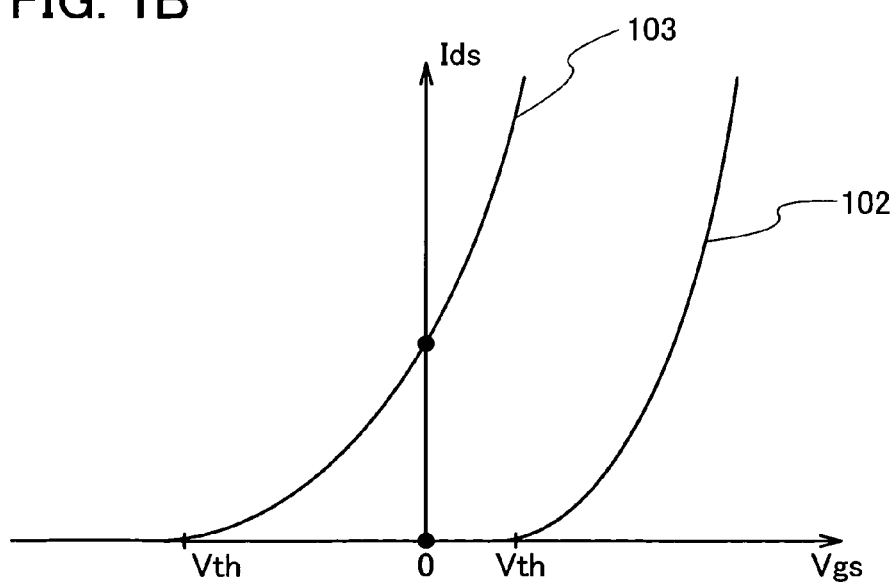

Next, FIG. 1B shows a graph of current characteristics of the N-channel transistor included in the first circuit 102 in the case of predetermined Vds. The horizontal axis represents Vgs of the N-channel transistor included in the first circuit 102, and the vertical axis represents Ids of the N-channel transistor included in the first circuit 102. From FIG. 1B, it can be seen that the N-channel transistor included in the first circuit 102 has the current characteristics in which current is small when Vgs=0 V. Accordingly, even when illuminance of light emitted to the photoelectric conversion element 101 is low, i.e., even when the current flowing to the photoelectric conversion element 101 is small, the current can be detected.

The threshold voltage (Vth) of the N-channel transistor included in the first circuit 102 is preferably 0 V or higher. Such a transistor is referred to as an enhancement transistor, or the like.

Next, FIG. 1B also shows a graph of current characteristics of the N-channel transistor included in the second circuit 103 in the case of the predetermined Vds. The horizontal axis represents Vgs of the N-channel transistor included in the second circuit 103, and the vertical axis represents Ids of the N-channel transistor included in the second circuit 103. From FIG. 1B, it can be seen that the N-channel transistor included in the second circuit 103 has the current characteristics in which current is large when Vgs=0 V. Accordingly, even when voltage supplied to opposite ends of the second circuit 103, i.e., voltage supplied between the first terminal 104 and the second terminal 105 is small, large current can flow.

The threshold voltage (Vth) of the N-channel transistor included in the second circuit 103 is preferably 0 V or lower. Such a transistor is referred to as a depletion transistor, or the like.

When the N-channel transistor included in the first circuit 102 and the N-channel transistor included in the second circuit 103 have different threshold voltages in this manner, detecting of low illuminance and an operation at low voltage can be realized. Note that the threshold voltage of the N-channel transistor included in the first circuit 102 is preferably higher than that of the N-channel transistor included in the second circuit 103. More preferably, difference between the threshold voltage of the N-channel transistor included in the first circuit 102 and the threshold voltage of the N-channel transistor included in the second circuit 103 is 1V or higher. More preferably, the difference between the threshold voltage of the N-channel transistor included in the first circuit 102 and the threshold voltage of the N-channel transistor included in the second circuit 103 is 3V or higher. Alternatively, the N-channel transistor included in the first circuit 102 and the N-channel transistor included in the second circuit 103 preferably have different current characteristics. For example, it is preferable that one of the N-channel transistor included in the first circuit 102 and the N-channel transistor included in the second circuit 103 be an enhancement transistor and the other thereof be a depletion transistor.

Figure 2:
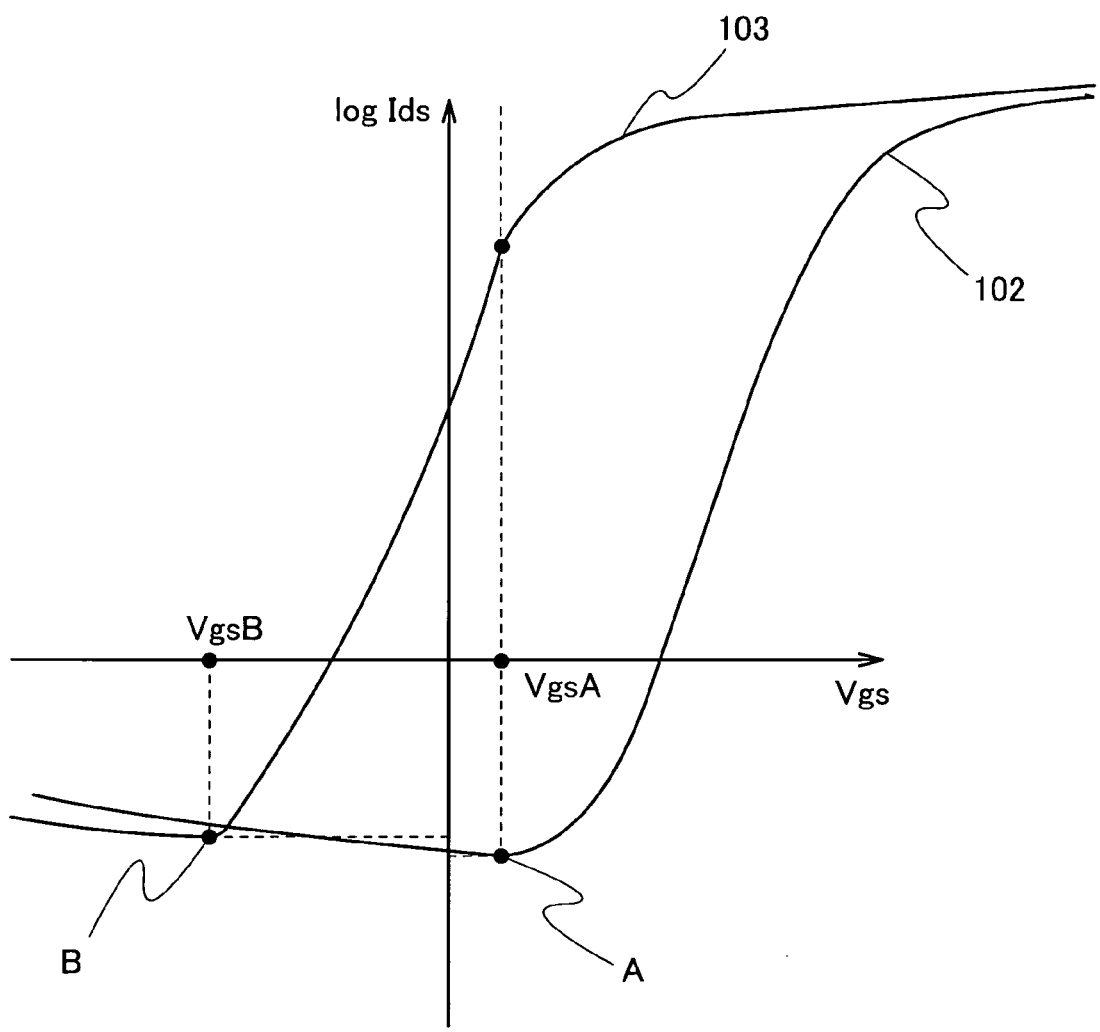
FIG. 2 illustrates a semiconductor device of the present invention.

Next, FIG. 2 shows current characteristics of the transistors in the case where the vertical axis in the graph in FIG. 1B is logarithmic. In a curve of current characteristics of the N-channel transistor included in the first circuit 102, a point where current is the smallest is denoted by a point A and Vgs at this time is denoted by VgsA. In addition, in a curve of current characteristics of the N-channel transistor included in the second circuit 103, a point where current is the smallest is denoted by a point B and Vgs at this time is denoted by VgsB. For example, VgsA is preferably higher than VgsB. Alternatively, VgsA is preferably 0 V or higher, for example. Accordingly, detecting of low illuminance can be realized. Alternatively, VgsB is preferably 0 V or lower, for example. Accordingly, an operation at low voltage can be realized.

In order to make the N-channel transistor included in the first circuit 102 and the N-channel transistor included in the second circuit 103 have different threshold voltages in this manner, channels are doped with different impurities. When the N-channel transistor included in the first circuit 102 is channel-doped with P-type impurities (e.g., boron or gallium) using a mask (a reticle), the N-channel transistor included in the first circuit 102 can be used as an enhancement transistor. Alternatively, when the N-channel transistor included in the second circuit 103 is channel-doped with N-type impurities (e.g., phosphorus or arsenic), the N-channel transistor included in the second circuit 103 can be used as a depletion transistor.

Although the number of N-channel transistors included in the first circuit 102 is one in FIG. 1A, the number of N-channel transistors included in the first circuit 102 is not limited to this. A plurality of N-channel transistors may be connected in series or in parallel.

Similarly, although the number of N-channel transistors included in the second circuit 103 is one in FIG. 1A, the number of N-channel transistors included in the second circuit 103 is not limited to this. A plurality of N-channel transistors may be connected in series or in parallel.

A wiring, an electrode, a conductive layer, a conductive film, a terminal, a via, a plug, or the like is preferably formed using one element or a plurality of elements of a group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O), or a compound or an alloy material including one element or a plurality of such elements (e.g., indium tin oxide (ITO), indium zinc oxide (IZO), indium tin oxide to which silicon oxide is added (ITSO), zinc oxide (ZnO), tin oxide (SnO), cadmium tin oxide (CTO), aluminum neodymium (Al—Nd), magnesium silver (Mg—Ag), or molybdenum neodymium (Mo—Nb)). Alternatively, a wiring, an electrode, a conductive layer, a conductive film, a terminal, or the like is preferably formed using a substance or the like obtained by combining such compounds. Further alternatively, a wiring, an electrode, a conductive layer, a conductive film, a terminal, or the like is preferably formed using a compound of one element or a plurality of elements of the above-described group and silicon (silicide) (e.g., aluminum silicon, molybdenum silicon, or nickel silicide) or a compound of one element or a plurality of elements selected from the above-described group and nitride (e.g., titanium nitride, tantalum nitride, or molybdenum nitride).

Silicon (Si) may include n-type impurities (e.g., phosphorus) or p-type impurities (e.g., boron). When silicon includes such impurities, conductivity is improved and silicon can behave in a similar manner to a normal conductor. Therefore, silicon can be easily utilized as a wiring or an electrode.

Silicon with various crystallinity such as single crystalline silicon, polycrystalline silicon (polysilicon), or microcrystalline silicon can be used as silicon. Alternatively, silicon with no crystallinity such as amorphous silicon can be used as silicon. By using single crystalline silicon or polycrystalline silicon, resistance of a wiring, an electrode, a conductive layer, a conductive film, a terminal, or the like can be decreased. By using amorphous silicon or microcrystalline silicon, a wiring or the like can be formed through a simple process.

Since aluminum or silver has high conductivity, signal delay can be reduced. In addition, aluminum or silver can be easily etched and patterned, so that microfabrication can be performed.

Since copper has high conductivity, signal delay can be reduced. In the case of using copper, it is preferable to use a stacked-layer structure in order to improve adhesiveness.

Molybdenum or titanium is preferable because it has advantages such that a defect does not occur even when molybdenum or titanium is in contact with a oxide semiconductor (e.g., ITO or IZO) or silicon, etching can be easily performed, and heat resistance is high.

Tungsten is preferable because it has advantages such that heat resistance is high.

Neodymium is preferable because it has advantages such that heat resistance is high. In particular, it is preferable to use an alloy of neodymium and aluminum because heat resistance is improved and a hillock is hardly generated in aluminum.

Silicon is preferable because it has advantages such that silicon can be formed at the same time as a semiconductor film included in a transistor and heat resistance is high.

Note that ITO, IZO, ITSO, zinc oxide (ZnO), silicon (Si), tin oxide (SnO), or cadmium tin oxide (CTO) can be used for a portion which transmits light because it has light-transmitting properties. For example, the material can be used for a pixel electrode or a common electrode.

IZO is preferable because it can be easily etched and patterned. IZO hardly generates a residue when it is etched. Therefore, when IZO is used for a pixel electrode, a malfunction (e.g., a short circuit or alignment disorder) of a liquid crystal element or a light-emitting element can be reduced.

A wiring, an electrode, a conductive layer, a conductive film, a terminal, a via, a plug, or the like may have either a single-layer structure or a stacked-layer structure. When a single-layer structure is employed, a manufacturing process of a wiring, an electrode, a conductive layer, a conductive film, a terminal, or the like can be simplified. Therefore, the number of manufacturing steps can be reduced, so that cost can be reduced. Alternatively, when a multi-layer structure is employed, advantages of each material can be effectively utilized while disadvantages of each material can be reduced, so that a wiring, an electrode, or the like with high performance can be formed. For example, when a multi-layer structure includes a low resistance material (e.g., aluminum), resistance of a wiring can be decreased. In addition, when a stacked-layer structure where a low heat-resistance material is sandwiched between high heat-resistance materials is employed, advantages of the low heat-resistance material can be effectively utilized and heat resistance of a wiring, an electrode, or the like can be increased. For example, a stacked-layer structure where a layer including aluminum is sandwiched between layers including molybdenum, titanium, neodymium, or the like is preferably employed.

When a wiring, an electrode, and the like are directly in contact with each other, they adversely affect each other in some cases. For example, a material of one of the wiring, the electrode, and the like is mixed into a material of the other of the wiring, the electrode, and the like and properties of the materials are changed, so that the original object cannot be achieved in some cases. As another example, when a high resistance portion is formed or manufactured, the high resistance portion cannot be manufactured normally because of generation of a problem in some cases. In such a case, a material which easily reacts by a stacked-layer structure may be sandwiched between or covered with materials which hardly react. For example, when ITO and aluminum are connected, it is preferable to sandwich titanium, molybdenum, or an alloy of neodymium between ITO and aluminum. In addition, when silicon and aluminum are connected, it is preferable to sandwich titanium, molybdenum, or an alloy of neodymium between silicon and aluminum.

A wiring corresponds to an object provided with a conductor. The conductor may be extended linearly or may be short. Therefore, an electrode corresponds to a wiring.

A carbon nanotube may be used for a wiring, an electrode, a conductive layer, a conductive film, a terminal, a via, a plug, or the like. In addition, a carbon nanotube can be used for a portion which transmits light because it has light-transmitting properties. For example, a carbon nanotube can be used for a pixel electrode or a common electrode.

Figure 13:
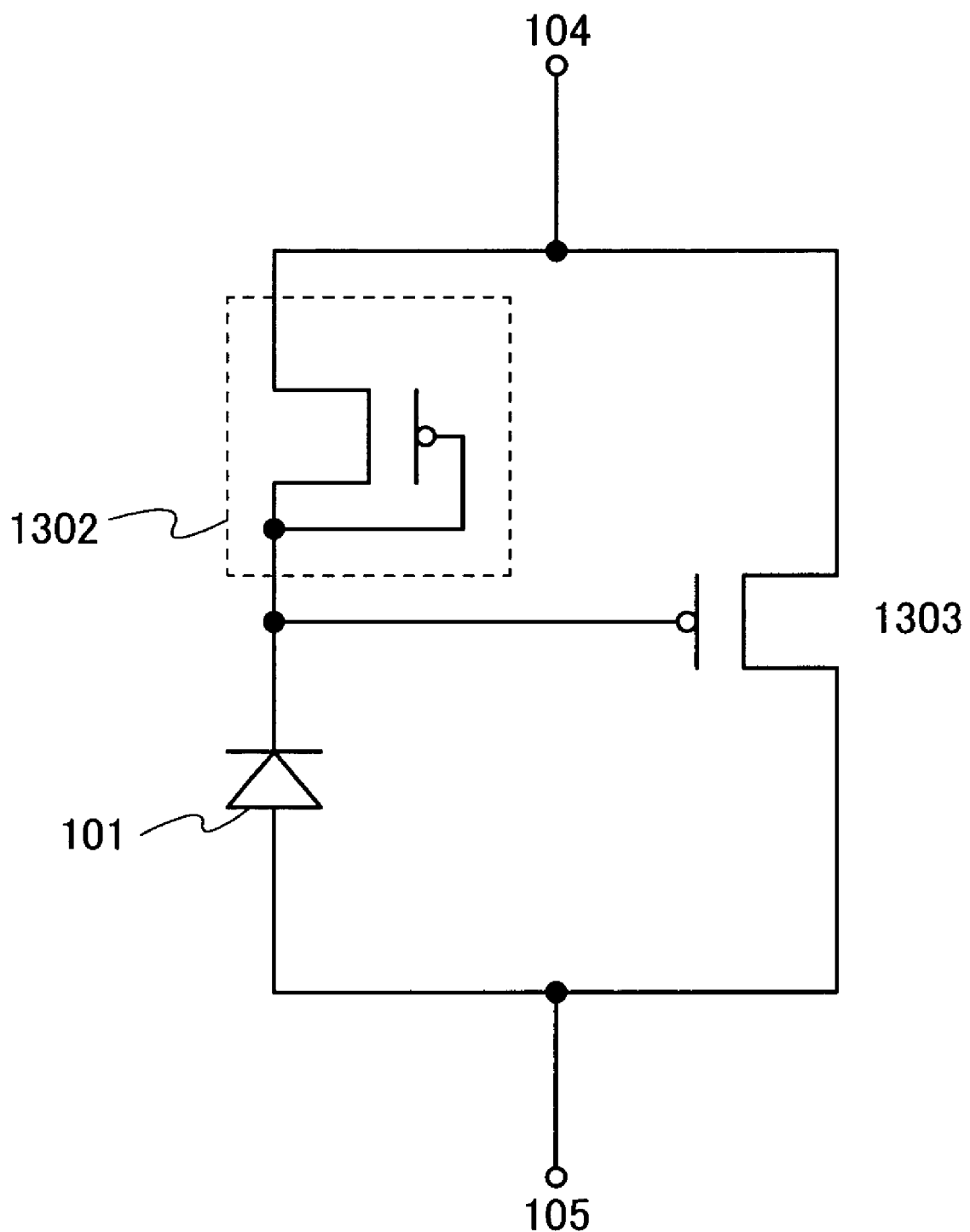
FIG. 13 illustrates a semiconductor device of the present invention.

Although the case where an N-channel transistor is used for the second circuit 103 is described in this embodiment mode, a P-channel transistor may be used for a second circuit 1303, as shown in FIG. 13. It is acceptable as log as a first circuit 1302 has a function of generating voltage in accordance with the current flowing to the photoelectric conversion element 101, and a diode-connected P-channel transistor can be used for the first circuit 1302, for example. In this case, in order to generate the voltage in accordance with the current flowing to the photoelectric conversion element 101 in the first circuit 1302, the first circuit 1302 may be connected to the first terminal 104 and the photoelectric conversion element 101 may be connected to the second terminal 105.

Embodiment Mode 2

Figure 3:
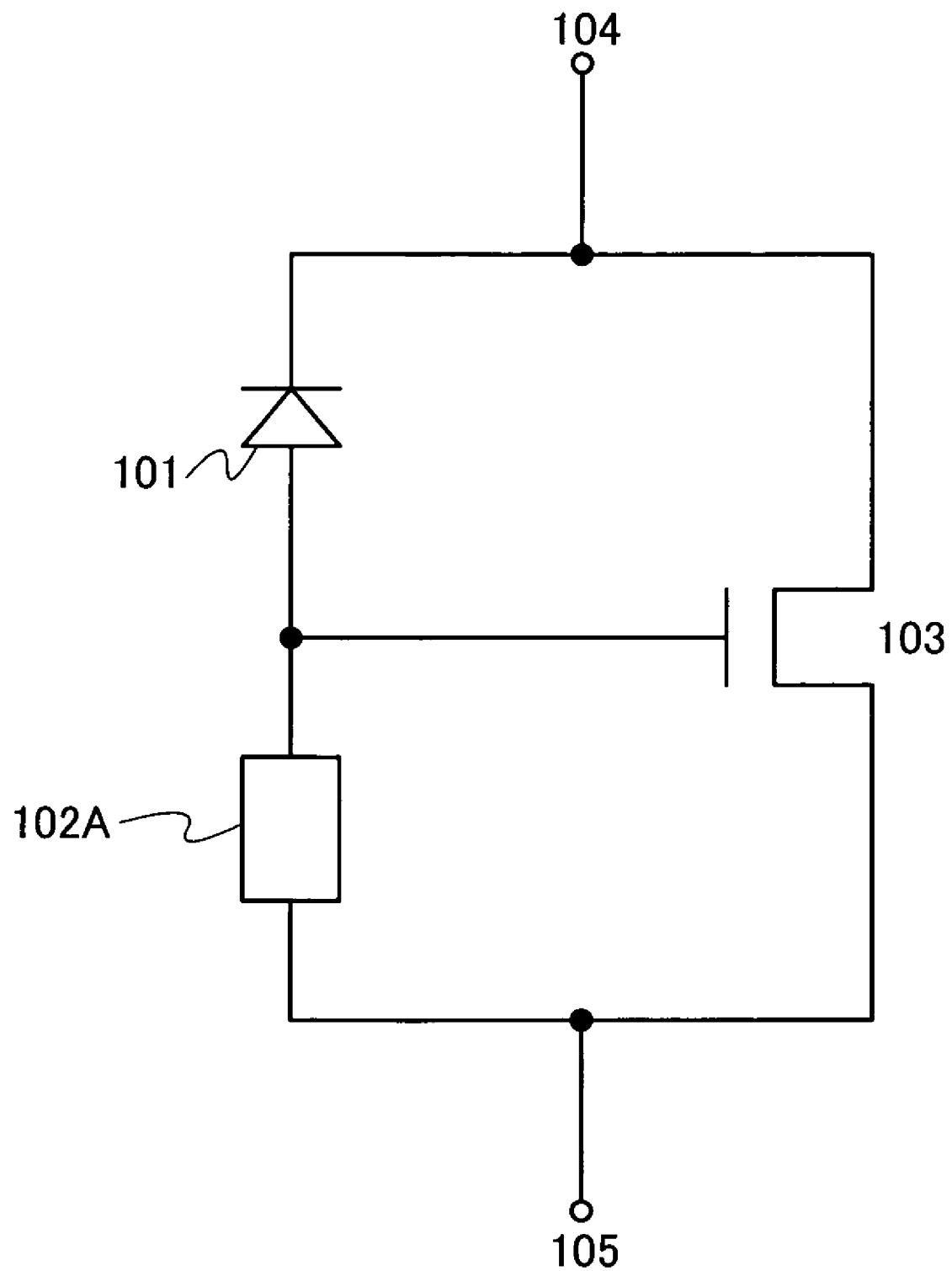
FIG. 3 illustrates a semiconductor device of the present invention.

The case where the first circuit 102 is a diode-connected N-channel transistor is described in Embodiment Mode 1. Note that the present invention is not limited to this, and various structures can be used for the first circuit 102. For example, as shown in FIG. 3, a current-voltage conversion circuit 102A may be used for the first circuit 102.

Connection relationships of the case where a photodiode is used as an example of the photoelectric conversion element 101 are described below. In FIG. 3, a cathode terminal of the photodiode is connected to the first terminal 104 and an anode terminal of the photodiode is connected to a first terminal of the current-voltage conversion circuit 102A. The first terminal of the current-voltage conversion circuit 102A is connected to the gate (or the gate electrode) of the N-channel transistor included in the second circuit 103. A second terminal of the current-voltage conversion circuit 102A is connected to the second terminal 105.

The current flowing to the photoelectric conversion element 101 is converted into voltage using the current-voltage conversion circuit 102A connected to the photoelectric conversion element 101 in series. When the current flowing to the photoelectric conversion element 101 increases, voltage at opposite ends of the current-voltage conversion circuit 102A also increases.

The voltage generated in the current-voltage conversion circuit 102A (or the photoelectric conversion element 101) is supplied to the second circuit 103. The second circuit 103 outputs current in accordance with the voltage generated in the current-voltage conversion circuit 102A (or the photoelectric conversion element 101). FIG. 3 shows the case where an N-channel transistor is used as an example of the second circuit 103, similarly to FIG. 1A. In the second circuit 103 in FIG. 3, a gate (or a gate electrode) of the N-channel transistor is connected to the current-voltage conversion circuit 102A (or the photoelectric conversion element 101). A source (or a source electrode) of the N-channel transistor is connected to the second terminal 105. A drain (or a drain electrode) of the N-channel transistor is connected to the first terminal 104. Therefore, when the current flowing to the photoelectric conversion element 101 increases, the voltage at the opposite ends of the current-voltage conversion circuit 102A and gate-source voltage of the N-channel transistor also increase. Accordingly, drain-source current of the N-channel transistor increases. That is, a signal in accordance with illuminance is amplified.

Although the current-voltage conversion circuit 102A and the second circuit 103 are connected to the same terminal (the second terminal 105), the terminal to which the current-voltage conversion circuit 102A and the second circuit 103 are connected is not limited to this. Another terminal may be provided and the current-voltage conversion circuit 102A and the second circuit 103 may be connected to different terminals.

Figure 4:
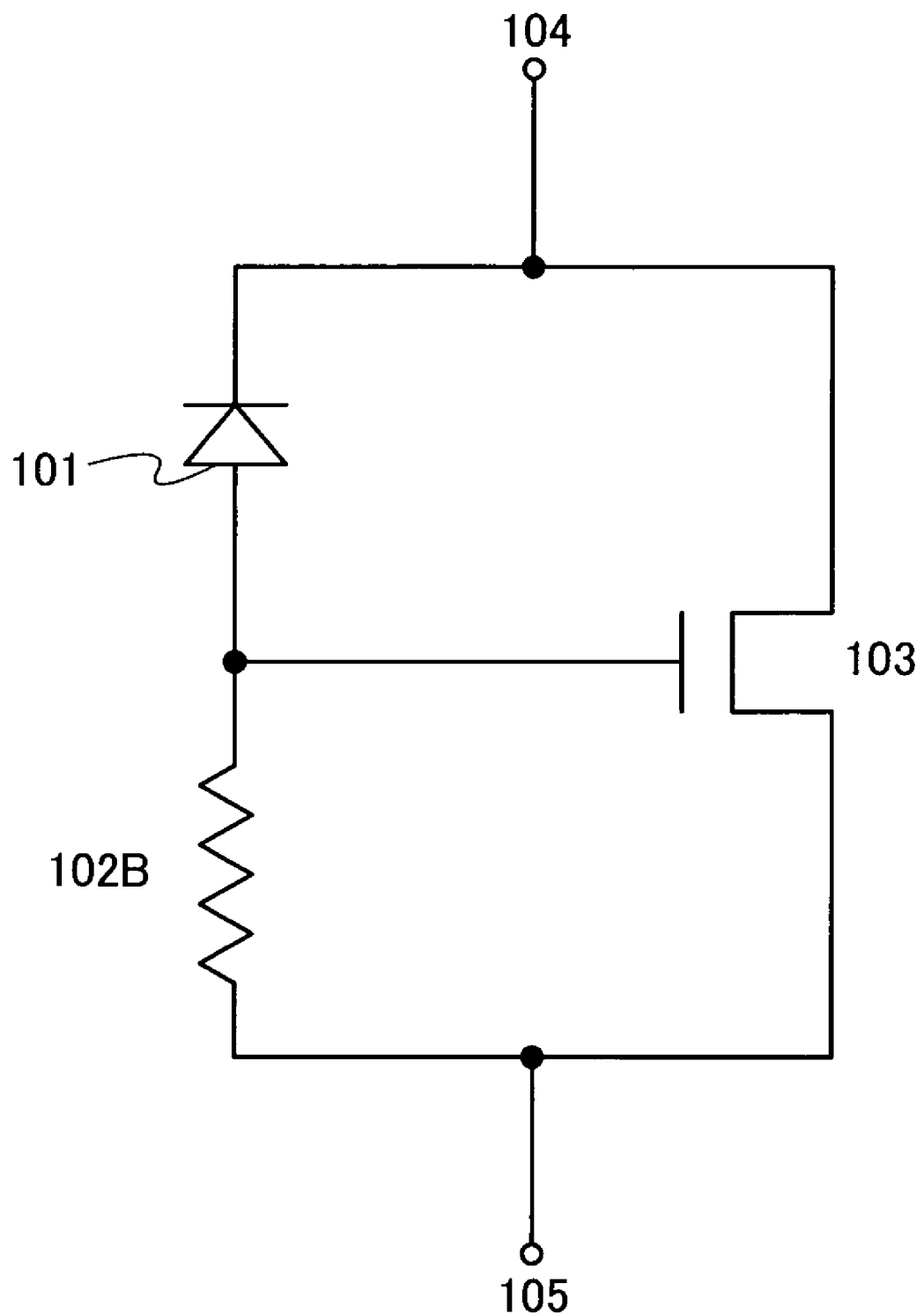
FIG. 4 illustrates a semiconductor device of the present invention.

Various circuits can be used for the current-voltage conversion circuit 102A. FIG. 4 shows the case where a resistor element 102B is used as an example of the current-voltage conversion circuit 102A. Since current of the resistor element 102B is 0 when voltage is not applied to opposite ends of the resistor element 102B, it is conceivable that the resistor element 102B is a kind of an enhancement resistor. The resistor element 102B is preferably formed using the same layer as a semiconductor layer of the transistor. Thus, increase in the number of process steps can be prevented.

Figure 5:
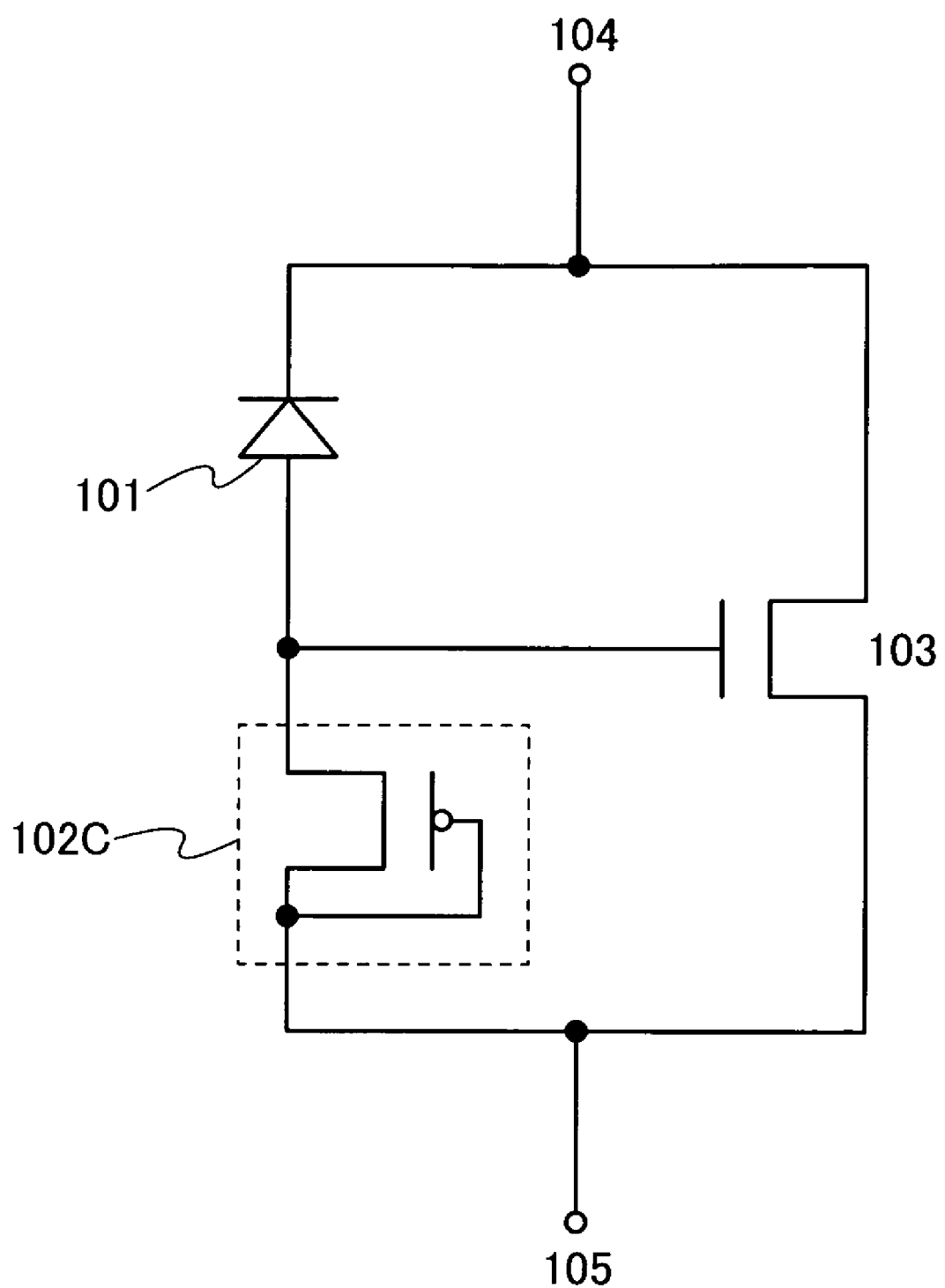
FIG. 5 illustrates a semiconductor device of the present invention.

FIG. 5 shows the case where a diode-connected P-channel transistor 102C is used as an example of the current-voltage conversion circuit 102A. A connection portion of a gate (or a gate electrode) of the P-channel transistor 102C in FIG. 5 is different from that of FIG. 1A. This is because polarity is different in FIGS. 1A and 5. A source (or a source electrode) of the P-channel transistor 102C is connected to the photoelectric conversion element 101. A drain (or a drain electrode) of the P-channel transistor 102C is connected to the second terminal 105. The gate (or the gate electrode) of the P-channel transistor 102C is connected to the second terminal 105.

When the P-channel transistor 102C is used as an example of the current-voltage conversion circuit 102A, there is an advantage that difference between the threshold voltage of the transistor included in the current-voltage conversion circuit 102A and the threshold voltage of the transistor included in the second circuit 103 is easily made. Alternatively, there is an advantage that the transistor included in the current-voltage conversion circuit 102A is easily used as an enhancement transistor. Further alternatively, there is an advantage that the transistor included in the second circuit 103 is easily used as a depletion transistor. This can be realized when the transistor included in the current-voltage conversion circuit 102A and the transistor included in the second circuit 103 are channel-doped with N-type impurities (e.g., phosphorus or arsenic). Since the transistor included in the current-voltage conversion circuit 102A and the transistor included in the second circuit 103 are doped with impurities having the same conductivity type, it is not necessary to perform doping separately. Therefore, a mask (a reticle) is not necessary, so that the number of process steps can be reduced. That is, when the transistor included in the current-voltage conversion circuit 102A and the transistor included in the second circuit 103 have opposite conductivity types of channels, the threshold voltage can be easily controlled.

Although the number of P-channel transistors 102C is one in FIG. 5, the number of P-channel transistors is not limited to this. A plurality of P-channel transistors may be connected in series or in parallel.

Figure 6:
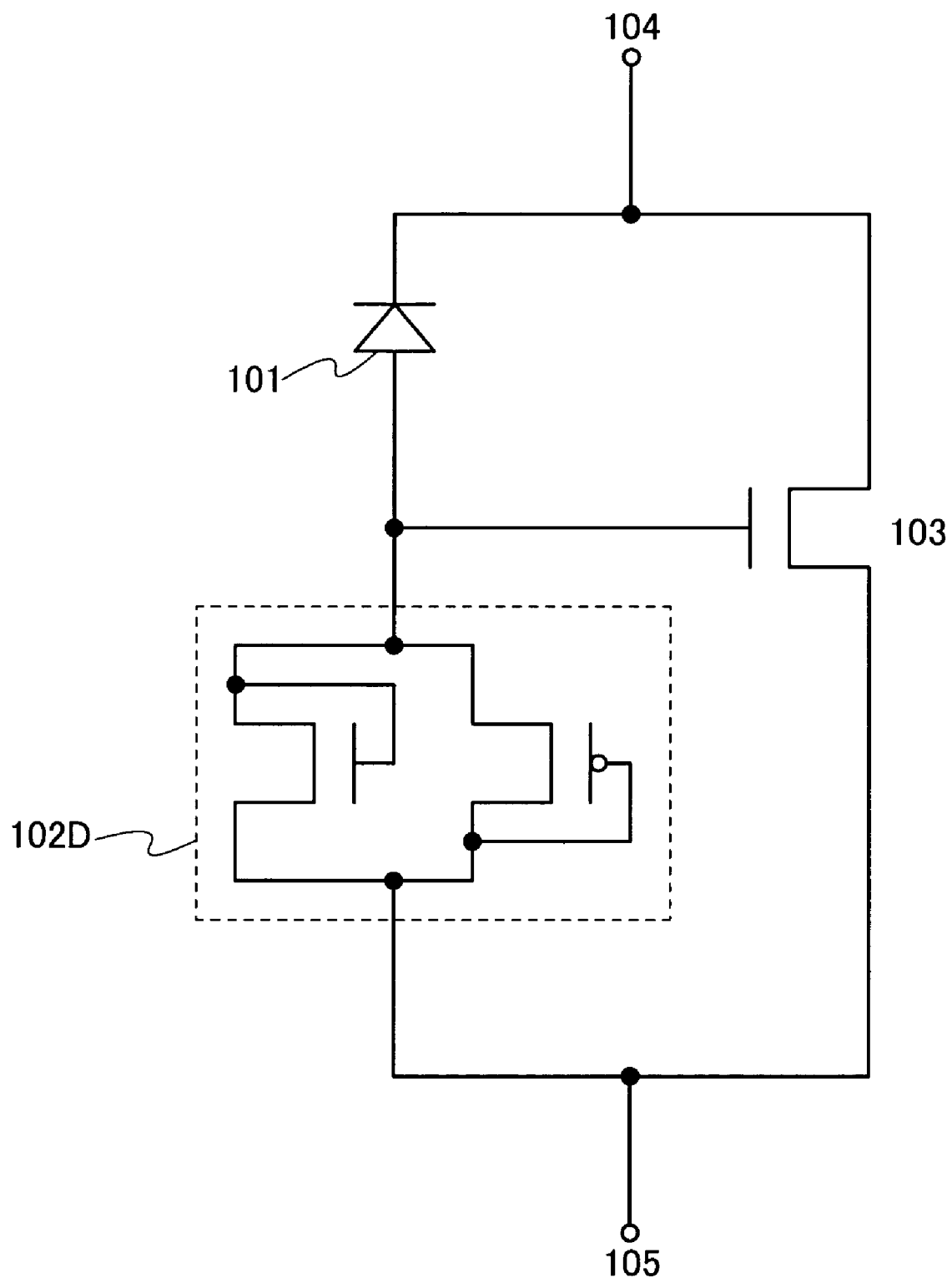
FIG. 6 illustrates a semiconductor device of the present invention.

Alternatively, a plurality of other elements included in the current-voltage conversion circuit 102A may be connected in series or in parallel. As an example, FIG. 6 shows a current-voltage conversion circuit 102D in which the diode-connected N-channel transistor in FIG. 1A and the diode-connected P-channel transistor in FIG. 5 are connected in parallel.

Similarly, the diode-connected N-channel transistor in FIG. 1A and the diode-connected P-channel transistor in FIG. 5 can be connected in series or in parallel by being combined with the resistor element shown in FIG. 4 or the like.

Figure 7A:
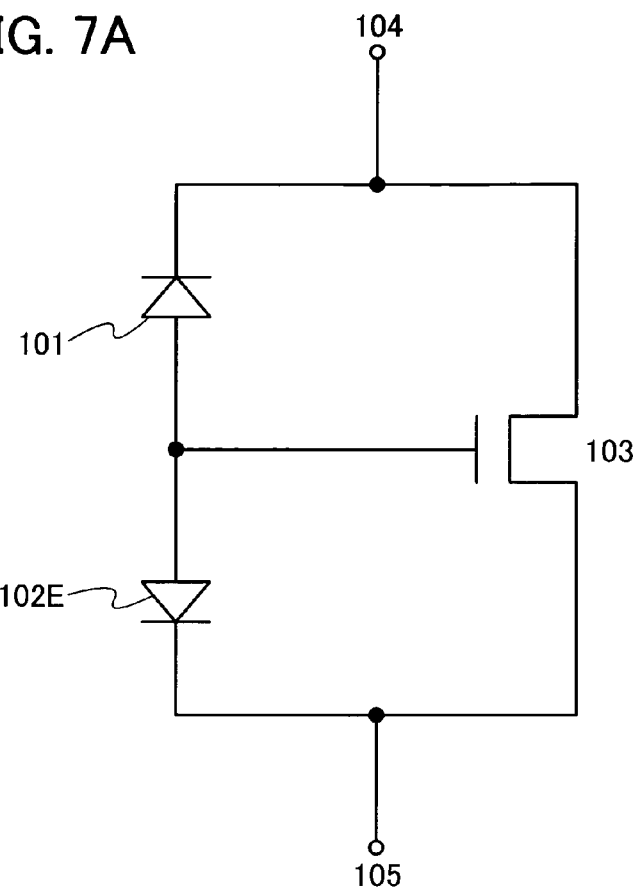
FIG. 7A illustrates a semiconductor device of the present invention and FIG. 7B illustrates characteristics of a diode included in the semiconductor device.
Figure 7B:
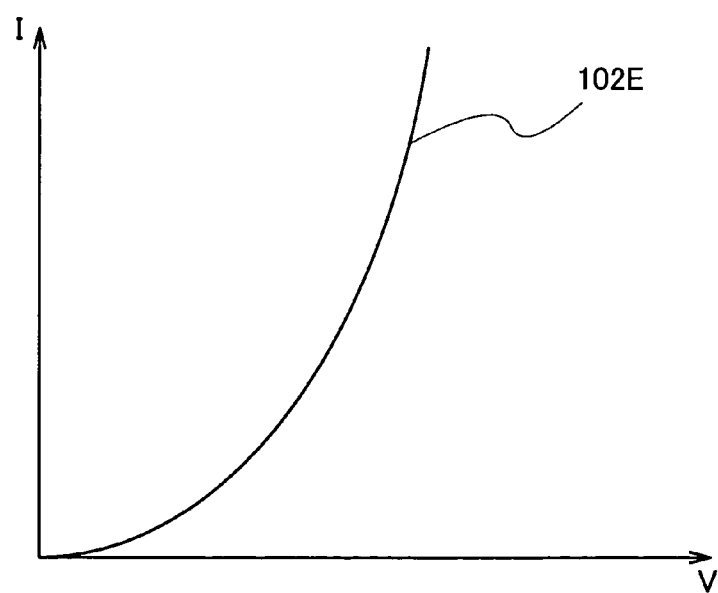

In addition, FIG. 7A shows the case where a diode 102E is used as an example of the current-voltage conversion circuit 102A, and FIG. 7B shows a graph of current characteristics in that case. For example, a PN diode, a PIN diode, a Schottky diode, an MIM (metal insulator metal) diode, an MIS (metal insulator semiconductor) diode, or the like can be used as the diode 102E.

By using part or all of a material or a layer included in the photoelectric conversion element 101, the diode 102E can also be formed. Thus, the number of process steps can be reduced.

Figure 14:
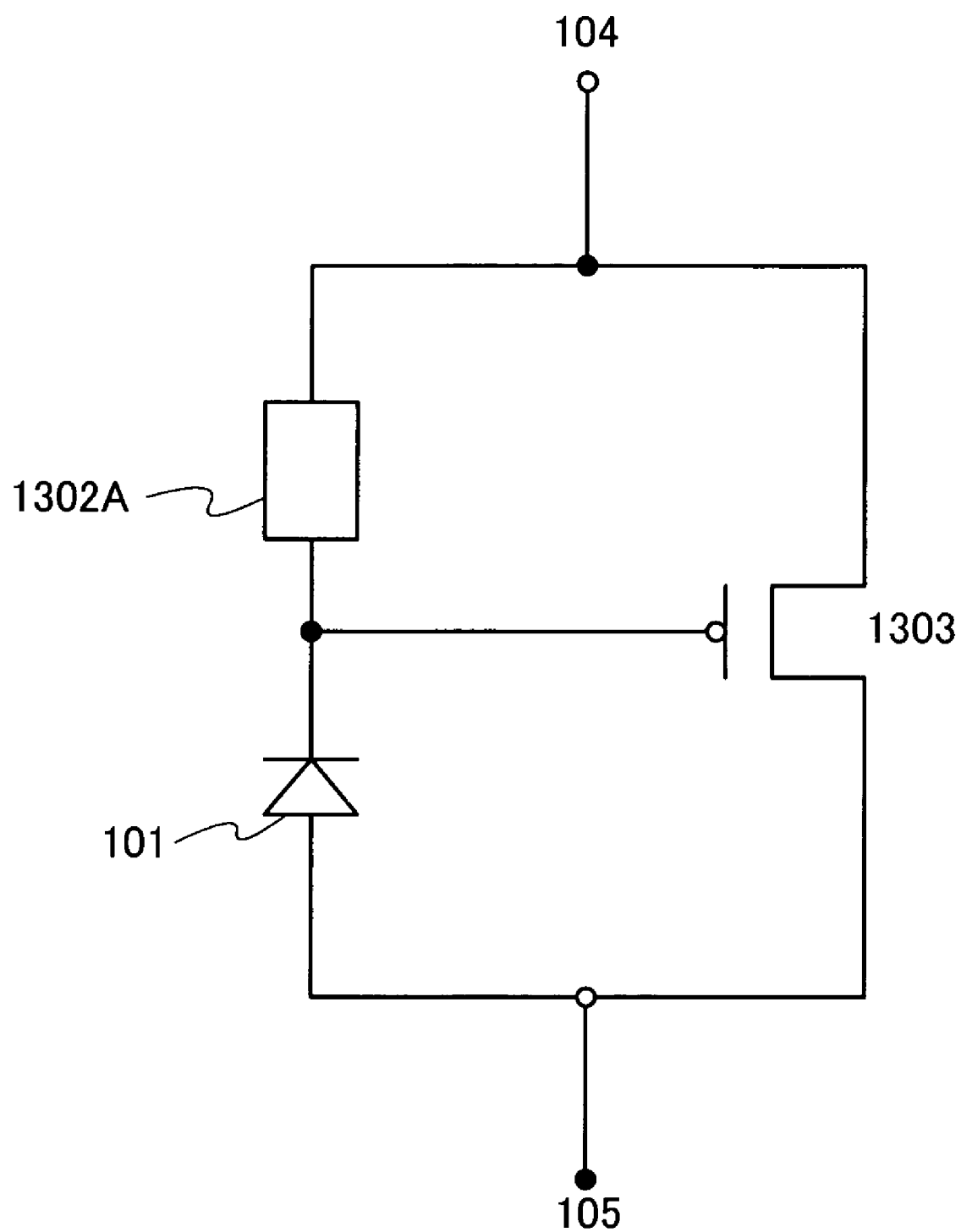
FIG. 14 illustrates a semiconductor device of the present invention.

Although the case where an N-channel transistor is used for the second circuit 103 is described in this embodiment mode, a P-channel transistor may be used for the second circuit 1303, as shown in FIG. 14. A current-voltage conversion circuit 1302A generates voltage in accordance with the current flowing to the photoelectric conversion element 101. In this case, in order to generate the voltage in accordance with the current flowing to the photoelectric conversion element 101 in the current-voltage conversion circuit 1302A, a first terminal of the current-voltage conversion circuit 1302A is connected to the first terminal 104 and the photoelectric conversion element 101 be connected to the second terminal 105.

Figure 15:
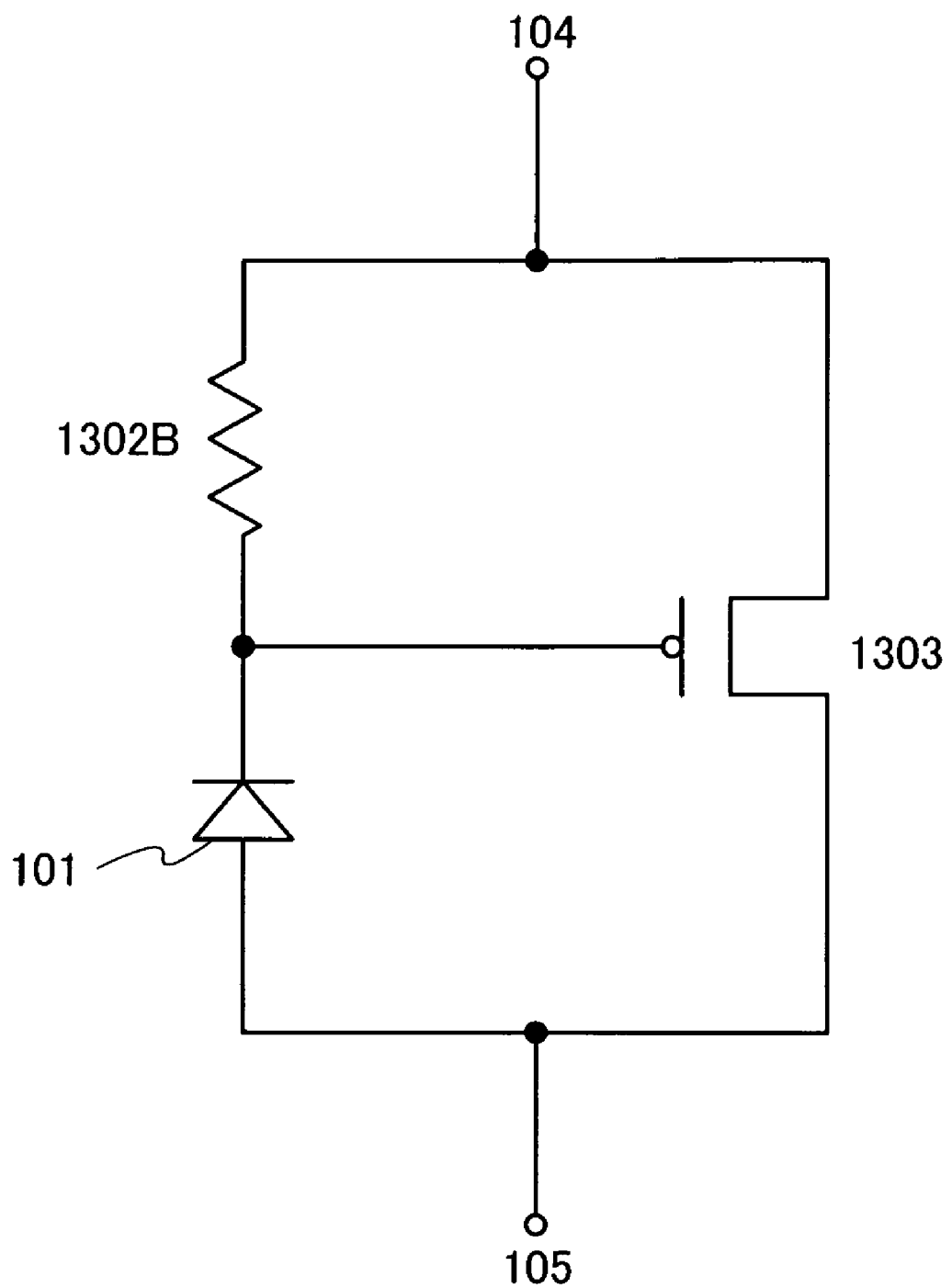
FIG. 15 illustrates a semiconductor device of the present invention.
Figure 16:
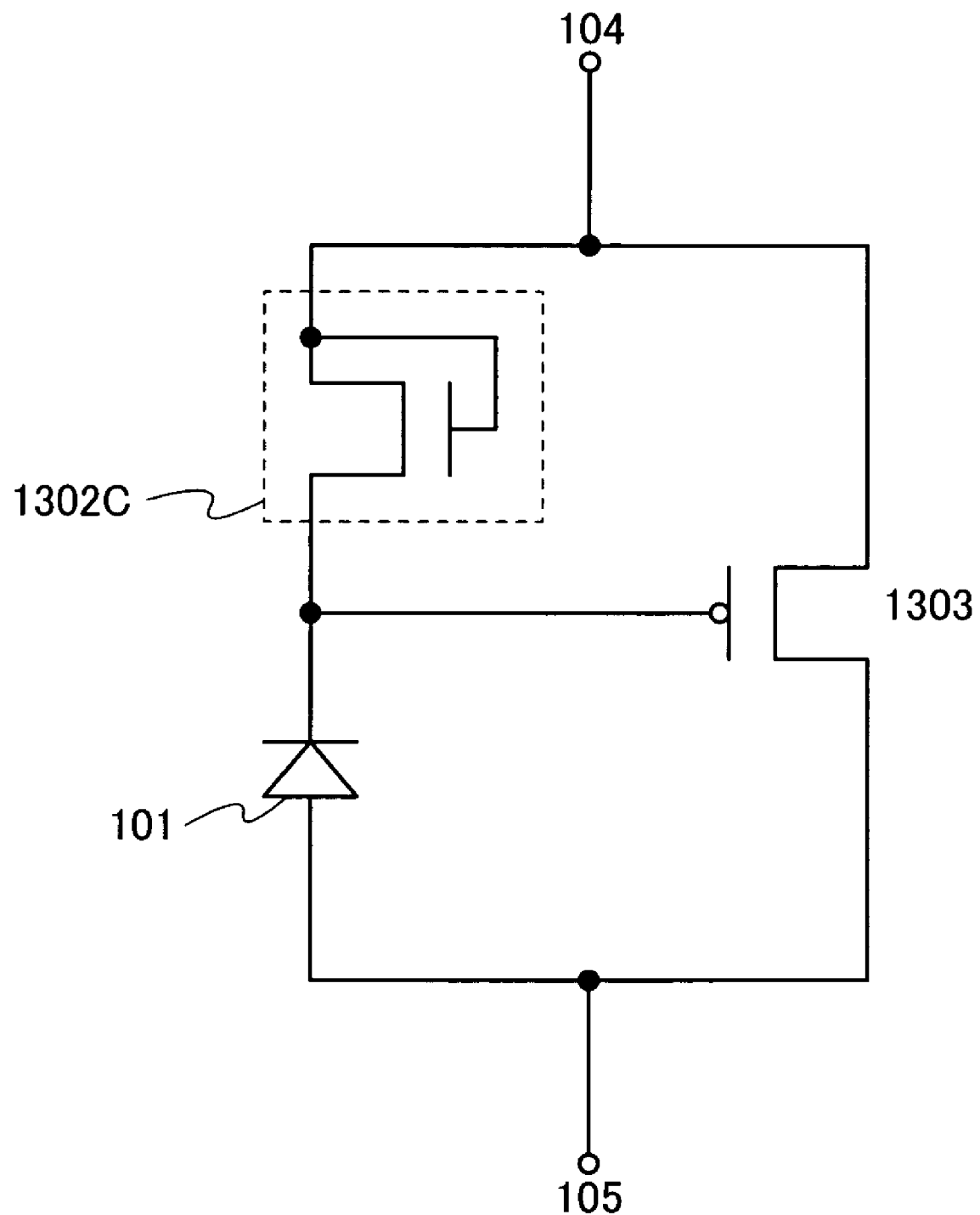
FIG. 16 illustrates a semiconductor device of the present invention.
Figure 17:
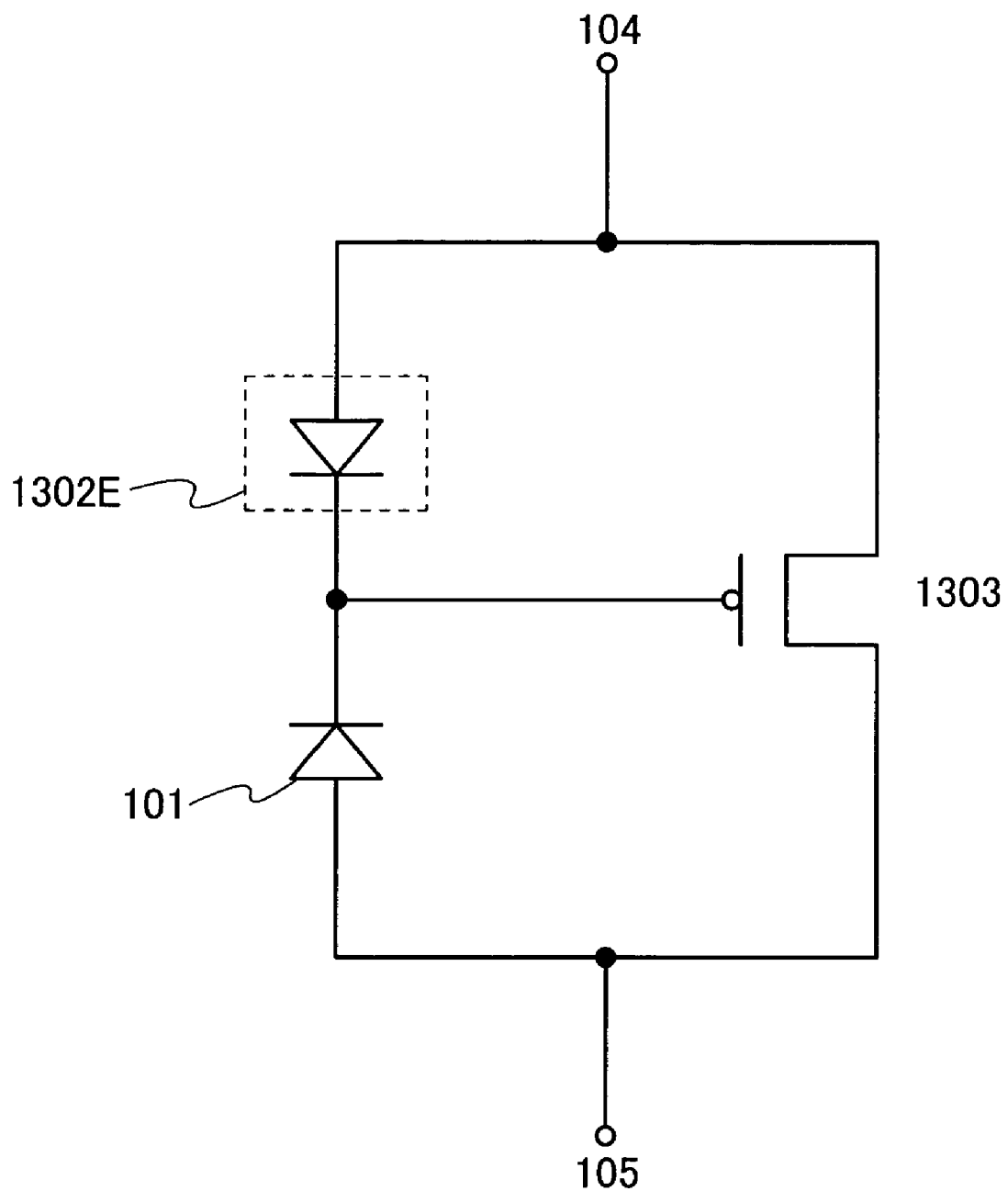
FIG. 17 illustrates a semiconductor device of the present invention.

In addition, various circuit can be used for the current-voltage conversion circuit 1302A, similarly to the current-voltage conversion circuit 102A. For example, a resistor element 1302B, a diode-connected N-channel transistor 1302C, and a diode 1302E can be used, as shown in FIGS. 15, 16, and 17, respectively. Needless to say, other circuits can be used, similarly to the case of the current-voltage conversion circuit 102A.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

This embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 3

The case where output current increases as intensity of light emitted to the photoelectric conversion element 101 increases is shown in Embodiment Modes 1 and 2. In this embodiment mode, the case where output current decreases as intensity of light emitted to the photoelectric conversion element 101 increases is shown.

Figure 8:
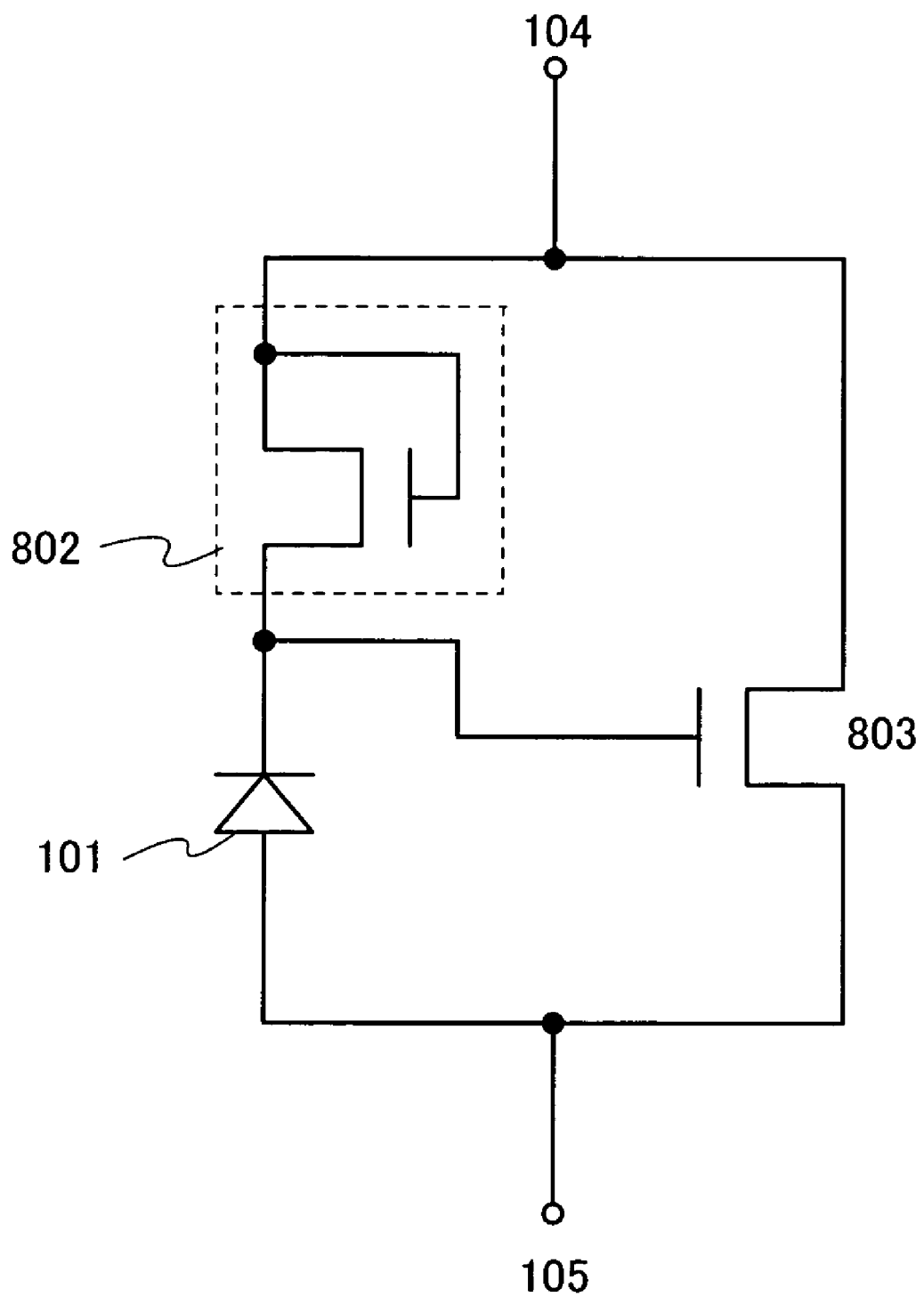
FIG. 8 illustrates a semiconductor device of the present invention.

FIG. 8 shows a diagram of this embodiment mode which corresponds to FIG. 1A. In FIG. 8, a connection between the photoelectric conversion element 101 and an N-channel transistor included in a first circuit 802 is different from that of FIG. 1A.

A semiconductor device shown in FIG. 8 includes the photoelectric conversion element 101, a first circuit 802, a second circuit 803, the first terminal 104, and the second terminal 105. The first circuit 802 is connected to the photoelectric conversion element 101 in series. In addition, the first circuit 802 has a function of generating voltage in accordance with input current, e.g., current flowing to the photoelectric conversion element 101. That is, the first circuit 802 has a function as a current-voltage conversion circuit. The second circuit 803 has a function of generating current in accordance with input voltage, e.g., voltage of the photoelectric conversion element 101 or the first circuit 802. That is, the second circuit 803 has a function as a voltage-current conversion circuit.

Usually, high voltage is supplied to the first terminal 104 and low voltage is supplied to the second terminal 105. Therefore, current usually flows from the first terminal 104 toward the second terminal 105. Note that the present invention is not limited to this, and reverse current can flow by applying reverse voltage.

FIG. 8 shows the case where a photodiode is used as an example of the photoelectric conversion element 101. A photodiode is often used under a reverse bias state. In FIG. 8, a cathode terminal of the photodiode is connected to the first circuit 802 and an anode terminal of the photodiode is connected to the second terminal 105. When the photodiode which is under a reverse bias state is irradiated with light, current flowing to the photodiode is changed. Therefore, by detecting the current flowing to the photodiode, illuminance can be detected.

Various elements can be used for the photoelectric conversion element 101. For example, a PN diode, a PIN diode, a Schottky diode, an MIS diode, or the like can be used.

In FIG. 8, the current flowing to the photoelectric conversion element 101 is converted into voltage using the first circuit 802 connected to the photoelectric conversion element 101 in series. In FIG. 8, a diode-connected N-channel transistor is used as an example of the first circuit 802. A gate (or a gate electrode) of the N-channel transistor included in the first circuit 802 in FIG. 8 is connected to the first terminal 104. A drain (or a drain electrode) of the N-channel transistor included in the first circuit 802 is connected to the first terminal 104. A source (or a source electrode) of the N-channel transistor included in the first circuit 802 is connected to the photoelectric conversion element 101. When the current flowing to the photoelectric conversion element 101 increases, voltage at opposite ends of the first circuit 802 also increases.

The voltage generated in the photoelectric conversion element 101 (or the first circuit 802) is supplied to the second circuit 803. The second circuit 803 outputs current in accordance with the voltage generated in the photoelectric conversion element 101 (or the first circuit 802). FIG. 8 shows the case where an N-channel transistor is used as an example of the second circuit 803. A gate (or a gate electrode) of the N-channel transistor included in the second circuit 803 in FIG. 8 is connected to the photoelectric conversion element 101 (or the first circuit 802). A source (or a source electrode) of the N-channel transistor included in the second circuit 803 is connected to the second terminal 105. A drain (or a drain electrode) of the N-channel transistor included in the second circuit 803 is connected to the first terminal 104. Therefore, when the current flowing to the photoelectric conversion element 101 increases, the voltage at the opposite ends of the first circuit 802 also increases and voltage at opposite ends of the photoelectric conversion element 101 decreases to a corresponding extent. Thus, gate-source voltage of the N-channel transistor included in the second circuit 803 decreases. Accordingly, drain-source current of the N-channel transistor included in the second circuit 803 decreases. That is, output current decreases as intensity of light emitted to the photoelectric conversion element 101 increases, and output current increases as intensity of light emitted to the photoelectric conversion element 101 decreases. That is, a signal is inverted to be amplified.

Here, current drive capability of the transistor included in the second circuit 803 is preferably high. This is because large current flows to the first terminal 104 and the second terminal 105 and the signal which is inverted in accordance with illuminance is further amplified when the transistor with high current drive capability is used. As a method for improving current drive capability of the transistor, for example, increasing the channel width W, decreasing the channel length L, and connecting a plurality of transistors in parallel (substantially, this is the same as increasing the channel width W) can be used.

Although the first circuit 802 and the second circuit 803 are connected to the same terminal (the first terminal 104), the terminal to which the first circuit 802 and the second circuit 803 are connected is not limited to this. Another terminal may be provided and the first circuit 802 and the second circuit 803 may be connected to different terminals. Note that the photoelectric conversion element 101 and the second circuit 803 are connected to the same terminal (the second terminal 105), the terminal to which the photoelectric conversion element 101 and the second circuit 803 are connected is not limited to this. Another terminal may be provided and the photoelectric conversion element 101 and the second circuit 803 may be connected to different terminals.

Current characteristics of the N-channel transistor included in the first circuit 802 are preferably similar to the current characteristics of the N-channel transistor included in the first circuit 102 in FIG. 1A. That is, the N-channel transistor included in the first circuit 802 preferably has the current characteristics in which current is small when Vgs=0 V. Accordingly, even when illuminance of light emitted to the photoelectric conversion element 101 is low, i.e., even when the current flowing to the photoelectric conversion element 101 is small, the current can be detected.

The threshold voltage of the N-channel transistor included in the first circuit 802 is preferably 0 V or higher. That is, the N-channel transistor included in the first circuit 802 is preferably an enhancement transistor.

Current characteristics of the N-channel transistor included in the second circuit 803 are preferably similar to the current characteristics of the N-channel transistor included in the second circuit 103 in FIG. 1A. That is, the N-channel transistor included in the second circuit 803 preferably has the current characteristics in which current is large when Vgs=0 V. Accordingly, even when voltage supplied to opposite ends of the second circuit 803, i.e., voltage supplied between the first terminal 104 and the second terminal 105 is small, large current can flow.

The threshold voltage of the N-channel transistor included in the second circuit 803 is preferably 0 V or lower. That is, the N-channel transistor included in the second circuit 803 is preferably a depletion transistor.

When the N-channel transistor included in the first circuit 802 and the N-channel transistor included in the second circuit 803 have different threshold voltages in this manner, detecting of low illuminance and an operation at low voltage can be realized. Note that the threshold voltage of the N-channel transistor included in the first circuit 802 is preferably higher that that of the N-channel transistor included in the second circuit 803. More preferably, difference between the threshold voltage of the N-channel transistor included in the first circuit 802 and the threshold voltage of the N-channel transistor included in the second circuit 803 is 1V or higher. More preferably, the difference between the threshold voltage of the N-channel transistor included in the first circuit 802 and the threshold voltage of the N-channel transistor included in the second circuit 803 is 3V or higher. Alternatively, the N-channel transistor included in the first circuit 802 and the N-channel transistor included in the second circuit 803 preferably have different current characteristics. For example, it is preferable that one of the N-channel transistor included in the first circuit 802 and the N-channel transistor included in the second circuit 803 be an enhancement transistor and the other thereof be a depletion transistor.

In order to make the N-channel transistor included in the first circuit 802 and the N-channel transistor included in the second circuit 803 have different threshold voltages in this manner, channels are doped with different impurities. When the N-channel transistor included in the first circuit 802 is channel-doped with P-type impurities (e.g., boron or gallium) using a mask (a reticle), the N-channel transistor included in the first circuit 802 can be used as an enhancement transistor. Alternatively, when the N-channel transistor included in the second circuit 803 is channel-doped with N-type impurities (e.g., phosphorus or arsenic), the N-channel transistor included in the second circuit 803 can be used as a depletion transistor.

When transistors having the same conductivity type are used for the first circuit 802 and the second circuit 803 as shown in FIG. 8, a relationship between light and the current becomes closer to a proportional relationship (note that a gradient is negative). Therefore, signal processing of the amount of light irradiation can be easily performed.

Although the number of N-channel transistors included in the first circuit 802 is one in FIG. 8, the number of N-channel transistors included in the first circuit 802 is not limited to this. A plurality of N-channel transistors may be connected in series or in parallel.

Similarly, although the number of N-channel transistors included in the second circuit 803 is one in FIG. 8, the number of N-channel transistors included in the second circuit 803 is not limited to this. A plurality of N-channel transistors may be connected in series or in parallel.

Figure 18:
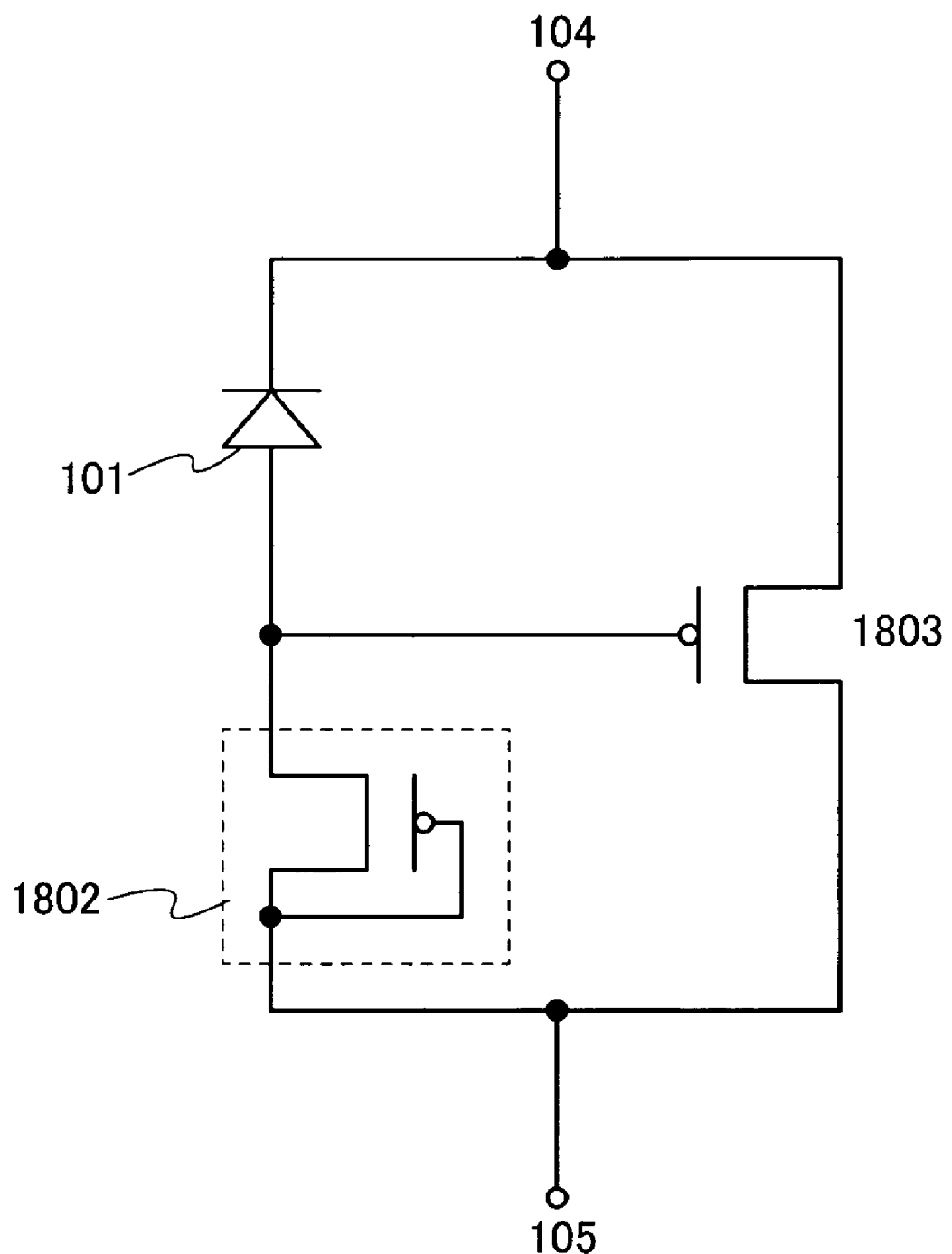
FIG. 18 illustrates a semiconductor device of the present invention.

Although the case where an N-channel transistor is used for the second circuit 803 is described in this embodiment mode, a P-channel transistor may be used for a second circuit 1803, as shown in FIG. 18. Note that in the case where a P-channel transistor is used for the second circuit 1803, similarly to the above-described embodiment modes, arrangement, i.e., a connection relationship of the first circuit and the photoelectric conversion element in the case of using the N-channel transistor is reversed and the photoelectric conversion element 101 and the first circuit 1802 are connected in series by providing the photoelectric conversion element 101 on a first terminal 104 side and providing the first circuit 1802 on a second terminal 105 side. Note also that FIG. 18 shows the case where a diode-connected P-channel transistor is used for the first circuit 1802.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

This embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 4

In Embodiment Mode 2, the case where various structures are used for the first circuit 102 in Embodiment Mode 1 is described. Meanwhile, in Embodiment Mode 3, the case where a connection between the first circuit 102 and the photoelectric conversion element 101 is different from that of Embodiment Mode 1 is described. Thus, the case where various structures are used for the first circuit 802 in Embodiment Mode 3 is also described in this embodiment mode.

Figure 9:
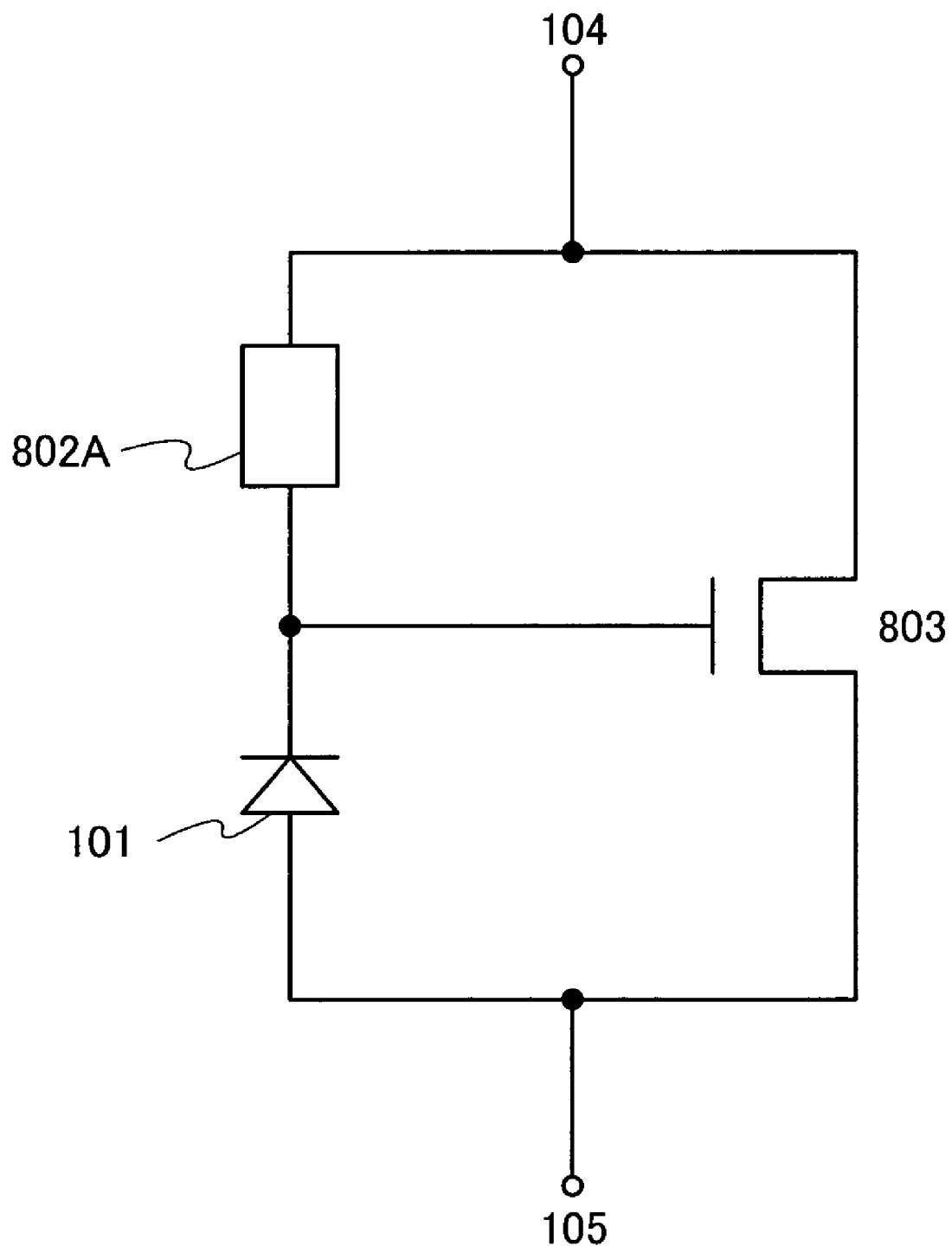
FIG. 9 illustrates a semiconductor device of the present invention.

Connection relationships of the case where a photodiode is used as an example of the photoelectric conversion element 101 are described below. In FIG. 9, a cathode terminal of the photodiode is connected to a first terminal of a current-voltage conversion circuit 802A and an anode terminal of the photodiode is connected to the second terminal 105. The first terminal of the current-voltage conversion circuit 802A is connected to the gate (or the gate electrode) of the N-channel transistor included in the second circuit 803. A second terminal of the current-voltage conversion circuit 802A is connected to the first terminal 104.

The current flowing to the photoelectric conversion element 101 is converted into voltage using the current-voltage conversion circuit 802A connected to the photoelectric conversion element 101 in series. When the current flowing to the photoelectric conversion element 101 increases, voltage at opposite ends of the current-voltage conversion circuit 802A also increases.

The voltage generated in the photoelectric conversion element 101 (or the current-voltage conversion circuit 802A) is supplied to the second circuit 803. The second circuit 803 outputs current in accordance with the voltage generated in the photoelectric conversion element 101 (or the current-voltage conversion circuit 802A). FIG. 9 shows the case where an N-channel transistor is used as an example of the second circuit 803, similarly to FIG. 8. In the second circuit 803 in FIG. 9, a gate (or a gate electrode) of the N-channel transistor is connected to the photoelectric conversion element 101 (or the current-voltage conversion circuit 802A). A source (or a source electrode) of the N-channel transistor included in the second circuit 803 is connected to the second terminal 105. A drain (or a drain electrode) of the N-channel transistor included in the second circuit 803 is connected to the first terminal 104. Therefore, when the current flowing to the photoelectric conversion element 101 increases, the voltage at the opposite ends of the current-voltage conversion circuit 802A also increases and voltage at opposite ends of the photoelectric conversion element 101 decreases to a corresponding extent. Thus, gate-source voltage of the N-channel transistor included in the second circuit 803 decreases. Accordingly, drain-source current of the N-channel transistor included in the second circuit 803 decreases. That is, output current decreases as intensity of light emitted to the photoelectric conversion element 101 increases, and output current increases as intensity of light emitted to the photoelectric conversion element 101 decreases. That is, a signal is inverted so that the signal is amplified.

Although the current-voltage conversion circuit 802A and the second circuit 803 are connected to the same terminal (the first terminal 104), the terminal to which the current-voltage conversion circuit 802A and the second circuit 803 are connected is not limited to this. Another terminal may be provided and the current-voltage conversion circuit 802A and the second circuit 803 may be connected to different terminals.

Figure 10:
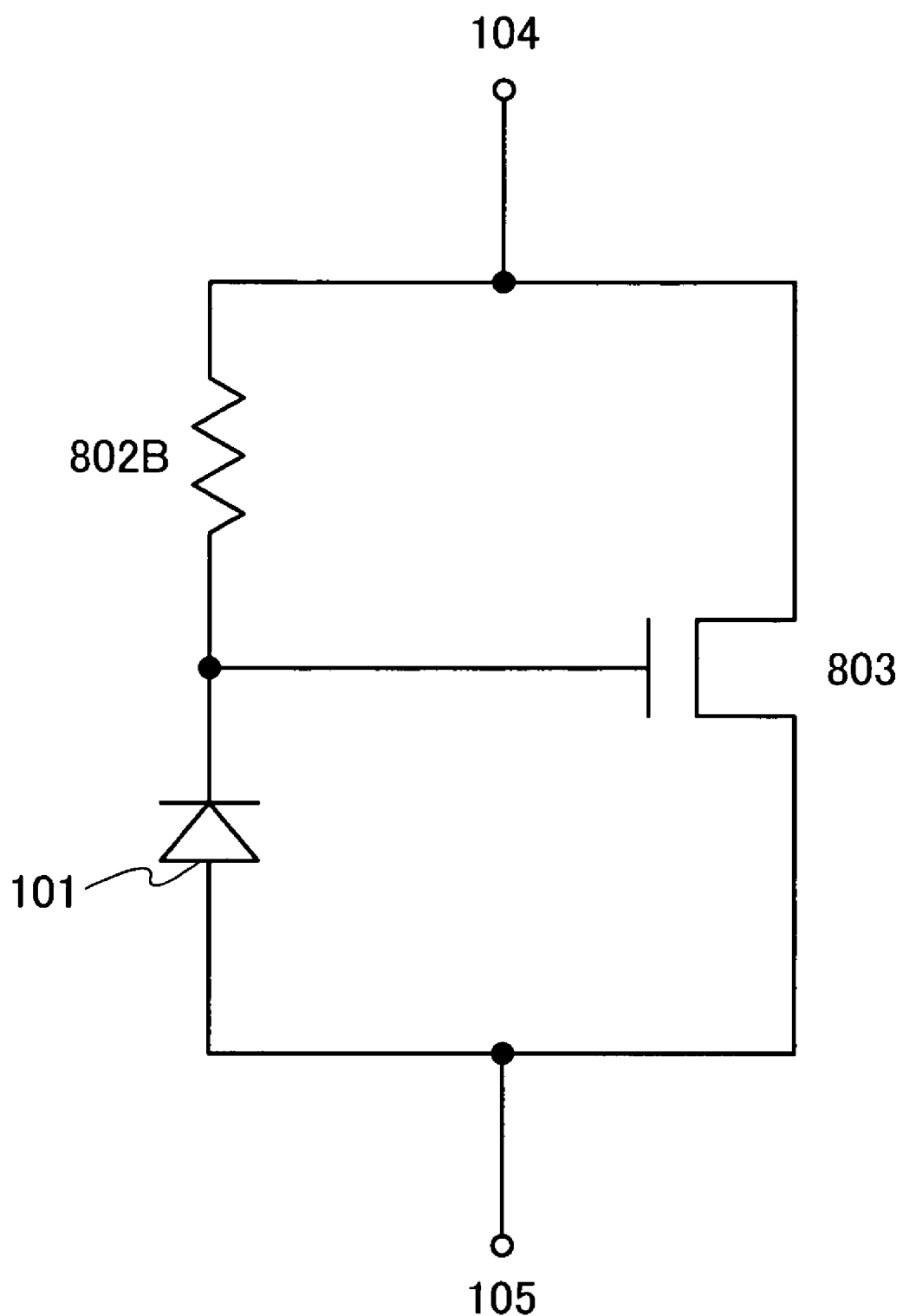
FIG. 10 illustrates a semiconductor device of the present invention.

Various circuits can be used as an example of the current-voltage conversion circuit 802A. FIG. 10 shows the case where a resistor element 802B is used as an example of the current-voltage conversion circuit 802A. Since current of the resistor element 802B is 0 when voltage is not applied to opposite ends of the resistor element 802B, it is conceivable that the resistor element 802B is a kind of an enhancement resistor. The resistor element 802B is preferably formed using the same layer as a semiconductor layer of the transistor. Thus, increase in the number of process steps can be prevented.

Figure 11:
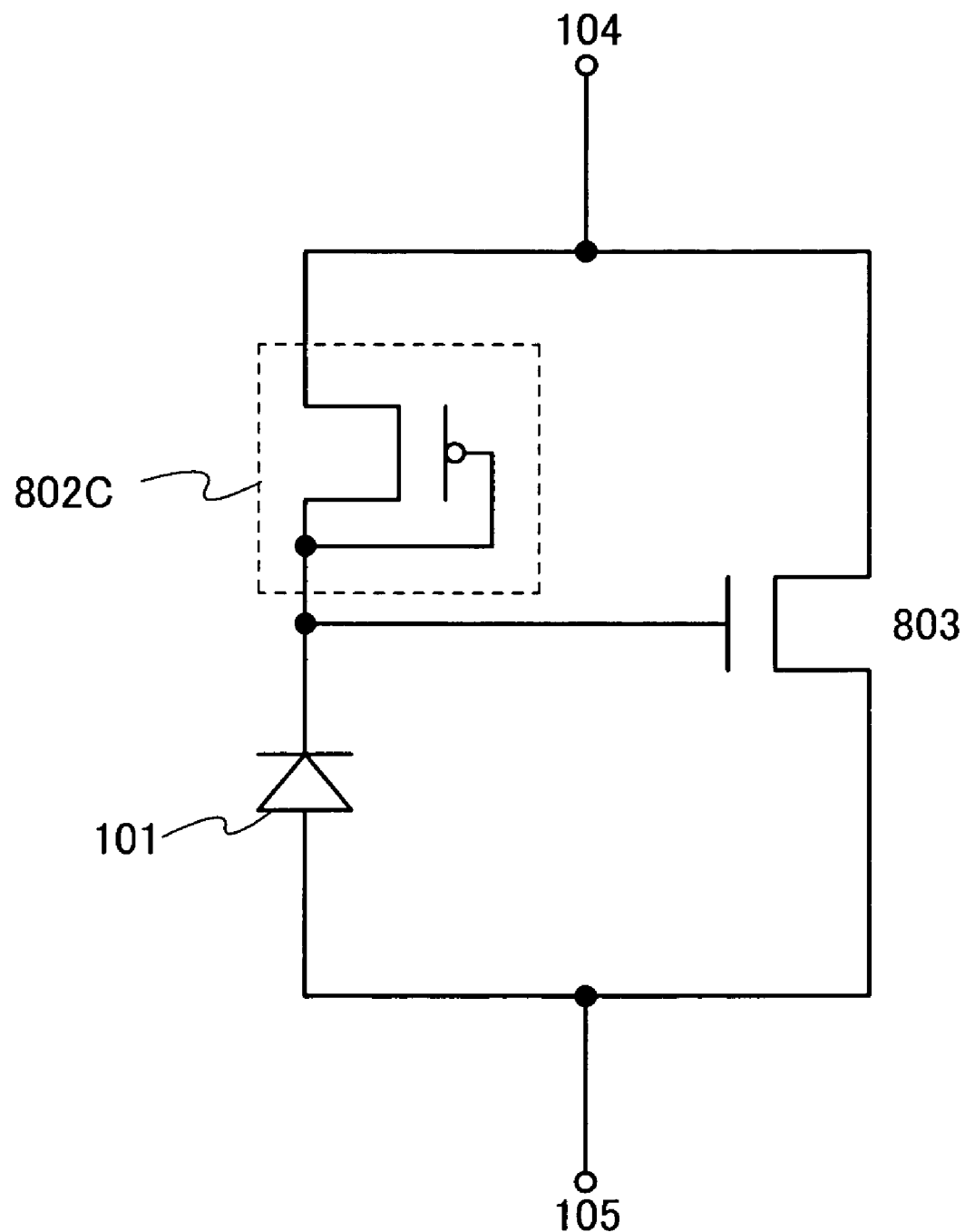
FIG. 11 illustrates a semiconductor device of the present invention.

FIG. 11 shows the case where a diode-connected P-channel transistor 802C is used as an example of the current-voltage conversion circuit 802A. A connection portion of a gate (or a gate electrode) of the P-channel transistor 802C in FIG. 11 is different from that of FIG. 8. This is because polarity is different in FIGS. 11 and 8. A drain (or a drain electrode) of the P-channel transistor 802C is connected to the photoelectric conversion element 101. A source (or a source electrode) of the P-channel transistor 802C is connected to the first terminal 104. The gate (or the gate electrode) of the P-channel transistor 802C is connected to the photoelectric conversion element 101.

When the P-channel transistor 802C is used as an example of the current-voltage conversion circuit 802A, there is an advantage that difference between the threshold voltage of the transistor included in the current-voltage conversion circuit 802A and the threshold voltage of the transistor included in the second circuit 803 is easily made. Alternatively, there is an advantage that the transistor included in the current-voltage conversion circuit 802A is easily used as an enhancement transistor. Further alternatively, there is an advantage that the transistor included in the second circuit 803 is easily used as a depletion transistor. This can be realized when the transistor included in the current-voltage conversion circuit 802A and the transistor included in the second circuit 803 are channel-doped with N-type impurities (e.g., phosphorus or arsenic). Since the transistor included in the current-voltage conversion circuit 802A and the transistor included in the second circuit 803 are doped with impurities having the same conductivity type, it is not necessary to perform doping separately. Therefore, a mask (a reticle) is not necessary, so that the number of process steps can be reduced. That is, when the transistor included in the current-voltage conversion circuit 802A and the transistor included in the second circuit 803 have opposite conductivity types of channels, the threshold voltage can be easily controlled.

Although the number of P-channel transistors 802C is one in FIG. 11, the number of P-channel transistors is not limited to this. A plurality of P-channel transistors may be connected in series or in parallel.

Alternatively, a plurality of other elements included in the current-voltage conversion circuit 802A may be connected in series or in parallel. That is, as the current-voltage conversion circuit 802A, a diode-connected P-channel transistor and a diode-connected N-channel transistor may be connected in parallel.

Similarly, a diode-connected P-channel transistor and a diode-connected N-channel transistor can be connected in series or in parallel by being combined with the resistor element shown in FIG. 10 or the like.

Figure 12:
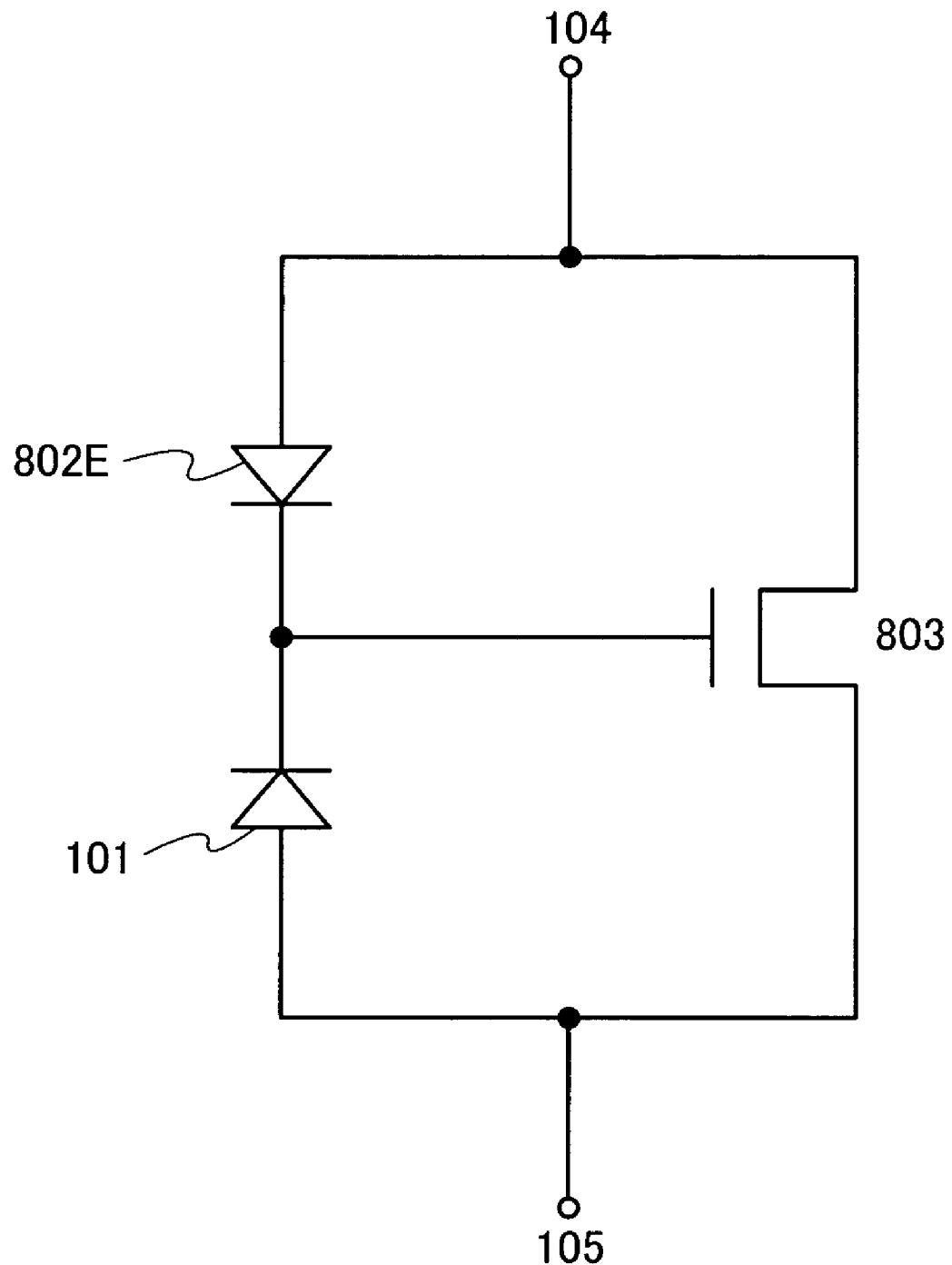
FIG. 12 illustrates a semiconductor device of the present invention.

In addition, FIG. 12 shows the case where a diode 802E is used as an example of the current-voltage conversion circuit 802A. A graph of current characteristics in this case is similar to that of FIG. 7B. A PN diode, a PIN diode, a Schottky diode, an MIM (metal insulator metal) diode, an MIS (metal insulator semiconductor) diode, or the like can be used as the diode 802E.

By using part or all of a material or a layer included in the photoelectric conversion element 101, the diode 802E can also be formed. Thus, the number of process steps can be reduced.

Figure 19:
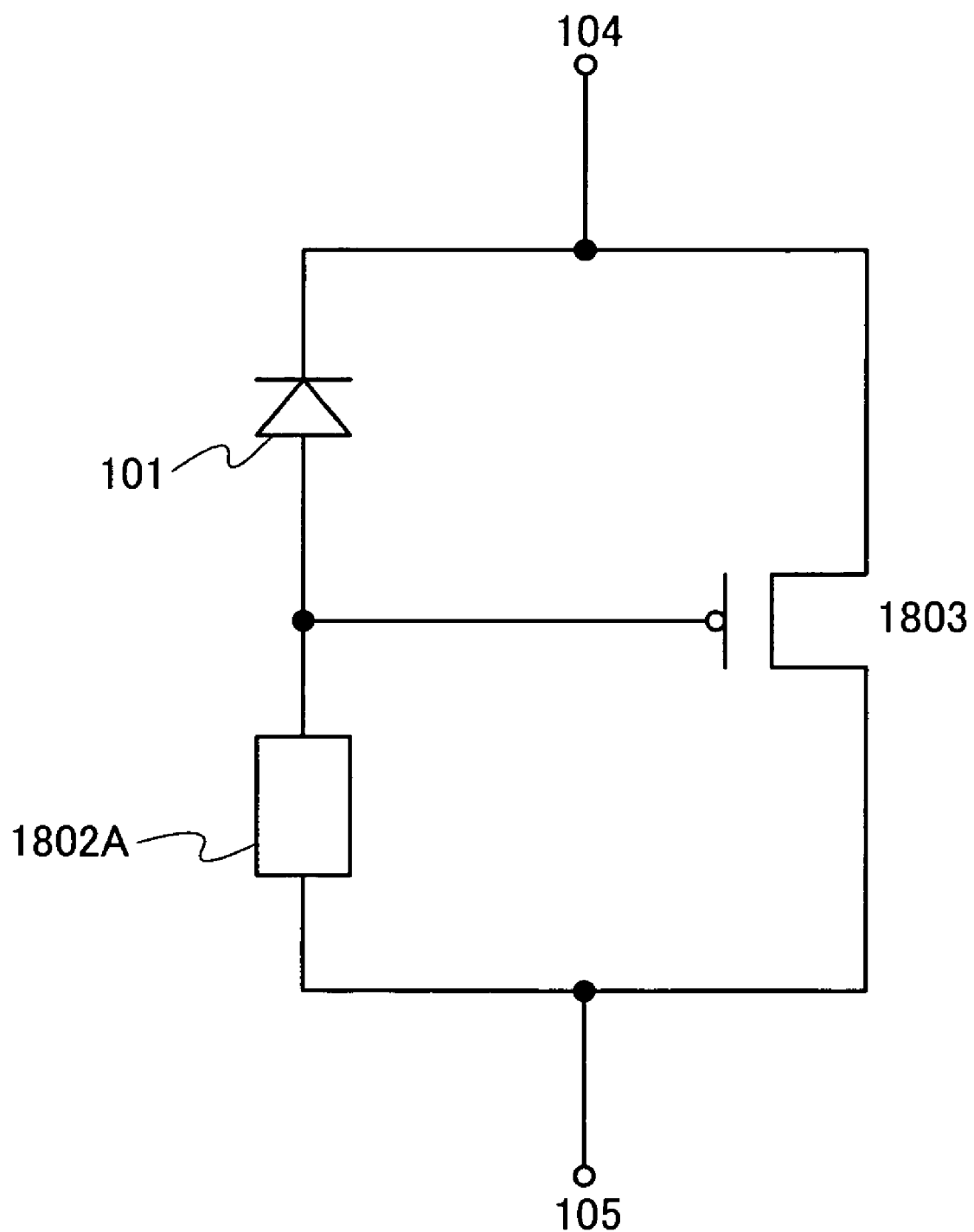
FIG. 19 illustrates a semiconductor device of the present invention.

Although the case where an N-channel transistor is used for the second circuit 803 is described in this embodiment mode, a P-channel transistor may be used for the second circuit 1803, as shown in FIG. 19. Note that in the case where a P-channel transistor is used for the second circuit 1803, similarly to the above-described embodiment modes, arrangement, i.e., a connection relationship of the current-voltage conversion circuit and the photoelectric conversion element in the case of using the N-channel transistor is reversed and the photoelectric conversion element 101 and a current-voltage conversion circuit 1802A are connected in series by providing the photoelectric conversion element 101 on the first terminal 104 side and providing the current-voltage conversion circuit 1802A on the second terminal 105 side. Further, various circuits can be used for the current-voltage conversion circuit 1802A, similarly to the case of the current-voltage conversion circuit 802A.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

This embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 5

Applications of the semiconductor devices described in Embodiment Modes 1 to 4 are described with reference to FIGS. 20A and 20B. The semiconductor device shown in FIG. 20A includes photoelectric conversion devices 2001A and 2001B, resistor elements 2002A and 2002B, and a power supply 2005.

Note that the photoelectric conversion devices 2001A and 2001B correspond to the semiconductor devices described in Embodiment Modes 1 to 4.

A first terminal 104A of the photoelectric conversion device 2001A is connected to one of electrodes of the power supply 2005. A second terminal 105A of the photoelectric conversion device 2001A is connected to the other of the electrodes of the power supply 2005 through the resistor element 2002A. Note that current obtained from the photoelectric conversion device 2001A is converted into voltage by the resistor element 2002A and is output. For example, the current obtained from the photoelectric conversion device 2001A may be output as voltage from the second terminal 105A. Here, when the current obtained from the photoelectric conversion device 2001A is output as voltage using the resistor element 2002A, illuminance is detected.

In addition, the one of the electrodes of the power supply 2005 is also connected to the first terminal 104B of the photoelectric conversion device 2001B. The second terminal 105B of the photoelectric conversion device 2001B is connected to the other of the electrodes of the power supply 2005 through the resistor element 2002B. Note that also in the photoelectric conversion device 2001B, current obtained from the photoelectric conversion device 2001B is converted into voltage by the resistor element 2002B and is output. For example, the current obtained from the photoelectric conversion device 2001B may be output as voltage from the second terminal 105B. Here, when the current obtained from the photoelectric conversion device 2001B is output as voltage using the resistor element 2002B, illuminance is detected.

The photoelectric conversion device 2001A and the photoelectric conversion device 2001B are not necessarily the same, and what kind of structure to be used for the photoelectric conversion device 2001A and the photoelectric conversion device 2001B is selected as appropriate depending on an intended use. For example, when a photoelectric conversion device, which is particularly superior in detecting low illuminance, is used for one of the photoelectric conversion device 2001A and the photoelectric conversion device 2001B, a semiconductor device, which is superior in detecting low illuminance and can detect a wide range of illuminance can be obtained.

Further, as described in the above-described embodiment mode, a pressure sensor element (e.g., an element which converts pressure into an electron), a temperature sensor element (e.g., an element which converts temperature into an electron), an acceleration sensor element (e.g., an element which converts acceleration into an electron), a hardness sensor element (e.g., an element which converts hardness into an electron), a sound volume sensor element (e.g., an element which converts sound into an electron), or the like can be used instead of a photoelectric conversion element included in the photoelectric conversion device. Therefore, one of the photoelectric conversion device 2001A and the photoelectric conversion device 2001B may be a photoelectric conversion device including a photoelectric conversion element and the other thereof may be a conversion device including another element. By using such a structure, both illuminance and another external environment can be detected.

Thus, each of the photoelectric conversion device 2001A and the photoelectric conversion device 2001B does not necessarily have a function of detecting illuminance.

Figure 20A:
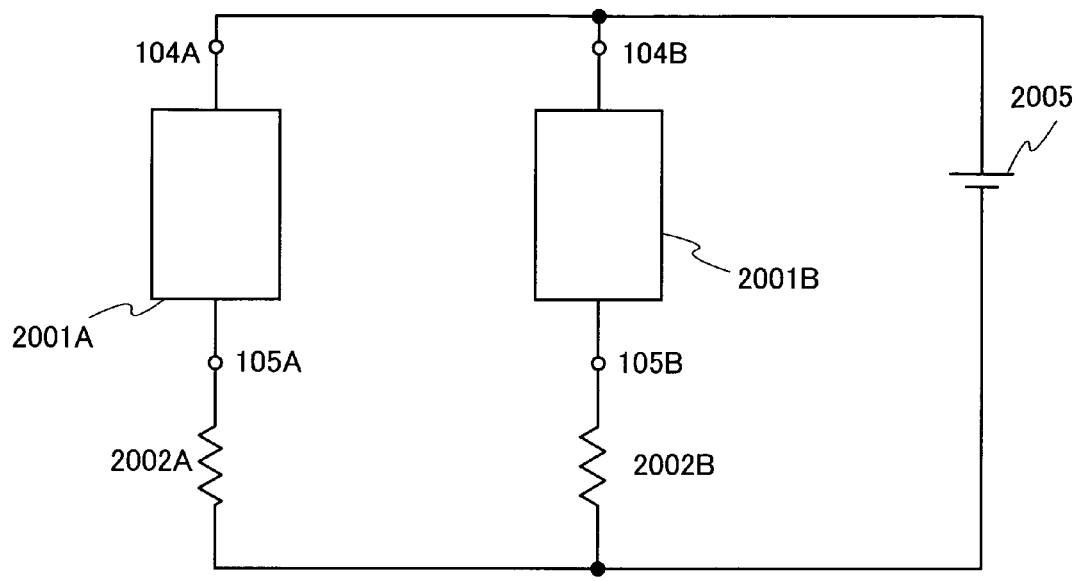
FIGS. 20A and 20B each illustrate a semiconductor device of the present invention.
Figure 20B:
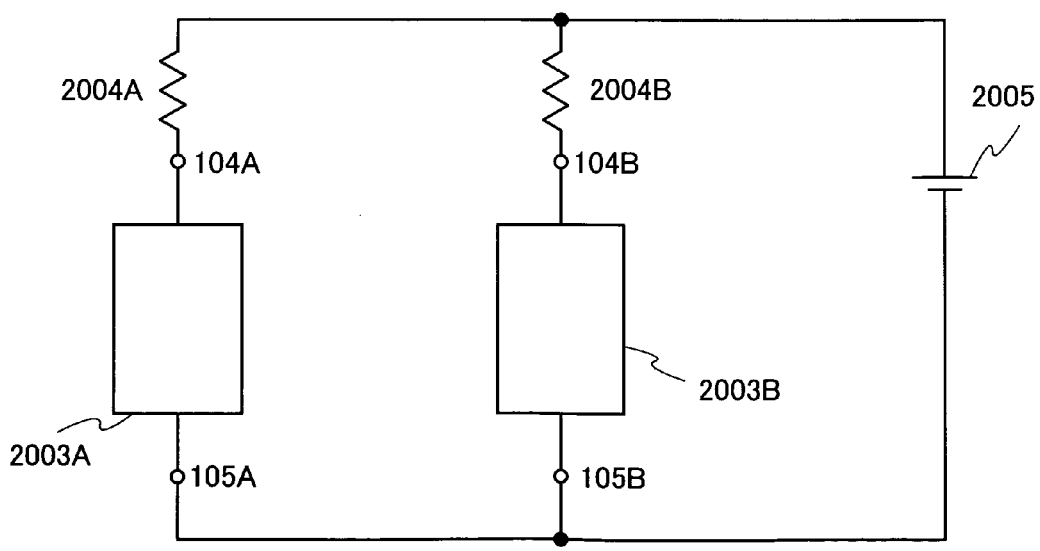

Furthermore, as long as the photoelectric conversion device and the resistor element in FIG. 20A are connected in series, the photoelectric conversion device and the resistor may be connected in reverse to the way they are connected in FIG. 20A, as shown in FIG. 20B. Photoelectric conversion devices 2003A and 2003B in FIG. 20B correspond to the semiconductor devices described in Embodiment Modes 1 to 4, similarly to the case of the photoelectric conversion devices 2001A and 2001B in FIG. 20A.

The first terminal 104A of the photoelectric conversion device 2003A is connected to one of electrodes of the power supply 2005 through a resistor element 2004A. The second terminal 105A of the photoelectric conversion device 2003A is connected to the other of the electrodes of the power supply 2005. Note that current obtained from the photoelectric conversion device 2003A is converted into voltage by the resistor element 2004A and is output. For example, the current obtained from the photoelectric conversion device 2003A may be output as voltage from the first terminal 104A. Here, when the current obtained from the photoelectric conversion device 2003A is output as voltage using the resistor element 2004A, illuminance is detected.

In addition, the first terminal 104B of the photoelectric conversion device 2003B is also connected to the one of the electrodes of the power supply 2005 through a resistor element 2004B. The second terminal 105B of the photoelectric conversion device 2003B is connected to the other of the electrodes of the power supply 2005. Note that current obtained from the photoelectric conversion device 2003B is converted into voltage by the resistor element 2004B and is output. For example, the current obtained from the photoelectric conversion device 2003B may be output as voltage from the first terminal 104B. Here, when the current obtained from the photoelectric conversion device 2003B is output as voltage using the resistor element 2004B, illuminance is detected.

Similarly to the photoelectric conversion device 2001A and the photoelectric conversion device 2001B, each of the photoelectric conversion device 2003A and the photoelectric conversion device 2003B is not necessarily a photoelectric conversion device, and may be a conversion device having another element.

In addition, although FIGS. 20A and 20B each show the case where a semiconductor device in which two sets of the photoelectric conversion device and the resistor element connected in series are connected in parallel, the number of parallel connections may be two or more, or one. Note that a switch may be connected to the photoelectric conversion device 2001A, the resistor element 2002A, the photoelectric conversion device 2001B, the resistor element 2002B, the photoelectric conversion device 2003A, the resistor element 2004A, the photoelectric conversion device 2003B, the resistor element 2004B, or the like in series. Output of signals can be switched by on/off of this switch. Further, when there is a photoelectric conversion device which is desired not to be operated, power consumption can be reduced by turning off this switch.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

This embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 6

Figure 21A:
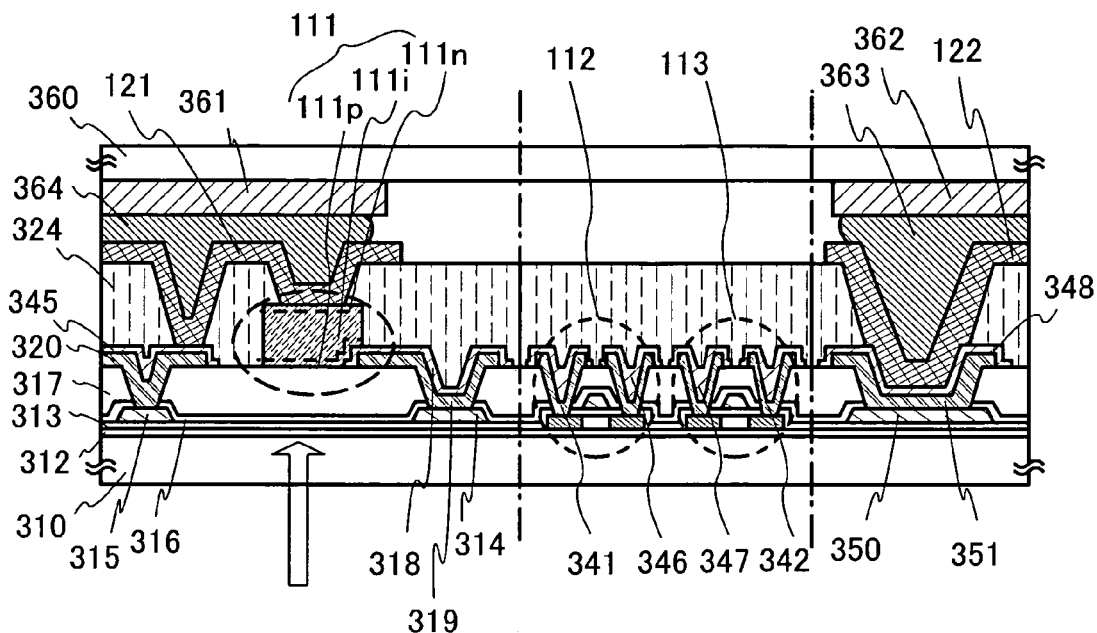
FIGS. 21A and 21B are partial cross-sectional views each illustrating a semiconductor device of the present invention.
Figure 21B:
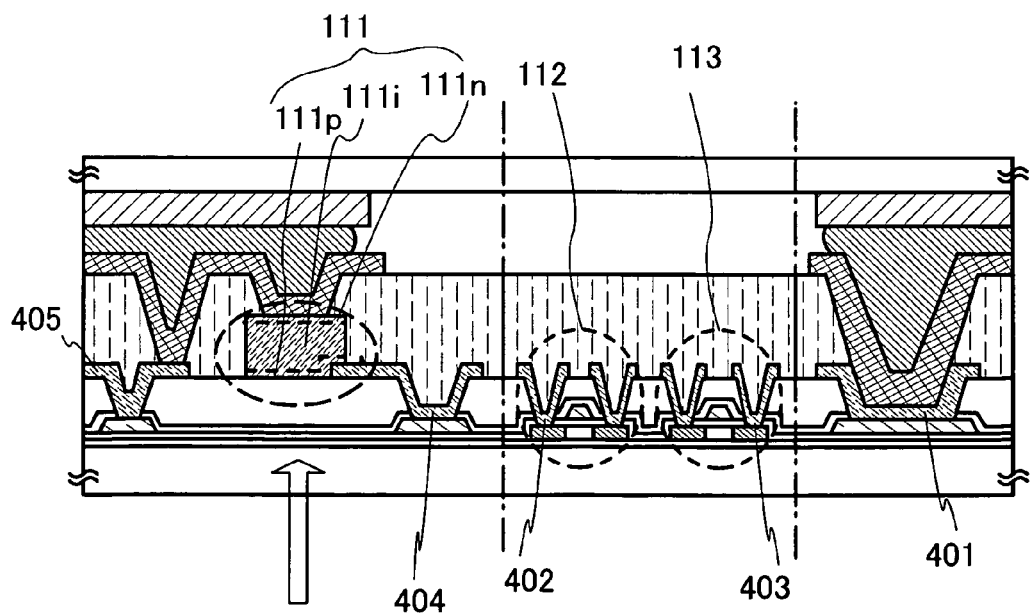

FIGS. 21A and 21B each show a partial cross-sectional view of a structural example of the semiconductor device shown in FIG. 1A. Note that FIGS. 21A and 21B each show a partial cross-sectional view of the case where an n-channel thin film transistor 112 is used for the first circuit 102 in FIG. 1A and an n-channel thin film transistor 113 is used for the second circuit 103 in FIG. 1A. In addition, the first terminal 104 in FIG. 1A corresponds to a terminal 121 and the second terminal 105 in FIG. 1A corresponds to a terminal 122.

In FIG. 21A, a reference numeral 310 denotes a substrate; a reference numeral 312 denotes a base insulating film; and a reference numeral 313 denotes a gate insulating film. Since light to be detected passes through the substrate 310, the base insulating film 312, and the gate insulating film 313, materials having high light transmitting properties are preferably used for materials of all of them.

The photoelectric conversion element 101 in FIG. 1A includes a wiring 319, a protective electrode 318, a photoelectric conversion layer 111, and the terminal 121 in FIG. 21A. Note that the photoelectric conversion layer 111 includes a p-type semiconductor layer 111p, an n-type semiconductor layer 111n, and an intrinsic (i-type) semiconductor layer 111i which is provided between the p-type semiconductor layer 111p and the n-type semiconductor layer 111n. Note that the photoelectric conversion element is not limited to this, and it is only necessary to have a first conductive layer, a second conductive layer, and a photoelectric conversion layer interposed between these two conductive layers. Note that the photoelectric conversion layer is not limited to the above description, and it is only necessary to have a stacked-layer structure of at least a p-type semiconductor layer and an n-type semiconductor layer.

The p-type semiconductor layer 111p may be formed using a semi-amorphous silicon film including an impurity element belonging to Group 13, e.g., boron (B) by plasma CVD. Alternatively, after a semi-amorphous silicon film is formed, an impurity element belonging to Group 13 may be introduced.

Note that a semi-amorphous semiconductor film includes a semiconductor which has an intermediate structure between an amorphous semiconductor and a semiconductor having a crystalline structure (including a single crystal and a polycrystal). The semi-amorphous semiconductor film has a third condition which is stable in terms of free energy, and is a crystalline substance having a short-range order and lattice distortion, and the semi-amorphous semiconductor film having a crystal grain size of 0.5 to 20 nm can be dispersed in a non-single crystalline semiconductor film. As for the semi-amorphous semiconductor film, Raman spectrum thereof is shifted to a wave number side lower than 520 $cm^{-1}$, and the diffraction peaks of (111) and (220) which are said to be caused by a Si crystal lattice are observed in X-ray diffraction. In addition, the semi-amorphous semiconductor film includes hydrogen or halogen of at least 1 atomic percent or more to terminate a dangling bond. In this specification, such a semiconductor film is referred to as a semi-amorphous semiconductor (SAS) film for convenience. Further, a rare gas element such as helium, argon, krypton, or neon is included to further promote lattice distortion so that stability is improved and a favorable semi-amorphous semiconductor film can be obtained. Note that a microcrystalline semiconductor film (microcrystal semiconductor film) is also included in the semi-amorphous semiconductor film.

In addition, the SAS film can be obtained by glow discharge decomposition of gas including silicon. An example of typical gas including silicon is $SiH_4$, and $Si_2H_6$, and $SiH_2Cl_2$, $SiHCl_3$, $SiCl_4$, $SiF_4$, or the like can also be used. The gas including silicon is diluted with hydrogen, or gas in which one or more rare gas elements such as helium, argon, krypton, and neon are added to hydrogen, so that the SAS film can be formed easily. It is preferable to use a dilution ratio in a range of 2 to 1000 times to dilute the gas including silicon. Moreover, carbide gas such as $CH_4$ or $C_2H_6$, germanium gas such as $GeH_4$ or $GeF_4$, $F_2$ or the like may be mixed in the gas including silicon to adjust an energy band width to be 1.5 to 2.4 eV or 0.9 to 1.1 eV.

After the p-type semiconductor layer 111p is formed, a semiconductor layer which does not include an impurity which imparts conductivity (referred to as an intrinsic semiconductor layer or an i-type semiconductor layer) 111i, and the n-type semiconductor layer 111n are sequentially formed. Accordingly, the photoelectric conversion layer 111 including the p-type semiconductor layer 111p, the i-type semiconductor layer 111i, and the n-type semiconductor layer 111n is formed.

Note that in this specification, an i-type semiconductor layer corresponds to a semiconductor layer in which concentration of an impurity which imparts p-type or n-type conductivity is $1 \times 10^{20}$ cm$^{-3}$ or less, and concentration of oxygen and nitrogen is $5 \times 10^{19}$ cm$^{-3}$ or less. Note that photoconductivity preferably exceeds dark conductivity by 1000 times or more. In addition, 10 to 1000 ppm of boron (B) may be added to the i-type semiconductor layer.

As the i-type semiconductor layer 111i, for example, a semi-amorphous silicon film may be formed by plasma CVD. In addition, as the n-type semiconductor layer 111n, a semi-amorphous silicon film including an impurity element belonging to Group 15, e.g., phosphorous (P) may be formed. Alternatively, after a semi-amorphous silicon film is formed, an impurity element belonging to Group 15 may be introduced.

Alternatively, an amorphous semiconductor film as well as a semi-amorphous semiconductor film may be used for each of the p-type semiconductor layer 111p, the intrinsic semiconductor layer 111i, and the n-type semiconductor layer 111n.

Each of the wiring 319, a connection electrode 320, a terminal electrode 351, a source electrode and a drain electrode 341 of the thin film transistor 112, and a source electrode and a drain electrode 342 of the thin film transistor 113 has a stacked-layer structure of a high-melting point metal film and a low resistance metal film (e.g., an aluminum alloy or pure aluminum). Here, the wiring and these electrodes each have a three-layer structure in which a titanium film (a Ti film), an aluminum film (an Al film) and a Ti film are sequentially stacked.

Furthermore, protective electrodes 318, 345, 348, 346 and 347 are formed so as to cover the wiring 319, the connection electrode 320, the terminal electrode 351, the source electrode and the drain electrode 341 of the thin film transistor 112, and the source electrode and the drain electrode 342 of the thin film transistor 113, respectively.

The protective electrodes protect the wiring 319 and the like in an etching step for forming the photoelectric conversion layer 111. As materials for the protective electrodes, conductive materials having slower etching speed than that of the photoelectric conversion layer with respect to etching gas (or an etchant) for the photoelectric conversion layer 111 are preferable. In addition, a conductive material which does not react with the photoelectric conversion layer 111 to become an alloy is preferable as a material for the protective electrode 318. Note that the other protective electrodes 345, 348, 346 and 347 are formed by materials and a manufacturing process which are similar to those of the protective electrode 318.

Alternatively, a structure in which the protective electrodes 318, 345, 348, 346 and 347 are not formed may be employed. FIG. 21B shows an example in which these protective electrodes are not formed. In FIG. 21B, each of a wiring 404, a connection electrode 405, a terminal electrode 401, a source electrode and a drain electrode 402 of the thin film transistor 112, and a source electrode and a drain electrode 403 of the thin film transistor 113 is formed using a single-layer conductive film, and as such a conductive film, a titanium film (Ti film) is preferable. Instead of the titanium film, a single-layer film formed from an element of tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum (Pt), an alloy material or a compound material including the above-described element as a main component; a single-layer film formed from nitride of these elements, for example, titanium nitride, tungsten nitride, tantalum nitride, or molybdenum nitride; or a stacked-layer film thereof can be used. The number of times of deposition can be reduced in a manufacturing process by formation of the wiring 404, the connection electrode 405, the terminal electrode 401, the source electrode and the drain electrode 402 of the thin film transistor 112, and the source electrode and the drain electrode 403 of the thin film transistor 113 as a single-layer film.

Current characteristics of the n-channel thin film transistors 112 and 113 in FIGS. 21A and 21B are different from each other, and the threshold voltages thereof are different from each other. In addition, although here an example of a top-gate thin film transistor having a structure in which there is one channel formation region (in this specification, referred to as a single gate structure) is shown, a structure having a plurality of channel formation regions may be used to reduce variation in the on current. In order to reduce the off current, lightly doped drain (LDD) regions may be provided in the n-channel thin film transistors 112 and 113. An LDD region is a region to which an impurity element is added at low concentration between a channel formation region and a source region or a drain region which is formed by adding an impurity element at high concentration. By providing the LDD regions, an advantageous effect in that an electric field in the vicinity of the drain region is reduced and deterioration due to hot carrier injection is prevented can be obtained.

In order to prevent deterioration of the on current due to hot carriers, the n-channel thin film transistors 112 and 113 may have a structure in which an LDD region and a gate electrode are provided so as to be overlapped with each other with a gate insulating film interposed therebetween (in this specification, referred to as a GOLD (gate-drain overlapped LDD) structure). In the case of using a GOLD structure, an advantageous effect in that an electric field in the vicinity of a drain region is reduced and deterioration due to hot carrier injection is prevented is more enhanced than the case where an LDD region and a gate electrode are not overlapped with each other. With such a GOLD structure, electric field intensity in the vicinity of the drain region is reduced and hot carrier injection is prevented, so that deterioration phenomenon is effectively prevented.

The thin film transistors 112 and 113 are not limited to being the top-gate thin film transistors described above, and may be bottom-gate thin film transistors, e.g., inversely staggered thin film transistors.

A wiring 314 in FIG. 21A is a wiring which is connected to the wiring 319 and also serves as a gate electrode by being extended above the channel formation region of the thin film transistor 113.

A wiring 315 in FIG. 21A is a wiring which is connected to the terminal 121 connected to the n-type semiconductor layer 111n through the connection electrode 320 and the protective electrode 345 and is connected to a drain wiring (also referred to as a drain electrode) or a source wiring (also referred to as a source electrode) of the thin film transistor 113.

Since light to be detected passes through interlayer insulating films 316 and 317 in FIG. 21A, materials having high light-transmitting properties are preferably used as materials for both the interlayer insulating films 316 and 317. Note that in order to improve fixing intensity, an inorganic material, e.g., a silicon oxide ($SiO_x$) film is preferably used for the interlayer insulating film 317. An inorganic material is also preferably used for a sealing layer 324, and these insulating films can be formed by CVD or the like.

In addition, a terminal electrode 350 in FIG. 21A is formed in the same process as the wirings 314 and 315, and the terminal electrode 351 is formed in the same process as the wiring 319 and the connection electrode 320. Note that the terminal 122 is connected to the terminal electrode 350 through the protective electrode 348 and the terminal electrode 351.

Note that the terminal 121 in FIG. 21A is mounted on an electrode 361 of a substrate 360 by a solder 364. The terminal 122 is formed in the same process as the terminal 121 and is mounted on an electrode 362 of the substrate 360 by a solder 363.

In FIGS. 21A and 21B, as shown by arrows in the drawings, light enters the photoelectric conversion layer 111 from a substrate 310 side. Thus, current is generated and the light can be detected.

This embodiment mode can be combined with any description of other embodiment modes in this specification as appropriate.

Embodiment Mode 7

In this embodiment, a semiconductor device of the present invention and a manufacturing method thereof are described. Note that in this embodiment mode, FIGS. 22A to 24C each show an example of a partial cross-sectional view of the semiconductor device, and the semiconductor device and the manufacturing method thereof are described with reference to them. In addition, portions which are similar to those of FIGS. 21A and 21B are denoted by the same reference numerals, and detailed description thereof is omitted.

First, an element is formed over the substrate (the first substrate 310). In this embodiment, an AN 100 which is a glass substrate is used for the substrate 310.

Subsequently, a silicon oxide film including nitrogen (with a film thickness of 100 nm), which serves as the base insulating film 312, is formed by plasma CVD, and a semiconductor film such as an amorphous silicon film including hydrogen (with a film thickness of 54 nm) is stacked without being exposed to atmosphere. Further, the base insulating film 312 may be formed by stacking a silicon oxide film, a silicon nitride film, and a silicon oxide film including nitrogen. For example, a film in which a silicon nitride film including oxygen with a film thickness of 50 nm and a silicon oxide film including nitrogen with a film thickness of 100 nm are stacked may be formed as the base insulating film 312. Note that each of the silicon oxide film including nitrogen and the silicon nitride film serves as a blocking layer which prevents an impurity such as alkali metal from diffusing from the glass substrate.

Subsequently, the amorphous silicon film is crystallized by a solid-phase epitaxy method, a laser crystallization method, a crystallization method using catalytic metal, or the like to form a semiconductor film having a crystalline structure (a crystalline semiconductor film), e.g., a polycrystalline silicon film. Here, a polycrystalline silicon film is obtained by a crystallization method using a catalytic element. First, a nickel acetate solution including 10 ppm by weight of nickel is applied by a spinner. Note that a nickel element may be dispersed over an entire surface by sputtering instead of coating. Next, heat treatment for crystallizing the amorphous silicon film is performed to form a semiconductor film having a crystalline structure. Here, a polycrystalline silicon film is obtained by performing heat treatment for crystallizing (at 550° C. for 4 hours) after heat treatment (at 500° C. for one hour) is performed.

Subsequently, an oxide film over the surface of the polycrystalline silicon film is removed by a dilute hydrofluoric acid or the like. After that, irradiation with laser light (XeCl which has a wavelength of 308 nm) for increasing the degree of crystallinity and repairing defects left in crystal grains is performed in the atmosphere or an oxygen atmosphere.

As the laser light, excimer laser light with a wavelength of 400 nm or less, or a second harmonic or a third harmonic of a YAG laser is used. Here, pulsed laser light with a repetition rate of approximately 10 to 1000 Hz is used, the pulsed laser light is condensed to 100 to 500 mJ/cm$^2$ by an optical system, and irradiation is performed with an overlap rate of 90 to 95% to scan a surface of the silicon film. In this embodiment, irradiation with laser light having a repetition rate of 30 Hz and energy density of 470 mJ/cm$^2$ is performed in the atmosphere.

Note that since laser light irradiation is performed in the atmosphere or in an oxygen atmosphere, an oxide film is formed on the surface. Although an example in which the pulsed laser is used is shown in this embodiment, a continuous wave laser may be used. In order to obtain crystals with a large grain size at the time of crystallization of a semiconductor film, it is preferable to use a solid laser which is capable of continuous oscillation and to apply the second to fourth harmonic of a fundamental wave. Typically, a second harmonic (532 nm) or a third harmonic (355 nm) of an Nd:YVO$_4$ laser (a fundamental wave of 1064 nm) is applied.

In the case of using a continuous wave laser, laser light which is emitted from a continuous wave YVO$_4$ laser with a 10 W output is converted into a harmonic by a non-linear optical element. In addition, there is a method in which a YVO$_4$ crystal and a non-linear optical element are put in an oscillator and a high harmonic is emitted. Then, laser light having a rectangular shape or an elliptical shape on an irradiated surface is preferably formed by an optical system and emitted to an object to be processed. At this time, an energy density of approximately 0.01 to 100 MW/cm$^2$ (preferably, 0.1 to 10 MW/cm$^2$) is necessary. Irradiation of the semiconductor film may be performed by moving the semiconductor film at a rate of approximately 10 to 2000 cm/s relatively to the laser light.

Subsequently, in addition to the oxide film which is formed by the above-described laser light irradiation, a barrier layer formed using an oxide film having a thickness of 1 to 5 nm in total is formed by treatment of the surface with ozone water for 120 seconds. The barrier layer is formed in order to remove the catalytic element which is added for crystallizing the amorphous silicon film, e.g., nickel (Ni) from the film. Although the barrier layer is formed using ozone water here, the barrier layer may be formed by depositing an oxide film having a thickness of approximately 1 to 10 nm by a method of oxidizing a surface of the semiconductor film having a crystalline structure by UV-ray irradiation in an oxygen atmosphere; a method of oxidizing a surface of the semiconductor film having a crystalline structure by oxygen plasma treatment, plasma CVD, sputtering, an evaporation method, or the like. Alternatively, the oxide film formed by the laser light irradiation may be removed before forming the barrier layer.

Then, an amorphous silicon film including an argon element which serves as a gettering site is formed with a thickness of 10 to 400 nm, here 100 nm, over the barrier layer by sputtering. The amorphous silicon film including an argon element is formed under an atmosphere including argon using a silicon target. In the case where the amorphous silicon film including an argon element is formed by plasma CVD, deposition conditions are as follows: a flow ratio of monosilane to argon (SiH$_4$:Ar) is 1:99, deposition pressure is 6.665 Pa, RF power density is 0.087 W/cm$^2$, and deposition temperature is 350° C.

After that, the substrate over which the amorphous silicon film including an argon element is formed is placed in a furnace heated at 650° C., and heat treatment is performed for three minutes to remove a catalytic element (gettering). Thus, the catalytic element concentration in the semiconductor film having a crystalline structure is reduced. A lamp annealing apparatus may be used instead of the furnace.

Subsequently, after the amorphous silicon film including an argon element, which is a gettering site, is selectively removed using the barrier layer as an etching stopper, the barrier layer is selectively removed with a diluted hydrofluoric acid. Note that since nickel has a tendency to move to a region having high oxygen concentration at the time of gettering, it is preferable that the barrier layer formed using an oxide film be removed after gettering.

In the case where crystallization of a semiconductor film is not performed using a catalytic element, the above-described steps such as forming the barrier layer, forming the gettering site, heat treatment for gettering, removing the gettering site, and removing the barrier layer are not necessary.

Figure 22A:
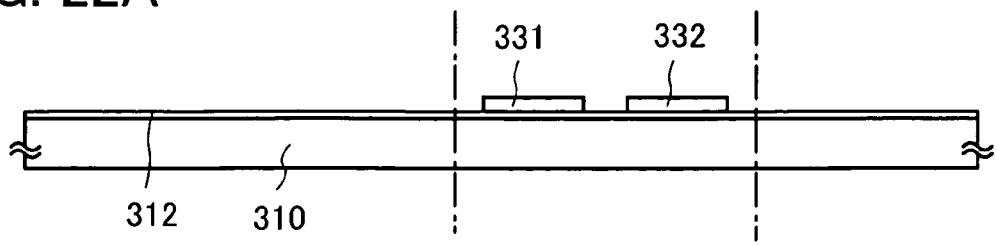
FIGS. 22A to 22D illustrate a manufacturing step of a semiconductor device of the present invention.

Subsequently, after a thin oxide film is formed on the surface of the obtained semiconductor film having a crystalline structure (e.g., a crystalline silicon film) using ozone water, a mask formed from a resist is formed using a first photomask and etching is performed to process the semiconductor film into a desired shape, and semiconductor film regions which are separated into an island shape (in this specification, referred to as island-shaped semiconductor regions) 331 and 332 are formed (see FIG. 22A). After the island-shaped semiconductor regions are formed, the mask formed from the resist is removed.

It is necessary that thin film transistors included in the semiconductor device of the present invention be manufactured so that they have different current characteristics. Therefore, one of the island-shaped semiconductor regions is doped with a slight amount of an impurity element (e.g., boron or phosphorus) to control the threshold voltage of the thin film transistors, for example. Here, an ion doping method in which diborane (B$_2$H$_6$) is not mass-separated but excited by plasma is used. Note that the present invention is not limited to the above-described structure as long as thin film transistors having different current characteristics can be formed.

Subsequently, the oxide film is removed with an etchant including a hydrofluoric acid, and at the same time, surfaces of the island-shaped semiconductor regions 331 and 332 are washed. After that, an insulating film including silicon as a main component, which serves as the gate insulating film 313, is formed. Here, a silicon oxide film including nitrogen (composition ratio of Si=32%, O=59%, N=7%, and H=2%) is formed with a thickness of 115 nm by plasma CVD.

Figure 22B:
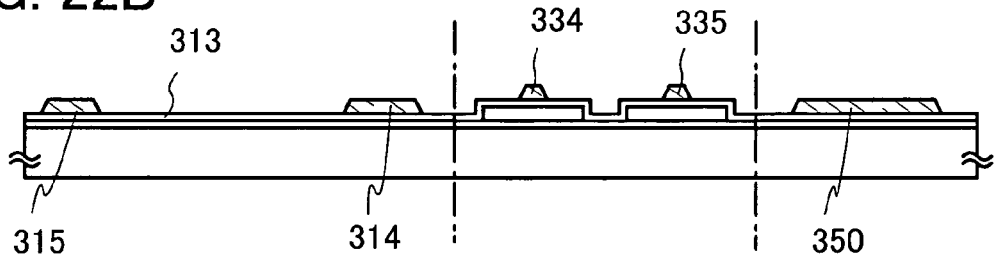
Figure 22C:
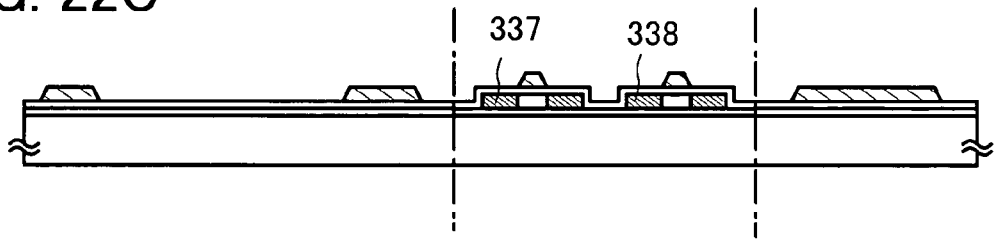

Subsequently, after a metal film is formed over the gate insulating film 313, patterning is performed using a second photomask to form gate electrodes 334 and 335, wirings 314 and 315, and a terminal electrode 350 (see FIG. 22B). A stacked-layer film of tantalum nitride with a thickness of 30 nm and tungsten with a thickness of 370 nm is used for the metal film, for example.

As the gate electrodes 334 and 335, the wirings 314 and 315, and the terminal electrode 350, a single-layer film formed from an element of titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or an alloy material or a compound material including the above-described element as a main component; a single-layer film formed from nitride thereof, e.g., titanium nitride, tungsten nitride, tantalum nitride or molybdenum nitride; or a stacked-layer film thereof may be used as well as the above-described film.

Subsequently, an impurity which imparts one conductivity type is introduced into the island-shaped semiconductor regions 331 and 332 to form a source region and a drain region 337 of the thin film transistor 112 and a source region and a drain region 338 of the thin film transistor 113. In this embodiment, an n-channel thin film transistor is formed, and an n-type impurity, e.g., phosphorus (P) or arsenic (As) is introduced into the island-shaped semiconductor regions 331 and 332 (see FIG. 22C).

Next, after a first interlayer insulating film (not shown) including a silicon oxide film is formed with a thickness of 50 nm by CVD, a step is performed in which the impurity elements added to each of the island-shaped semiconductor regions are activated. This activation process is performed by a rapid thermal annealing method (an RTA method) using a lamp light source, a method of irradiating from a back side of the substrate 310 with a YAG laser or an excimer laser, heat treatment using a furnace, or a method in which any of the above-described methods are combined.

Subsequently, the second interlayer insulating film 316 including a silicon nitride film including hydrogen and oxygen is formed with a film thickness of, for example, 10 nm.

Figure 22D:
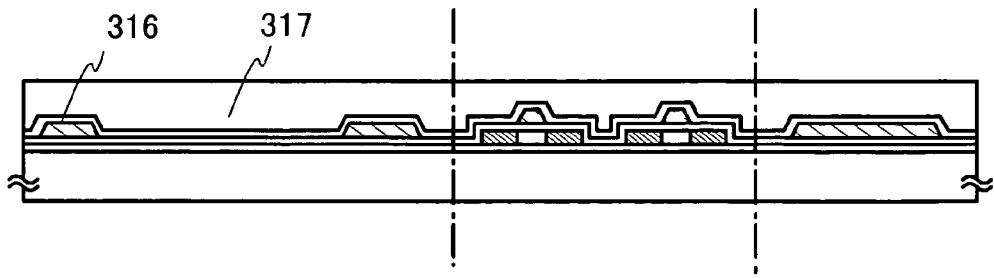

Subsequently, the third interlayer insulating film 317 formed using an insulating material is formed over the second interlayer insulating film 316 (see FIG. 22D). An insulating film obtained by CVD can be used for the third interlayer insulating film 317. In this embodiment, in order to improve fixing intensity, a silicon oxide film including nitrogen is formed with a thickness of 900 nm as the third interlayer insulating film 317.

Next, heat treatment (heat treatment at 300 to 550° C. for 1 to 12 hours, e.g., at 410° C. for 1 hour in a nitrogen atmosphere) is performed to hydrogenate the island-shaped semiconductor regions. This step is performed to terminate a dangling bond of the island-shaped semiconductor regions by hydrogen included in the second interlayer insulating film 316. The island-shaped semiconductor regions can be hydrogenated regardless of whether or not the gate insulating film 313 is formed.

Alternatively, as the third interlayer insulating film 317, an insulating film using siloxane and a stacked-layer structure thereof can be used. Siloxane is formed using a skeleton structure of a bond of silicon (Si) and oxygen (O). An organic group including at least hydrogen (e.g., an alkyl group or an aryl group) is used as a substituent. Further alternatively, a fluoro group may be used as the substituent.

In the case where an insulating film using siloxane and a stacked-layer structure thereof are used as the third interlayer insulating film 317, after formation of the second interlayer insulating film 316, heat treatment for hydrogenating the island-shaped semiconductor regions is performed and the third interlayer insulating film 317 can be formed.

Subsequently, a mask formed from a resist is formed using a third photomask, and the first interlayer insulating film, the second interlayer insulating film 316, the third interlayer insulating film 317, and the gate insulating film 313 are selectively etched to form a contact hole. Then, the mask formed from the resist is removed.

Note that the third interlayer insulating film 317 may be formed as necessary. In the case where the third interlayer insulating film 317 is not formed, the first interlayer insulating film, the second interlayer insulating film 316, and the gate insulating film 313 are selectively etched after formation of the second interlayer insulating film 316 to form a contact hole.

Next, after a metal stacked film is formed by sputtering, a mask formed from a resist is formed using a fourth photomask, and the metal film is selectively etched to form the wiring 319, the connection electrode 320, the terminal electrode 351, the source electrode and the drain electrode 341 of the thin film transistor 112, and the source electrode and the drain electrode 342 of the thin film transistor 113. Then, the mask formed from the resist is removed. Note that the metal film of this embodiment is a stacked-layer film of a Ti film with a thickness of 100 nm, an Al film including a slight amount of Si with a thickness of 350 nm, and a Ti film with a thickness of 100 nm.

By the process described above, the top-gate thin film transistors 112 and 113 using a polycrystalline silicon film can be manufactured. Note that subthreshold swings (S values) of the thin film transistors 112 and 113 can be changed depending on crystallinity of a semiconductor film and an interface state between a semiconductor film and a gate insulating film.

Figure 23A:
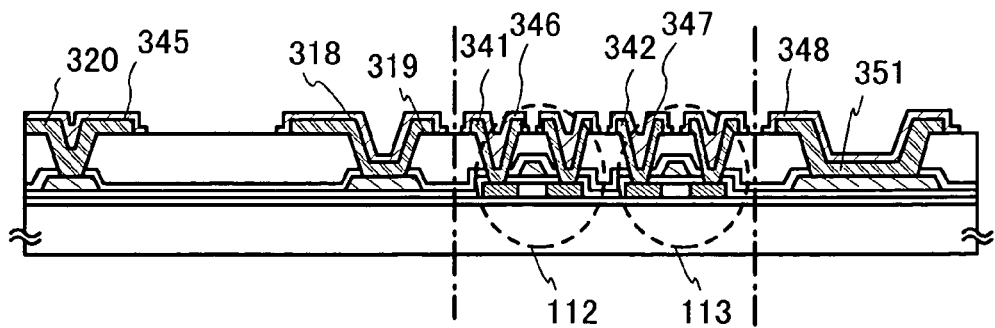
FIGS. 23A to 23C illustrate a manufacturing step of a semiconductor device of the present invention.

Subsequently, after formation of a conductive metal film (e.g., titanium (Ti) or molybdenum (Mo)) which does not easily become an alloy by reacting with a photoelectric conversion layer (typically, amorphous silicon) which is formed later, a mask formed from a resist is formed using a fifth photomask, and the conductive metal film is selectively etched to form a protective electrode 318 which covers the wiring 319 (see FIG. 23A). Here, a Ti film with a thickness of 200 nm which is obtained by sputtering is used. Note that the connection electrode 320, the terminal electrode 351, and the source electrode and the drain electrode of the thin film transistor are covered with the protective electrodes 345, 348, 346, and 347 formed from a metal film which is similar to the protective electrode 318. Therefore, the conductive metal film also covers a side face where the second Al film is exposed in these electrodes, so that the conductive metal film can also prevent diffusion of aluminum atoms to the photoelectric conversion layer.

As shown in FIG. 21B, a structure may be employed in which the protective electrodes are not formed over the wiring 404, the connection electrode 405, the terminal electrode 401, the source electrode and the drain electrode 402 of the thin film transistor 112, and the source electrode and the drain electrode 403 of the thin film transistor 113.

Next, a photoelectric conversion layer 111 including the p-type semiconductor layer 111p, the i-type semiconductor layer 111i, and the n-type semiconductor layer 111n is formed over the third interlayer insulating film 317.

The p-type semiconductor layer 111p may be formed using a semi-amorphous silicon film including an impurity element belonging to Group 13, e.g., boron (B) by plasma CVD. Alternatively, after a semi-amorphous silicon film is formed, an impurity element belonging to Group 13 may be introduced.

Note that the wiring 319 and the protective electrode 318 are in contact with the bottom layer of the photoelectric conversion layer 111, i.e., the p-type semiconductor layer 111p in this embodiment.

After the p-type semiconductor layer 111p is formed, the i-type semiconductor layer 111i and the n-type semiconductor layer 111n are sequentially formed. Thus, the photoelectric conversion layer 111 including the p-type semiconductor layer 111p, the i-type semiconductor layer 111i, and the n-type semiconductor layer 111n is formed.

As the i-type semiconductor layer 111i, for example, a semi-amorphous silicon film may be formed by plasma CVD. In addition, as the n-type semiconductor layer 111n, a semi-amorphous silicon film including an impurity element belonging to Group 15, e.g., phosphorous (P) may be formed. Alternatively, after a semi-amorphous silicon film is formed, an impurity element belonging to Group 15 may be introduced.

Alternatively, an amorphous semiconductor film as well as a semi-amorphous semiconductor film may be used for each of the p-type semiconductor layer 111p, the intrinsic semiconductor layer 111i, and the n-type semiconductor layer 111n.

Figure 23B:
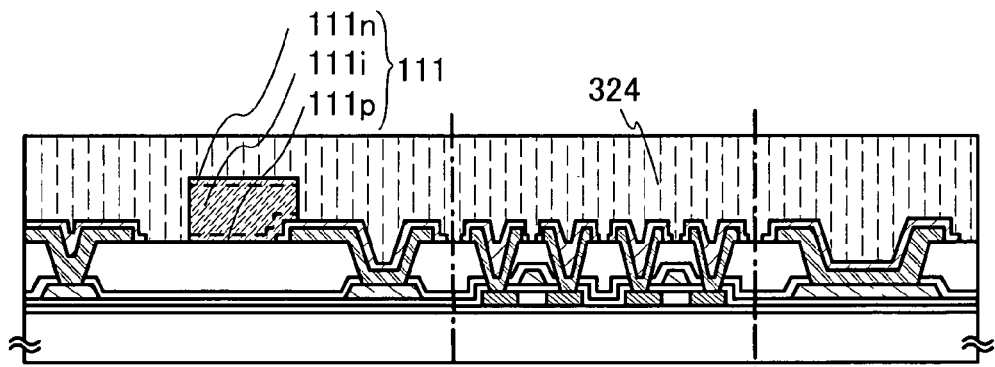

Subsequently, the sealing layer 324 formed from an insulating material (e.g., an inorganic insulating film including silicon) is formed with a thickness of 1 to 30 μm over an entire surface resulting in a structure shown in FIG. 23B. Here, as an insulating material film, a silicon oxide film including nitrogen with a thickness of 1 μm is formed by CVD. By using an inorganic insulating film, adhesiveness can be improved.

Subsequently, after the sealing layer 324 is etched to provide an opening, the terminals 121 and 122 are formed by sputtering. Each of the terminals 121 and 122 is a stacked-layer film of a titanium film (a Ti film) (100 nm), a nickel film (a Ni film) (300 nm), and a gold film (a Au film) (50 nm). The terminals 121 and 122 obtained in this manner have a fixing intensity of higher than 5 N, which is sufficient fixing intensity as a terminal electrode.

Figure 23C:
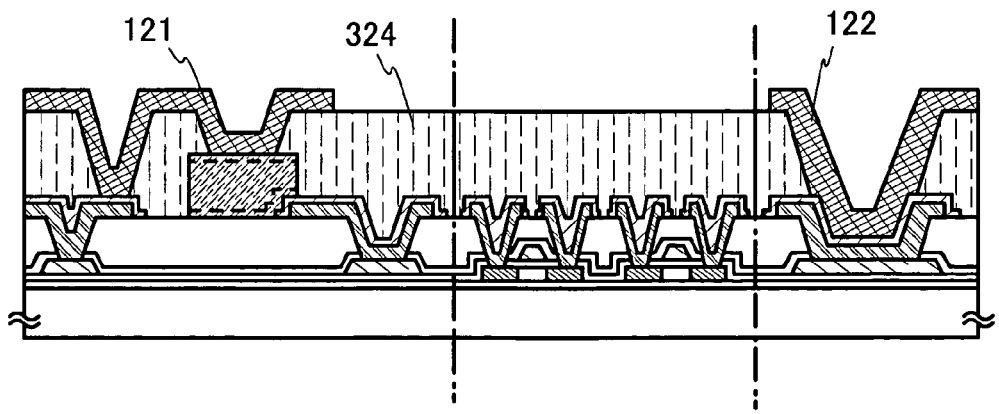

By the above-described process, the terminal 121 and the terminal 122 which can be connected by a solder are formed, and a structure shown in FIG. 23C can be obtained.

In this manner, a large quantity of optical sensor chips (2 mm×1.5 mm each), i.e., chips of the semiconductor device of the present invention can be formed from one large substrate (e.g., 600 cm×720 cm), for example. Next, the substrate is cut into separate sections and a plurality of optical sensor chips are cut out of the substrate.

Figure 24A:
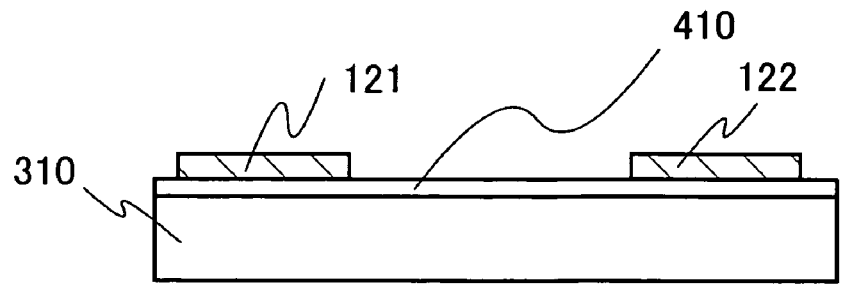
FIGS. 24A to 24C illustrate a manufacturing step of a semiconductor device of the present invention.
Figure 24B:
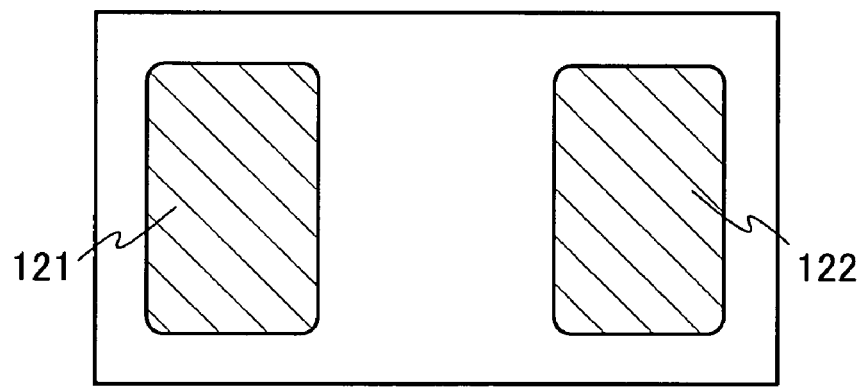
Figure 24C:
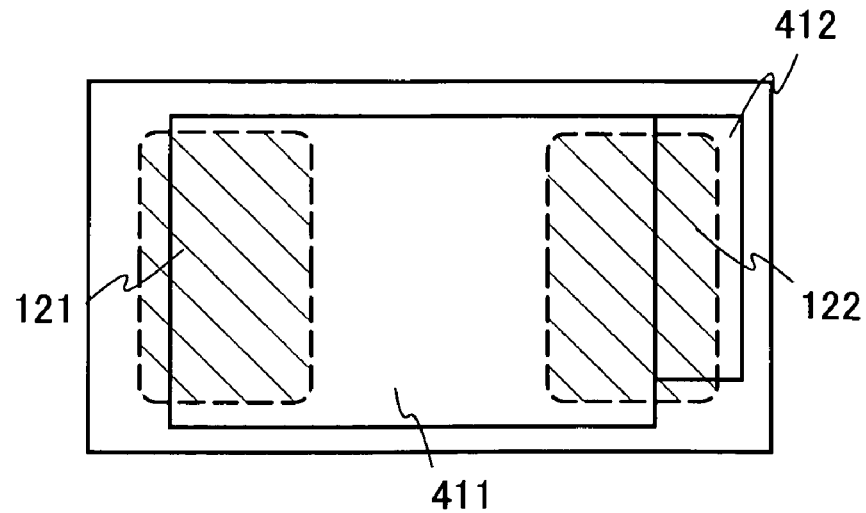

FIG. 24A shows a cross-sectional view of one taken optical sensor chip (2 mm×1.5 mm), FIG. 24B shows a top view thereof, and FIG. 24C shows a bottom view thereof. Note that the total thickness including thicknesses of the substrate 310, an element formation region 410, the terminal 121, and the terminal 122 is 0.8±0.05 mm in FIG. 24A.

Alternatively, in order to reduce the total thickness of the optical sensor chip, after the substrate 310 is ground and thinned by CMP treatment or the like, the substrate 310 may be cut into separate sections by a dicer and a plurality of optical sensor chips may be cut out of the substrate.

In FIG. 24B, the electrode size of each of the terminals 121 and 122 is 0.6 mm×1.1 mm, and an interval between the electrodes is 0.4 mm. In addition, in FIG. 24C, an area of a light receiving portion 411 is 1.57 mm$^2$. Further, a circuit portion 412 is provided with many thin film transistors.

Lastly, the obtained optical sensor chip is mounted on a mounting surface of the substrate 360 (see FIG. 21A). Note that the terminal 121 and the electrode 361 are connected using the solder 364, and the terminal 122 and the electrode 362 are connected using the solder 363. The solders are formed over the electrodes 361 and 362 of the substrate 360 in advance by a screen printing method or the like. Then, after the solders and the terminal electrodes are put into contact with each other, solder reflow treatment is performed to mount the optical sensor chip on the substrate. The solder reflow treatment is performed at approximately 255 to 265°

C. for about 10 seconds in an inert gas atmosphere, for example. Alternatively, a bump formed using metal (e.g., gold or silver), a bump formed using a conductive resin, or the like can be used instead of the solder. Further alternatively, taking environmental problems into consideration, a lead-free solder may be used for mounting.

As described above, a semiconductor device can be manufactured. Note that in order to detect light, light may be blocked using a housing or the like in a portion where light does not enter the photoelectric conversion layer 111 from the substrate 310 side. Note that any material may be used for a housing as long as it has a function of blocking light, and for example, the housing may be formed using a metal material, a resin material having a black pigment, or the like. By employing such a structure, a highly reliable semiconductor device having a function of detecting light can be formed.

Although the case in which the circuit included in the semiconductor device is formed using an n-channel thin film transistor is described in this embodiment mode, the circuit included in the semiconductor device may be formed using a p-channel thin film transistor. Note that when a p-type impurity such as boron (B) is used instead of an impurity which imparts one conductivity type to an island-shaped semiconductor region, a p-channel thin film transistor can be formed similarly to an n-channel thin film transistor.

In addition, although the case in which the p-type semiconductor layer 111p, the i-type semiconductor layer 111i, and the n-type semiconductor layer 111n are sequentially stacked in this order in the photoelectric conversion layer included in the photoelectric conversion element is described, these semiconductor layers may be stacked in reverse order. Order of stacking is selected as appropriate depending on circuit structures of a semiconductor device.

This embodiment mode can be combined with any description of other embodiment modes in this specification as appropriate.

Embodiment Mode 8

In this embodiment, examples of a semiconductor device formed using a bottom-gate thin film transistor and a manufacturing method thereof are described with reference to FIGS. 25A to 27B. In addition, portions which are similar to those of the above-described embodiment modes are denoted by the same reference numerals, and detailed description thereof is omitted.

Figure 25A:
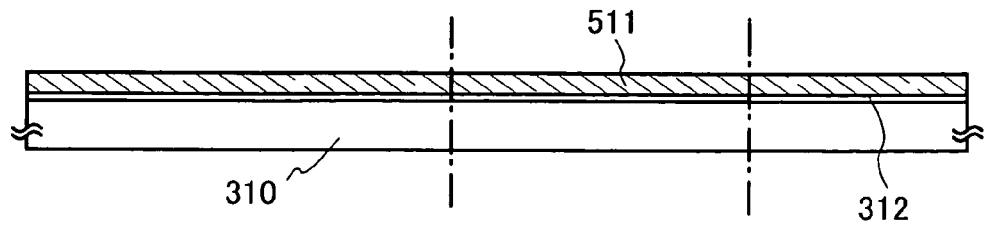
FIGS. 25A to 25E illustrate a manufacturing step of a semiconductor device of the present invention.

First, a base insulating film 312 and a metal film 511 are formed over a substrate 310 (see FIG. 25A). In this embodiment, a stacked-layer film of tantalum nitride with a thickness of 30 nm and tungsten with a thickness of 370 nm is used for the metal film 511, for example.

Alternatively, for the metal film 511, a single-layer film formed from an element of titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), an alloy material or a compound material including the above-described element as a main component, or a single-layer film formed from nitride of the above-described elements such as titanium nitride, tungsten nitride, tantalum nitride, or molybdenum nitride can be used.

Note that the metal film 511 may be formed directly on the substrate 310 without forming the base insulating film 312 over the substrate 310.

Figure 25B:
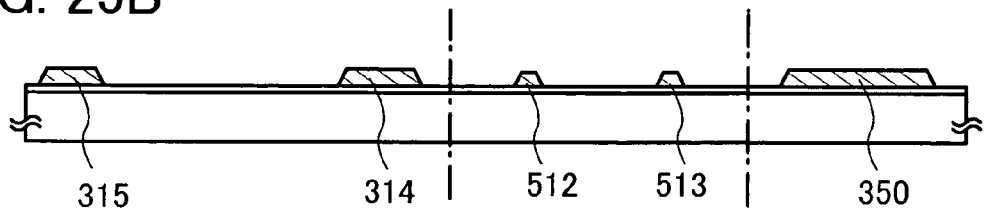
Figure 25C:
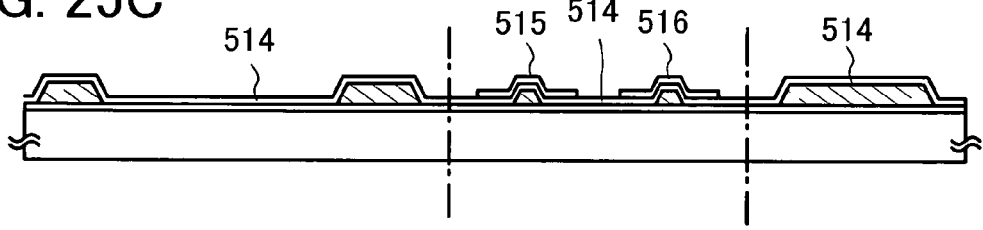

Next, the metal film 511 is patterned to form gate electrodes 512 and 513, wirings 314 and 315, and a terminal electrode 350 (see FIG. 25B).

Subsequently, a gate insulating film 514 which covers the gate electrodes 512 and 513, the wirings 314 and 315, and the terminal electrode 350 is formed. In this embodiment, the gate insulating film 514 is formed using an insulating film including silicon as a main component, for example, a silicon oxide film including nitrogen (composition ratio of Si=32%, O=59%, N=7%, H=2%) formed with a thickness of 115 nm by plasma CVD.

Next, island-shaped semiconductor regions 515 and 516 are formed over the gate insulating film 514. The island-shaped semiconductor regions 515 and 516 are formed using materials and a manufacturing process which are similar to those of the island-shaped semiconductor regions 331 and 332 described in Embodiment 7 (see FIG. 25C). Note that it is necessary that thin film transistors included in the semiconductor device of the present invention be manufactured so that they have different current characteristics. Therefore, next, one of the island-shaped semiconductor regions is doped with a slight amount of an impurity element (e.g., boron or phosphorus) to control the threshold voltage of the thin film transistors, for example. Here, an ion doping method in which diborane ($B_2H_6$) is not mass-separated but excited by plasma is used. Note that as log as a method which can form the thin film transistors 501 and 502 so that they have different current characteristics is used, the present invention is not limited to the above-described method.

Figure 25D:
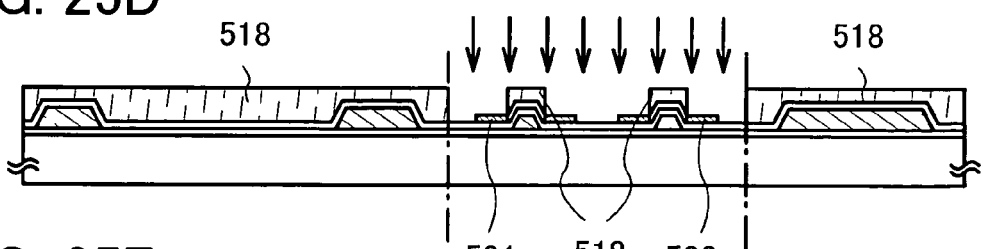

Next, a mask 518 is formed covering portions except for regions which later serve as a source region and a drain region 521 of a thin film transistor 501 and a source region and a drain region 522 of a thin film transistor 502, and an impurity which imparts one conductivity type is introduced (see FIG. 25D). As the one conductivity-type impurity, phosphorus (P) or arsenic (As) may be used as an n-type impurity in the case of forming an n-channel thin film transistor, and boron (B) may be used as a p-type impurity n the case of forming a p-channel thin film transistor. In this embodiment, phosphorus (P) which is an n-type impurity is introduced into the island-shaped semiconductor regions 515 and 516 to form the source region and the drain region 521 of the thin film transistor 501 and a channel formation region between these regions, and the source region and the drain region 522 of the thin film transistor 502 and a channel formation region between these regions.

Figure 25E:
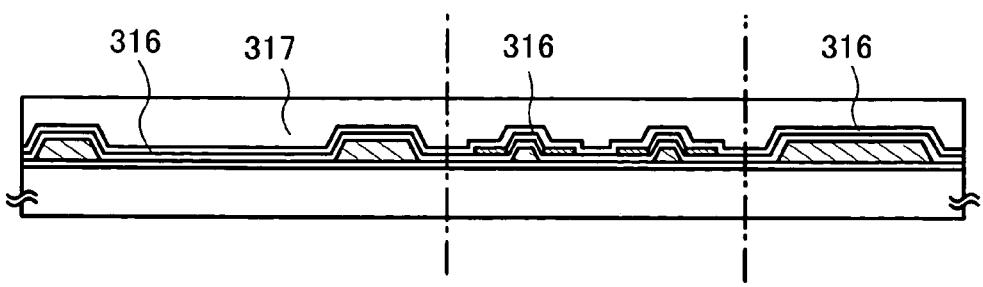

Next, the mask 518 is removed, and a first interlayer insulating film which is not shown, a second interlayer insulating film 316, and a third interlayer insulating film 317 are formed (see FIG. 25E). It is acceptable as long as materials and a manufacturing process of the first interlayer insulating film, the second interlayer insulating film 316, and the third interlayer insulating film 317 are based on the description in the above-described embodiment mode.

Contact holes are formed in the first interlayer insulating film, the second interlayer insulating film 316, and the third interlayer insulating film 317, and a metal film is formed, and further. In addition, the metal film is selectively etched to form the wiring 319, the connection electrode 320, the terminal electrode 351, the source electrode and the drain electrode 531 of the thin film transistor 501, and the source electrode and the drain electrode 532 of the thin film transistor 502. Then, the mask formed from a resist is removed. Note that the metal film of this embodiment is a stacked-layer film of a Ti film with a thickness of 100 nm, an Al film including a slight amount of silicon with a thickness of 350 nm, and a Ti film with a thickness of 100 nm.

Alternatively, instead of the wiring 319 and the protective electrode 318 thereof; the connection electrode 320 and the protective electrode 533 thereof; the terminal electrode 351 and the protective electrode 538 thereof; the source electrode and the drain electrode 531 of the thin film transistor 501 and the protective electrode 536 thereof; and the source electrode and the drain electrode 532 of the thin film transistor 502 and the protective electrode 537 thereof, each wiring and electrode may be formed using a single-layer conductive film, similarly to the wiring 404, the connection electrode 405, the terminal electrode 401, the source electrode and the drain electrode 402 of the thin film transistor 112, and the source electrode and the drain electrode 403 of the thin film transistor 113 in FIG. 21B.

Figure 26A:
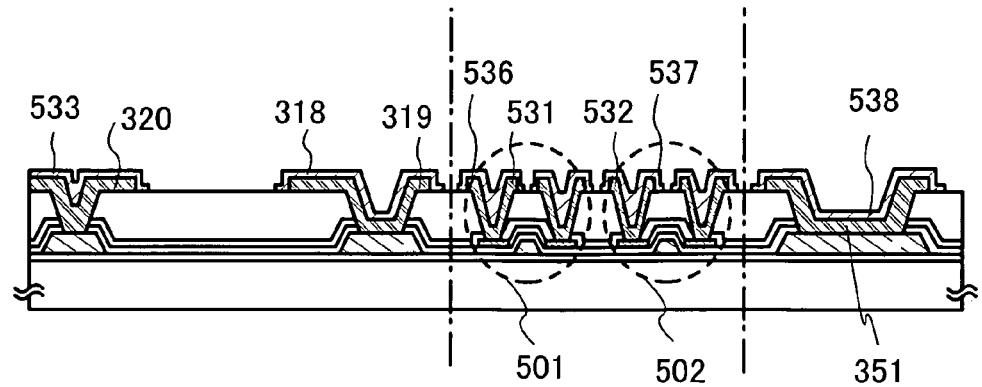
FIGS. 26A to 26C illustrate a manufacturing step of a semiconductor device of the present invention.

As described above, bottom-gate thin film transistors 501 and 502 can be manufactured (see FIG. 26A).

Figure 26B:
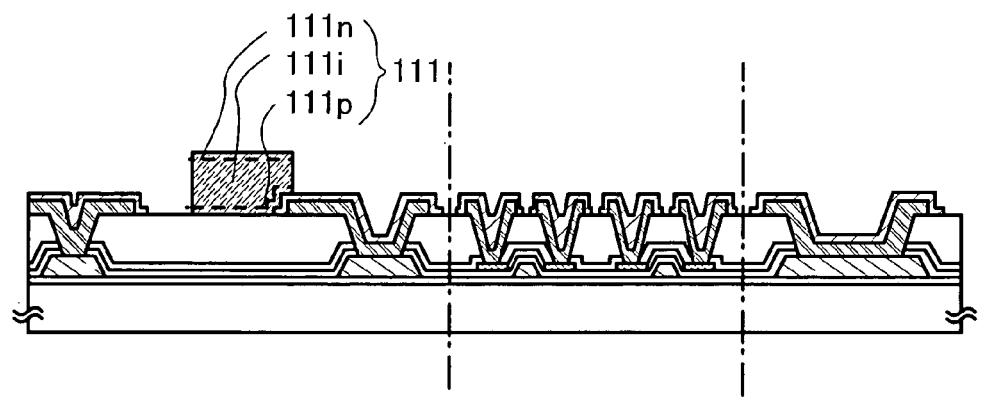

Next, the photoelectric conversion layer 111 including the p-type semiconductor layer 111p, the i-type semiconductor layer 111i, and the n-type semiconductor layer 111n is formed over the third interlayer insulating film 317 (see FIG. 26B). The above-described embodiment mode are referred to concerning a material, a manufacturing process, and the like of the photoelectric conversion layer 111.

Figure 26C:
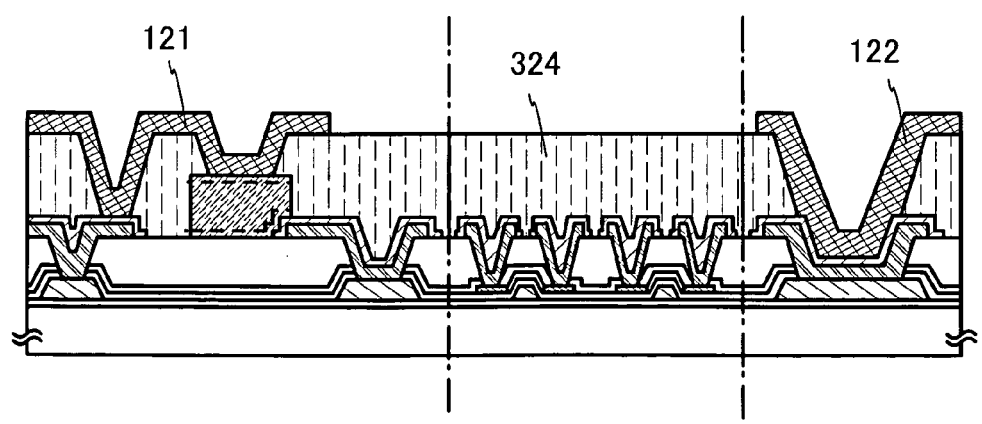

Subsequently, the sealing layer 324 and the terminals 121 and 122 are formed (see FIG. 26C). The terminal 121 is connected to the n-type semiconductor layer 111n and the terminal 122 is formed by the same process as the terminal 121.

Further, the substrate 360 having the electrodes 361 and 362 is mounted using the solders 364 and 363. Note that the electrode 361 on the substrate 360 is mounted on the terminal 121 by the solder 364. In addition, the electrode 362 on the substrate 360 is mounted on the terminal 122 by the solder 363 (see FIG. 27A).

Figure 27A:
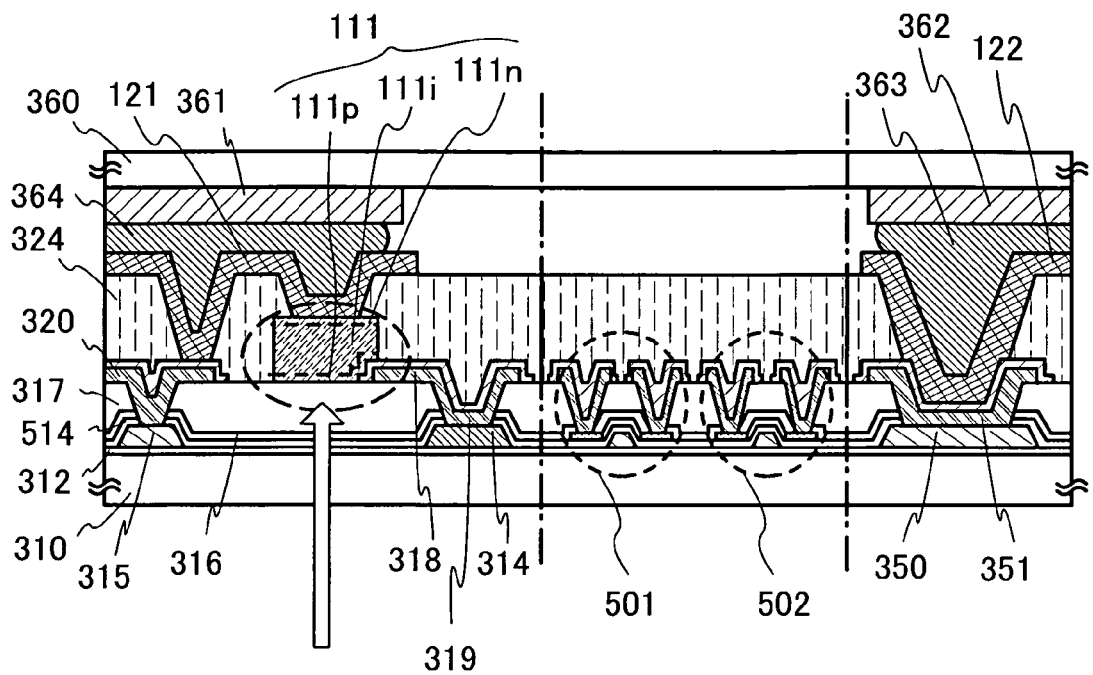
FIGS. 27A and 27B illustrate a manufacturing step of a semiconductor device of the present invention.
Figure 27B:
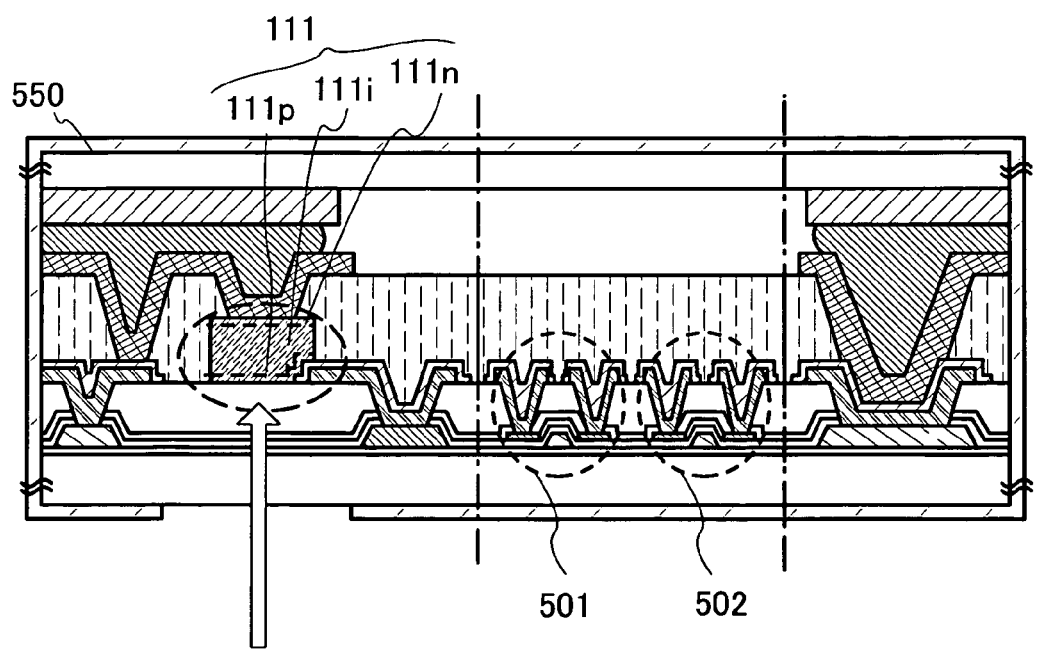

Although in a semiconductor device shown in FIG. 27A, light which enters the photoelectric conversion layer 111 enters mainly from the substrate 310 side, a direction from which light enters is not limited to this. In addition, as shown in FIG. 27B, a housing 550 may be provided in a region other than a region where the photoelectric conversion layer 111 on the substrate 360 side is formed. Note that any material may be used for the housing 550 as long as it has a function of blocking light. For example, the housing 550 is formed using a metal material, a resin material having a black pigment, or the like. By employing such a structure, a highly reliable semiconductor device having a function of detecting light can be formed.

This embodiment mode can be combined with any description of other embodiment modes in this specification as appropriate.

Embodiment Mode 9

In this embodiment, an example in which a semiconductor device obtained by using the present invention is incorporated in various electronic devices as an optical sensor is described. As examples of electronic devices to which the present invention is applied, a computer, a display, a mobile phone, a television receiver, and the like can be given. Specific examples of those electronic devices are shown in FIGS. 28 to 32B.

FIG. 28 shows an example of a mobile phone to which the present invention is applied, and which includes a main body (A) 701, a main body (B) 702, a housing 703, operation keys 704, an audio output portion 705, an audio input portion 706, a circuit substrate 707, a display panel (A) 708, a display panel (B) 709, a hinge 710, a light-transmitting material portion 711, and an optical sensor 712. The present invention can be applied to the optical sensor 712.

The optical sensor 712 detects light which is transmitted through the light-transmitting material portion 711, controls luminance of the display panel (A) 708 and the display panel (B) 709 in accordance with illuminance of detected external light, and controls illumination of the operation keys 704 in accordance with illuminance obtained by the optical sensor 712. Thus, power consumption of the mobile phone can be reduced.

Figure 29A:
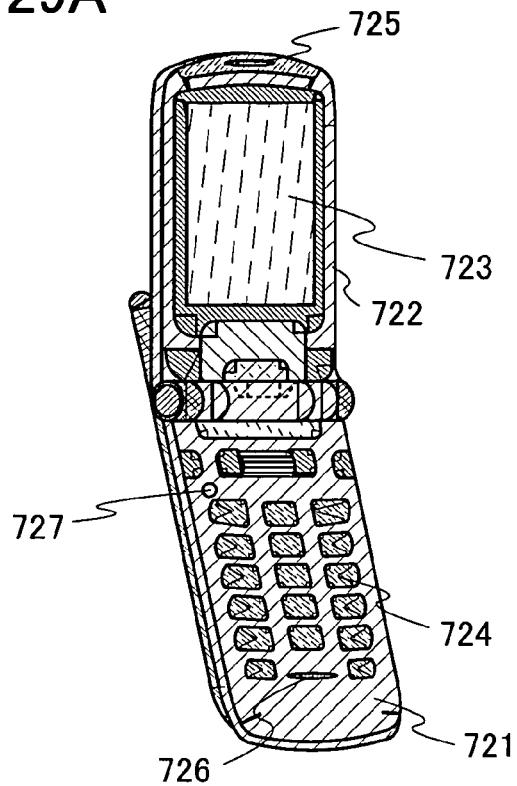
FIGS. 29A and 29B each illustrate a device on which a semiconductor device of the present invention is mounted.
Figure 29B:
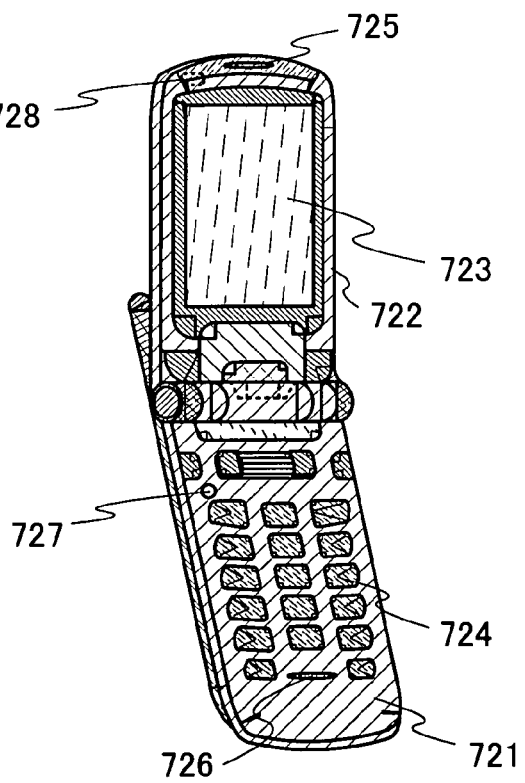

Next, FIGS. 29A and 29B show other examples of a mobile phone. In FIGS. 29A and 29B, a reference numeral 721 denotes a main body; a reference numeral 722 denotes a housing; a reference numeral 723 denotes a display panel; a reference numeral 724 denotes operation keys; a reference numeral 725 denotes an audio output portion; a reference numeral 726 denotes an audio input portion; and reference numerals 727 and 728 denote optical sensors.

In the mobile phone shown in FIG. 29A, luminance of the display panel 723 and the operation keys 724 can be controlled by detecting external light with the optical sensor 727 provided in the main body 721, to which the present invention is applied.

In the mobile phone shown in FIG. 29B, the optical sensor 728 is provided inside the main body 721 in addition to the structure of FIG. 29A. By the optical sensor 728, luminance of a backlight provided for the display panel 723 can be detected and controlled. Thus, power consumption can be further reduced.

Figure 30A:
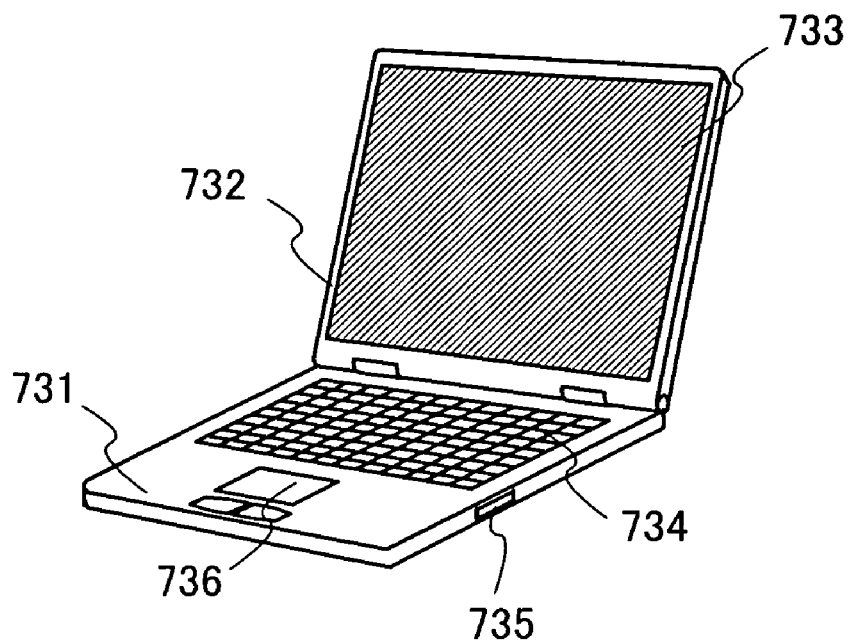
FIGS. 30A and 30B each illustrate a device on which a semiconductor device of the present invention is mounted.
Figure 30B:
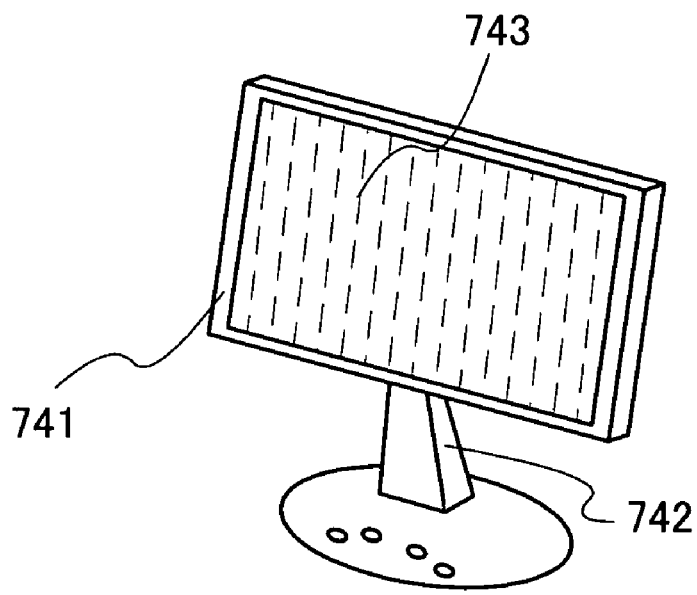

FIG. 30A shows a computer, which includes a main body 731, a housing 732, a display portion 733, a keyboard 734, an external connection port 735, a pointing device 736, and the like. FIG. 30B shows a display device, and a TV receiver or the like corresponds to this. The display device includes a housing 741, a support base 742, a display portion 743, and the like.

Figure 31:
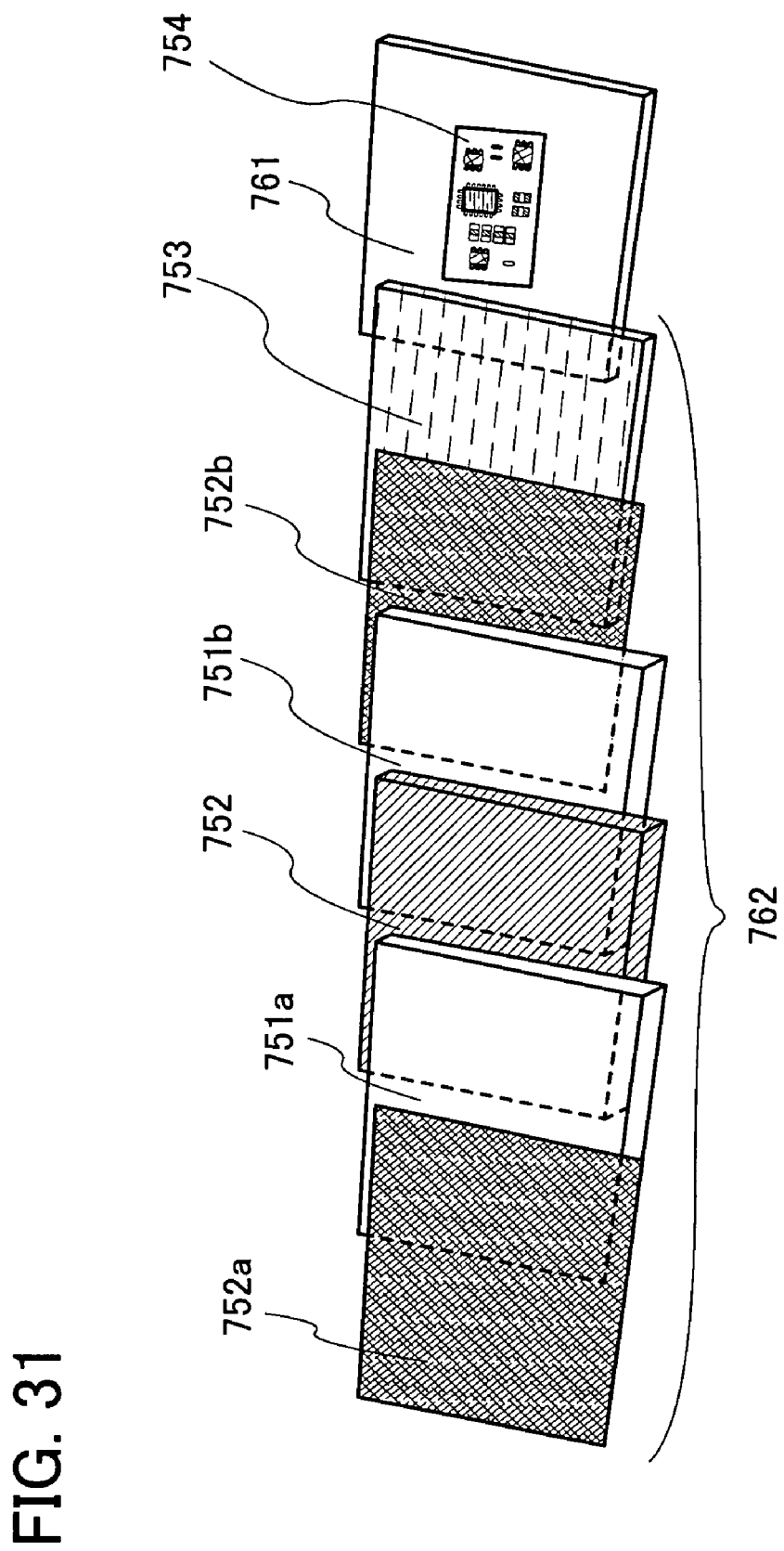
FIG. 31 illustrates a device on which a semiconductor device of the present invention is mounted.

FIG. 31 shows a specific structure of the case where a liquid crystal panels is used for the display portion 733 provided in the computer of FIG. 30A and the display portion 743 of the display device shown in FIG. 30B. A liquid crystal panel 762 shown in FIG. 31 is incorporated in a housing 761 and includes substrates 751a and 751b, a liquid crystal layer 752 sandwiched between the substrates 751a and 751b, polarizing filters 752a and 752b, a backlight 753, and the like. An optical sensor portion 754 is formed in the housing 761.

The optical sensor portion 754 which is manufactured using the present invention detects the amount of light from the backlight 753, and luminance of the liquid crystal panel 762 is adjusted when information thereof is fed back.

Figure 32A:
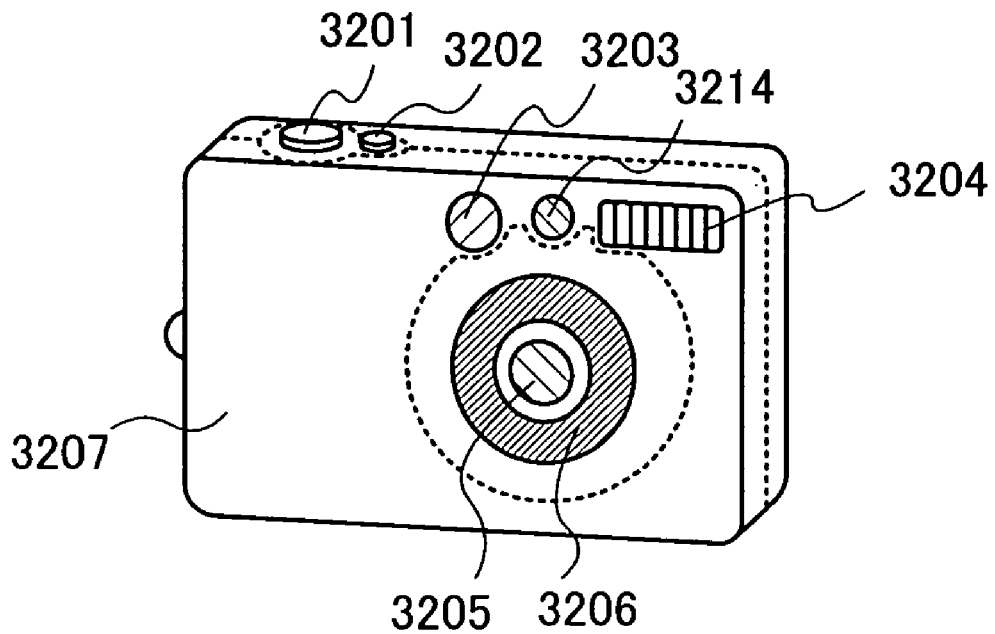
FIGS. 32A and 32B illustrate a device on which a semiconductor device of the present invention is mounted.
Figure 32B:
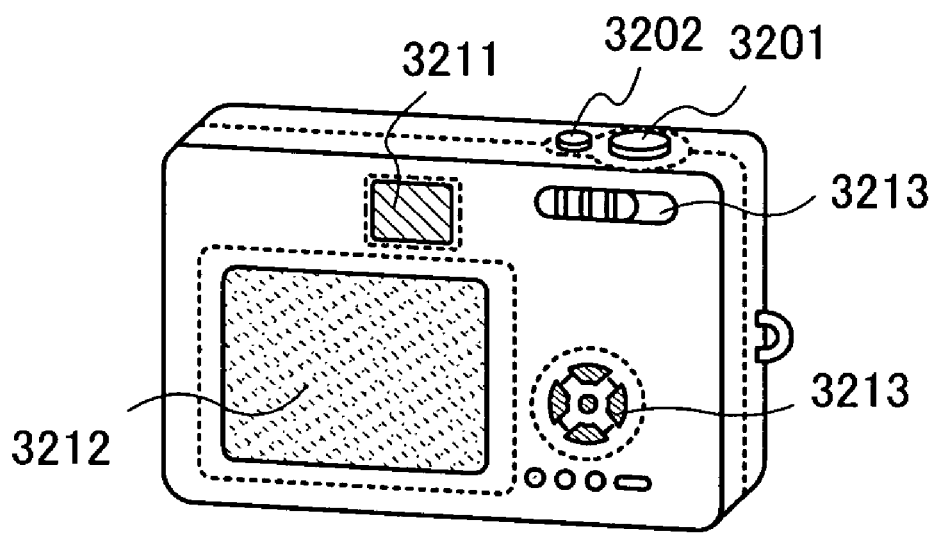
Figure 33A:
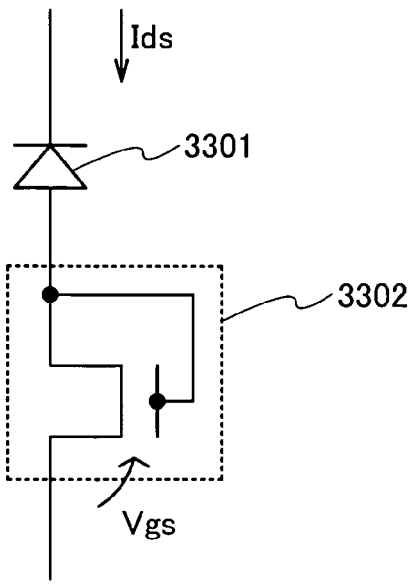
FIGS. 33A and 33B illustrate a conventional technique.
Figure 33B:
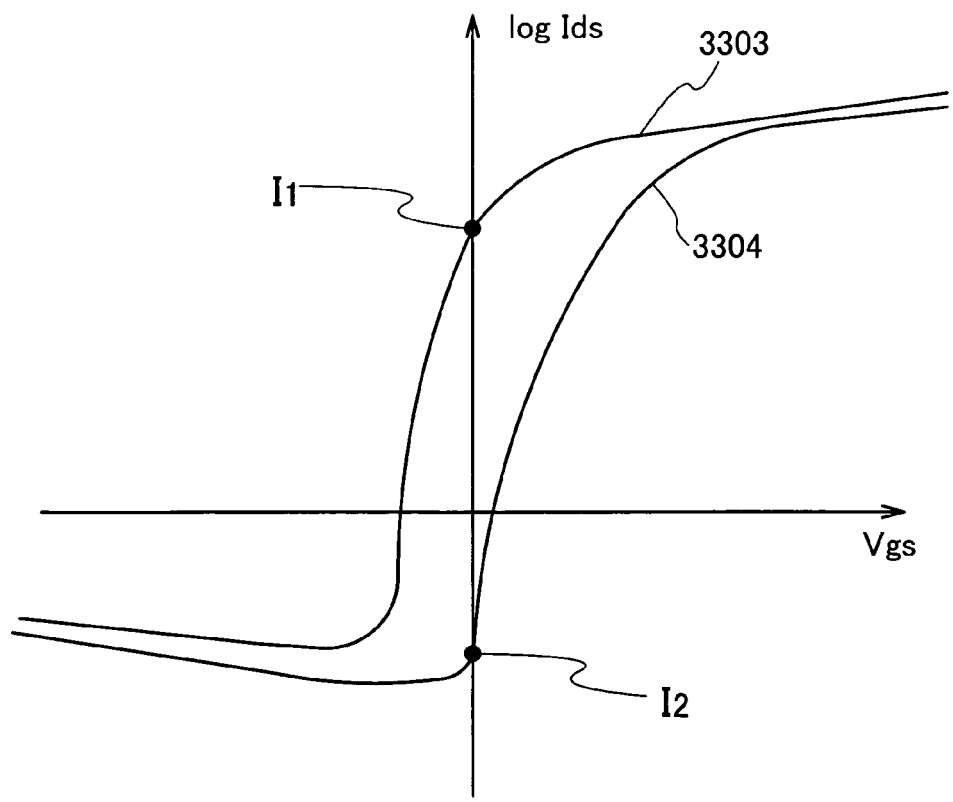

FIGS. 32A and 32B are views each showing an example in which the optical sensor of the present invention is incorporated in a camera such as a digital camera. FIG. 32A is a front perspective view of the digital camera, and FIG. 32B is a back perspective view of the digital camera. In FIG. 32A, the digital camera includes a release button 3201, a main switch 3202, a finder window 3203, a flash portion 3204, a lens 3205, a lens barrel 3206, a housing 3207, and an optical sensor 3214. In addition, in FIG. 32B, a finder eyepiece window 3211, a monitor 3212, and operation buttons 3213 are included.

When the release button 3201 is pressed down halfway, a focusing adjusting mechanism and an exposure adjusting mechanism are operated, and a shutter is opened when the release button is fully pressed down. The main switch 3202 switches ON/OFF of a power source of the digital camera by being pressed or rotated. The finder window 3203 is provided above the lens 3205 of a front side of the digital camera, and is a device for confirming an area which is photographed or a focus position from the finder eyepiece window 3211 shown in FIG. 32B. The flash portion 3204 is provided at the upper portion of the front side of the digital camera, and when luminance of an object is low, auxiliary light is emitted at the same time as the release button is pressed down and the shutter is opened. The lens 3205 is provided at the front face of the digital camera. The lens 3205 includes a focusing lens, a zoom lens, or the like, and forms a photographing optical system with a shutter and a diaphragm which are not shown. In addition, an image pickup device such as CCD (charge coupled device) is provided at the back of the lens 3205. The lens barrel 3206 moves a position of the lens 3205 to adjust the focus of the focusing lens, the zoom lens, or the like. At the time of photographing, the lens barrel 3206 is slid out to move the lens 3205 forward. Further, when the camera is carried, the lens 3205 is moved backward and made compact. Note that although a structure in which the lens barrel is slid out so that an object can be enlarged and photographed is employed in this embodiment mode, the present invention is not limited this structure. A structure may be employed in which zoom shooting can be performed without sliding out the lens barrel by using the photographing optical system inside the housing 3207. The finder eyepiece window 3211 is provided at the upper portion of the back surface of the digital camera and is a window for looking through when recognizing an area which is taken or a focus point. The operation buttons 3213 are buttons for various functions which are provided at the back surface of the digital camera and include a setup button, a menu button, a display button, a functional button, a selection button, and the like.

When the optical sensor to which the present invention is applied is incorporated in the camera shown in FIGS. 32A and 32B, the optical sensor can detect existence or nonexistence of light and light intensity, so that exposure adjustment or the like of the camera can be performed.

In addition, the optical sensor of the present invention can be applied to other electronic devices such as a projection television and a navigation system. That is, the optical sensor of the present invention can be used for any device where light is necessary to be detected. When a result of light detecting is fed back, power consumption can be reduced.

This embodiment mode can be combined with any description of other embodiment modes in this specification as appropriate.

This application is based on Japanese Patent Application serial No. 2006-352817 filed with Japan Patent Office on Dec. 27, 2006, the entire contents of which are hereby incorporated by reference.

What is claimed is:

1. A semiconductor device comprising:
a photoelectric conversion element;
a diode-connected first transistor; and
a second transistor,
wherein a gate of the first transistor is electrically connected to a gate of the second transistor;
wherein one of a source and a drain of the first transistor is electrically connected to one of a source and a drain of the second transistor through the photoelectric conversion element;
wherein the other of the source and the drain of the first transistor is electrically directly connected to the other of the source and the drain of the second transistor; and
wherein the first transistor and the second transistor have different threshold voltages.

2. The semiconductor device according to claim 1, wherein the photoelectric conversion element is a photodiode.

3. The semiconductor device according to claim 1, wherein the first transistor is an enhancement transistor.

4. The semiconductor device according to claim 1, wherein the second transistor is a depletion transistor.

5. The semiconductor device according to claim 1, wherein a difference between the threshold voltage of the first transistor and the threshold voltage of the second transistor is 1V or higher.

6. The semiconductor device according to claim 1, wherein the first transistor and the second transistor have the same conductivity type.

7. The semiconductor device according to claim 1, wherein one or more transistors is electrically connected to the first transistor in parallel.

8. The semiconductor device according to claim 1, wherein one or more transistors is electrically connected to the second transistor in parallel.

9. The semiconductor device according to claim 1, wherein the semiconductor device is electrically connected to a resistor element.

10. An electronic device comprising the semiconductor device according to claim 1.

11. The electronic device according to claim 10, wherein the electronic device is selected from the group consisting of a mobile phone, a computer, a camera, a display device and a TV receiver.

12. A semiconductor device comprising:
a photoelectric conversion element;
a first transistor; and
a second transistor,
wherein a gate of the first transistor is electrically connected to one of a source and a drain of the first transistor;
wherein a gate of the second transistor is electrically connected to the other of the source and the drain of the first transistor;
wherein one of the source and the drain of the first transistor is electrically connected to one of a source and a drain of the second transistor;
wherein the other of the source and the drain of the first transistor is electrically connected to the other of the source and the drain of the second transistor through the photoelectric conversion element; and
wherein the first transistor and the second transistor have different threshold voltages.

13. The semiconductor device according to claim 12, wherein the photoelectric conversion element is a photodiode.

14. The semiconductor device according to claim 12, wherein the first transistor is an enhancement transistor.

15. The semiconductor device according to claim 12, wherein the second transistor is a depletion transistor.

16. The semiconductor device according to claim 12, wherein a difference between the threshold voltage of the first transistor and the threshold voltage of the second transistor is 1V or higher.

17. The semiconductor device according to claim 12, wherein the first transistor and the second transistor have the same conductivity type.

18. The semiconductor device according to claim 12, wherein one or more transistors is electrically connected to the first transistor in parallel.

19. The semiconductor device according to claim 12, wherein one or more transistors is electrically connected to the second transistor in parallel.

20. The semiconductor device according to claim 12, wherein the semiconductor device is electrically connected to a resistor element.

21. An electronic device comprising the semiconductor device according to claim 12.

22. The electronic device according to claim 21, wherein the electronic device is selected from the group consisting of a mobile phone, a computer, a camera, a display device and a TV receiver.

23. A semiconductor device comprising:
- a first terminal;
- a second terminal;
- a photoelectric conversion element;
- a diode-connected first transistor; and
- a second transistor,
- wherein one of a source and a drain of the first transistor is electrically connected to the first terminal through the photoelectric conversion element;
- wherein the other of the source and the drain of the first transistor is electrically connected to the second terminal;
- wherein one of a source and a drain of the second transistor is electrically connected to the first terminal;
- wherein the other of the source and the drain of the second transistor is directly connected to the second terminal; and
- wherein the first transistor and the second transistor have different threshold voltages.

24. The semiconductor device according to claim 23, wherein the photoelectric conversion element is a photodiode.

25. The semiconductor device according to claim 23, wherein the first transistor is an enhancement transistor.

26. The semiconductor device according to claim 23, wherein the second transistor is a depletion transistor.

27. The semiconductor device according to claim 23, wherein a difference between the threshold voltage of the first transistor and the threshold voltage of the second transistor is 1V or higher.

28. The semiconductor device according to claim 23, wherein the first transistor and the second transistor have the same conductivity type.

29. The semiconductor device according to claim 23, wherein one or more transistors is electrically connected to the first transistor in parallel.

30. The semiconductor device according to claim 23, wherein one or more transistors is electrically connected to the second transistor in parallel.

31. The semiconductor device according to claim 23, wherein the semiconductor device is electrically connected to a resistor element.

32. An electronic device comprising the semiconductor device according to claim 23.

33. The electronic device according to claim 32, wherein the electronic device is selected from the group consisting of a mobile phone, a computer, a camera, a display device and a TV receiver.

* * * * *